(12) United States Patent
Lee et al.

(10) Patent No.: US 12,032,797 B2
(45) Date of Patent: *Jul. 9, 2024

(54) INPUT SENSING DEVICE AND DISPLAY DEVICE WITH SAMPLING OF SENSING SIGNAL TO REDUCE NOISE

(71) Applicant: SAMSUNG DISPLAY CO., LTD., Yongin-si (KR)

(72) Inventors: Choon Hyop Lee, Yongin-si (KR); Jang Hui Kim, Yongin-si (KR); Jae Won Kim, Yongin-si (KR); In Nam Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,971

(22) Filed: Dec. 23, 2022

(65) Prior Publication Data
US 2023/0140300 A1 May 4, 2023

Related U.S. Application Data

(63) Continuation of application No. 17/217,204, filed on Mar. 30, 2021, now Pat. No. 11,537,252.

(30) Foreign Application Priority Data

Aug. 20, 2020 (KR) .......................... 10-2020-0104909

(51) Int. Cl.
*G06F 3/044* (2006.01)
*G06F 3/041* (2006.01)
*H10K 59/40* (2023.01)

(52) U.S. Cl.
CPC .......... *G06F 3/0446* (2019.05); *G06F 3/0412* (2013.01); *G06F 3/04184* (2019.05); *G06F 3/0445* (2019.05); *H10K 59/40* (2023.02)

(58) Field of Classification Search
CPC .. G06F 3/0446; G06F 3/0412; G06F 3/04184; G06F 3/0445
See application file for complete search history.

(56) References Cited

U.S. PATENT DOCUMENTS 10,185,434 B2    1/2019   Suzuki et al.
2011/0084857 A1*  4/2011   Marino ................. G06F 3/0446
                                                           341/5

(Continued)

FOREIGN PATENT DOCUMENTS

JP    2011039663 A    2/2011
JP    2014174851 A    9/2014

(Continued)

*Primary Examiner* — Liliana Cerullo
(74) *Attorney, Agent, or Firm* — CANTOR COLBURN LLP

(57) ABSTRACT

An input sensing device includes an input sensing panel including driving electrodes and sensing electrodes, a driving signal generator that provides driving signals to the driving electrodes, respectively, and a sensing unit that receives sensing signals according to the driving signals from the sensing electrodes, and determines whether a touch is performed based on the sensing signals. Each of the driving signals includes a sinusoidal wave, and frequencies of at least some of the driving signals are different from each other.

21 Claims, 29 Drawing Sheets

(56) References Cited

U.S. PATENT DOCUMENTS

| | | | |
|---|---|---|---|
| 2014/0320450 A1 | 10/2014 | Lee et al. | |
| 2015/0015497 A1* | 1/2015 | Leigh | G06F 3/0421 |
| | | | 345/173 |
| 2019/0079631 A1 | 3/2019 | Kim et al. | |
| 2019/0079634 A1 | 3/2019 | Kravets et al. | |
| 2019/0171316 A1 | 6/2019 | Noguchi et al. | |
| 2019/0204944 A1 | 7/2019 | Jun et al. | |
| 2019/0339818 A1 | 11/2019 | Rhe et al. | |
| 2019/0384457 A1 | 12/2019 | Fujiyoshi | |
| 2021/0313401 A1 | 10/2021 | Lee et al. | |

FOREIGN PATENT DOCUMENTS

| | | |
|---|---|---|
| KR | 101327451 B1 | 11/2013 |
| KR | 101862393 B1 | 5/2018 |
| KR | 1020190081532 A | 7/2019 |
| KR | 1020210123454 A | 10/2021 |

\* cited by examiner

FIG. 3B
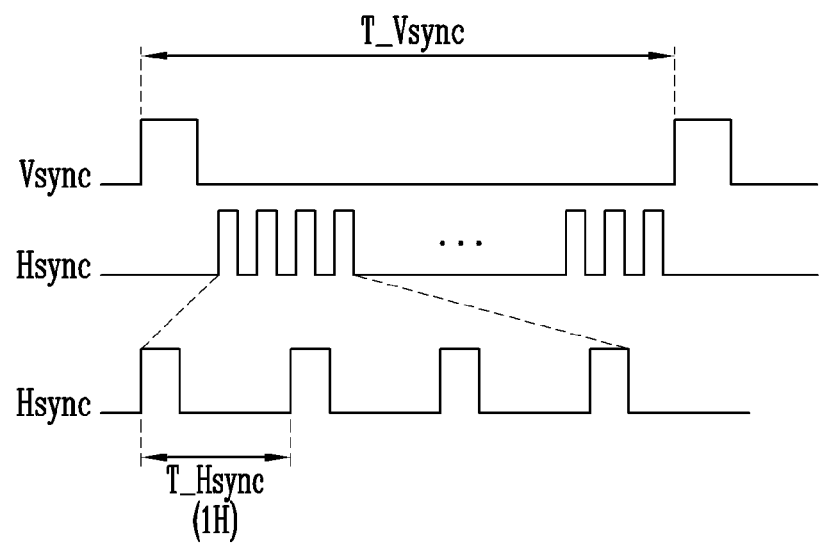
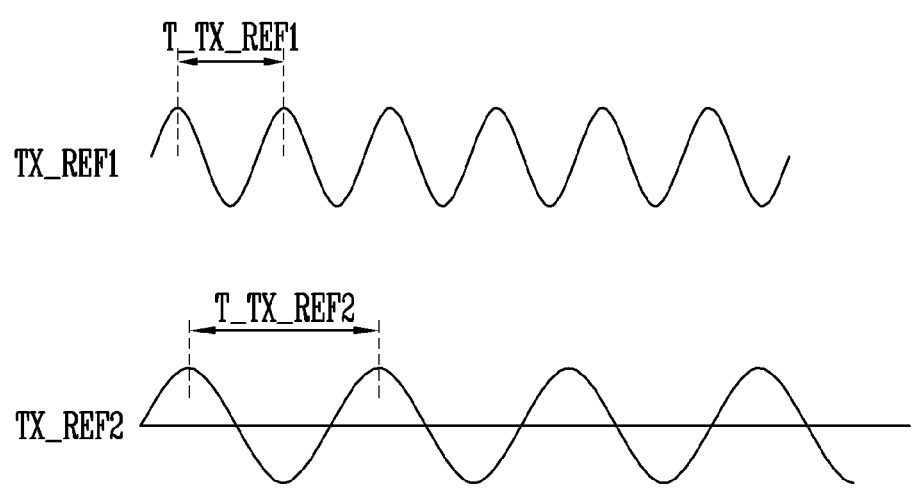

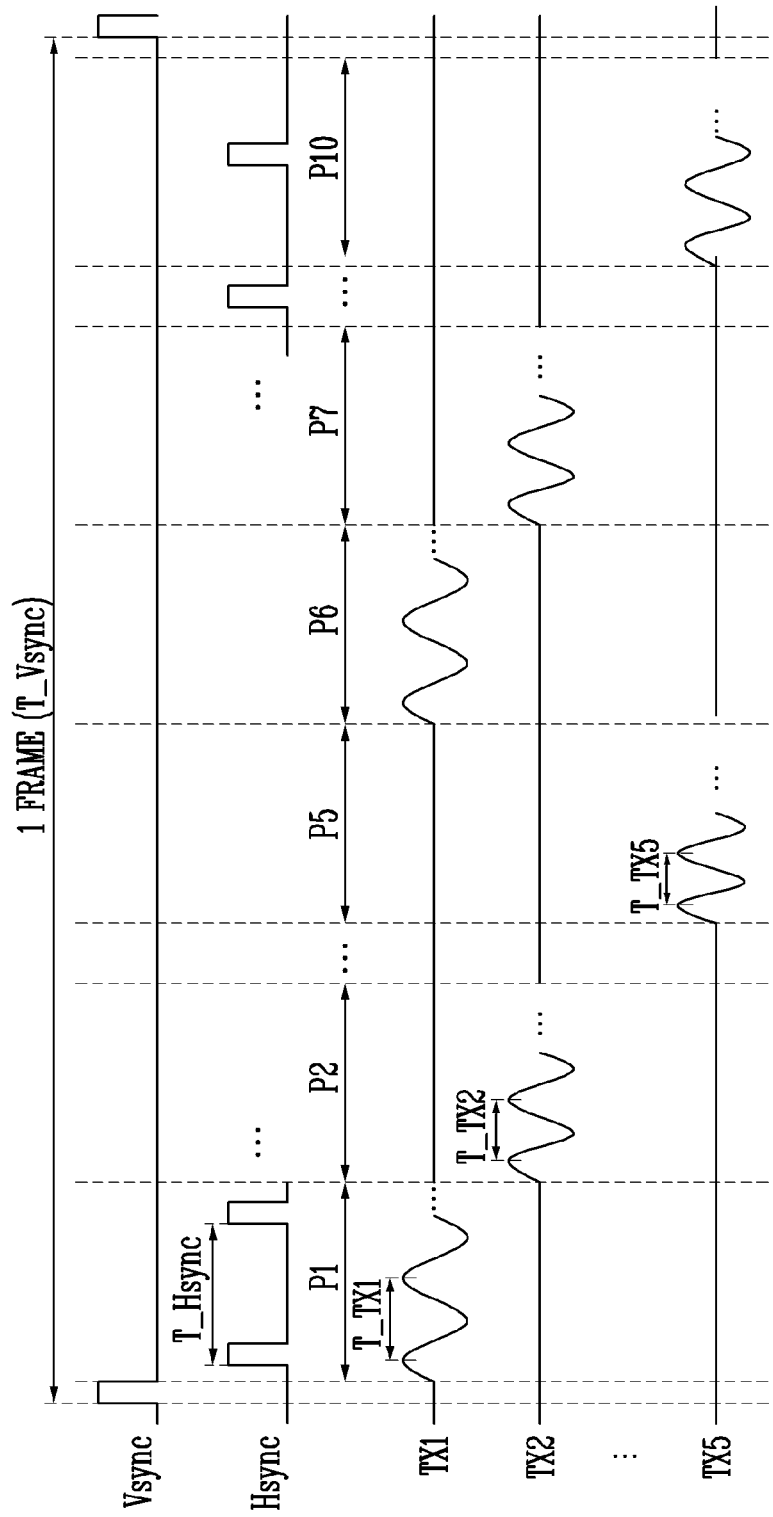

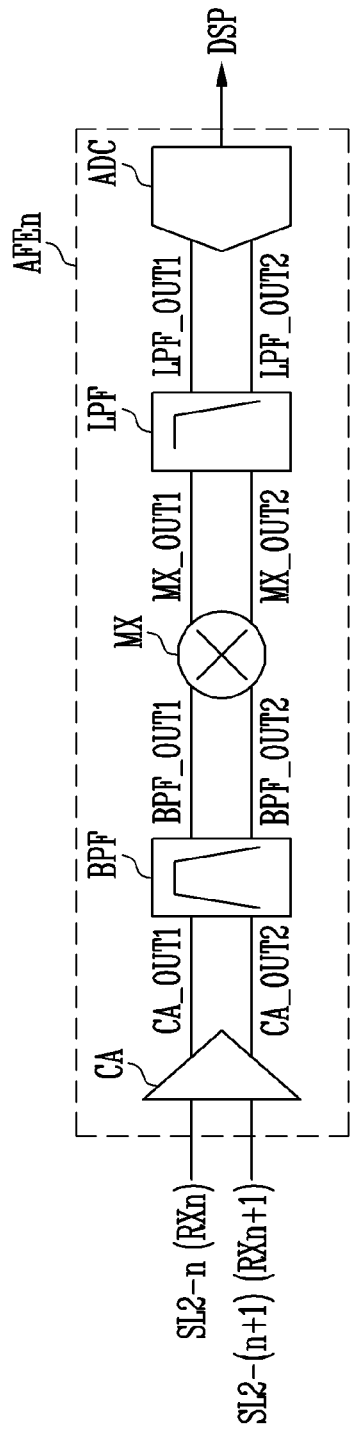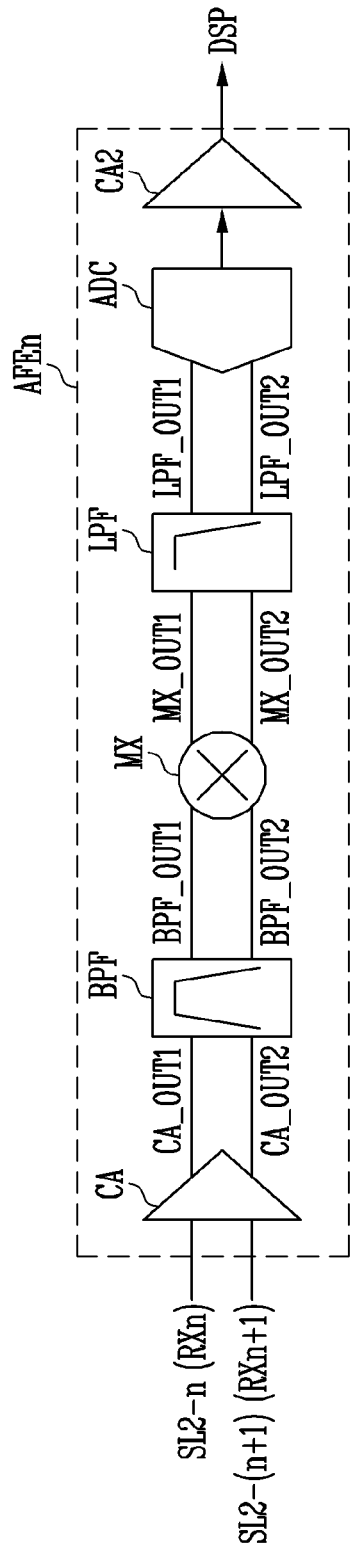

FIG. 9A

| Sampling Rate (per 1H) | 4 | 8 | 12 | 36 | 60 | 72 | 120 | 180 | 360 |
|---|---|---|---|---|---|---|---|---|---|
| S_RX1 | 2.000 | 4.828 | 7.464 | 22.860 | 38.162 | 45.808 | 76.377 | 114.580 | 229.177 |
| S_RX2 | 0.000 | 4.000 | 6.928 | 22.685 | 38.057 | 45.720 | 76.325 | 114.545 | 229.160 |
| Δ(S_RX1−S_RX2) | 2.000 | 0.828 | 0.536 | 0.175 | 0.105 | 0.087 | 0.052 | 0.035 | 0.017 |

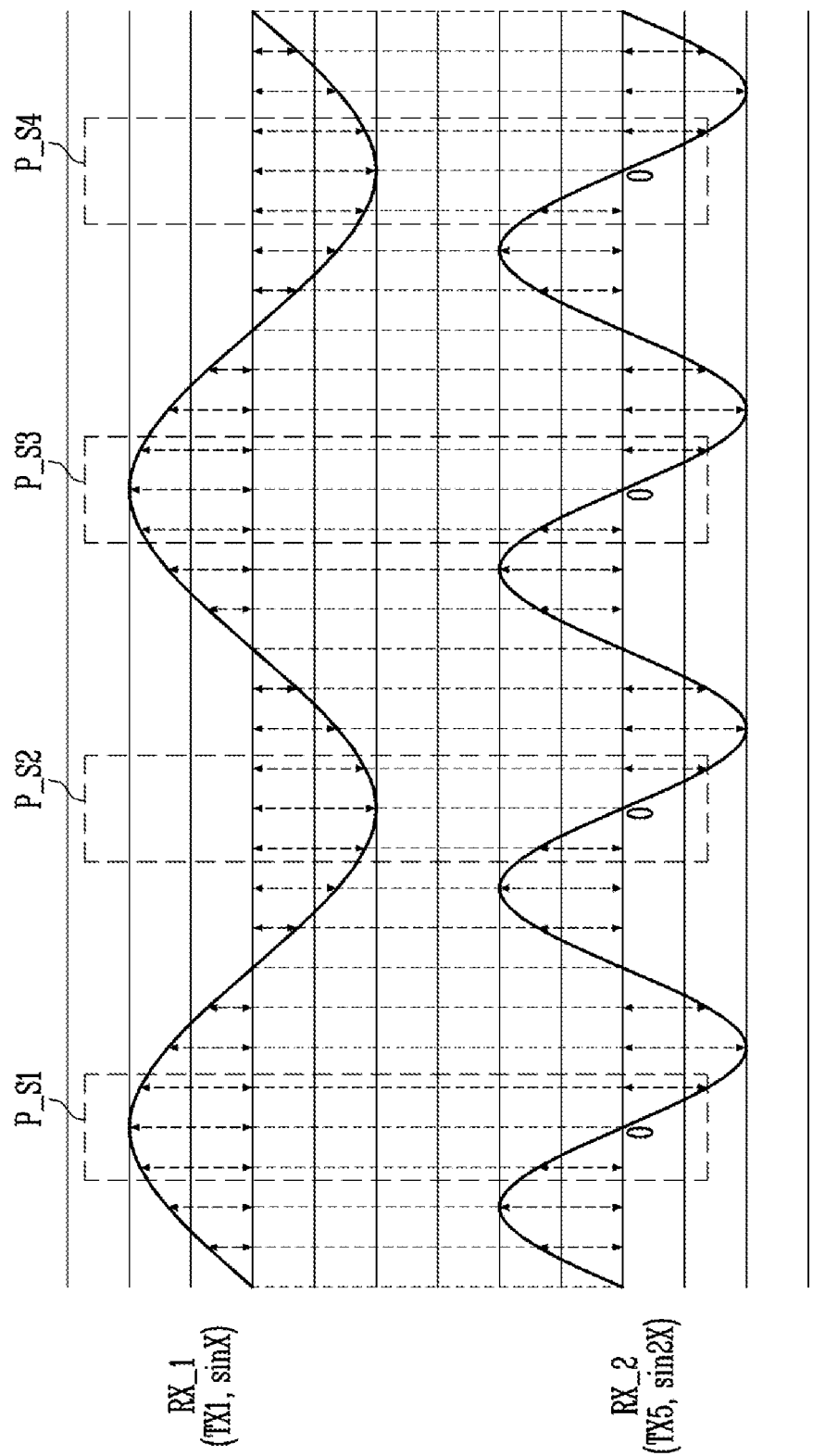

FIG. 16
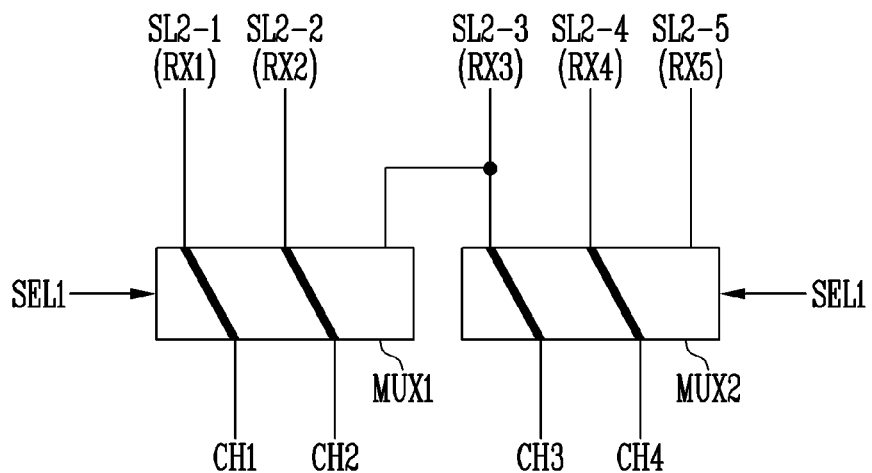
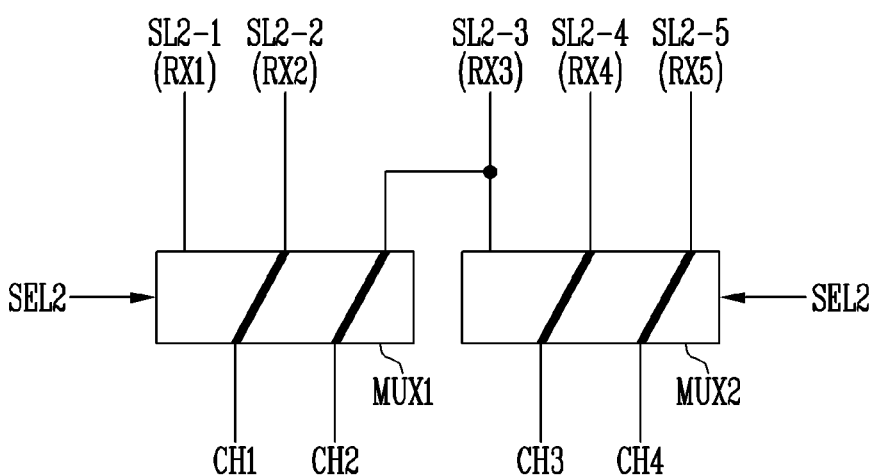

INPUT SENSING DEVICE AND DISPLAY DEVICE WITH SAMPLING OF SENSING SIGNAL TO REDUCE NOISE

This application is a continuation of U.S. patent application Ser. No. 17/217,204, filed on Mar. 30, 2021, which claims priority to Korean Patent Application No. 10-2020-0104909 filed on Aug. 20, 2020, and all the benefits accruing therefrom under 35 U.S.C. § 119, the content of which in its entirety is herein incorporated by reference.

BACKGROUND

1. Field

Embodiments of the invention relate to an input sensing device and a display device including the same.

2. Description of the Related Art

A display device may include a display panel displaying an image, and a touch panel disposed on the display panel to receive a touch input.

The touch panel includes a plurality of sensing electrodes, and senses a change in capacitance generated on the plurality of sensing electrodes to find a touched point.

SUMMARY

Since a display driving signal driving a display panel acts as noise on a touch panel, a touch driving signal driving the touch panel is set to avoid the display driving signal (for example, a horizontal synchronization signal).

However, as a display device is driven at high speed, a frequency of the display driving signal increases (for example, the frequency increases from 60 Hertz (Hz) to 120 Hz, etc., in other words, a period of the display driving signal decreases). Therefore, a period of the touch driving signal may decrease, and then a time for touch sensing may decrease.

In addition, as the display device becomes thinner and larger, a gap between the display panel and the touch panel (or touch electrodes) decreases, an overlapping area between the display panel and the touch panel increases. Therefore, parasitic capacitance increases so that touch sensing sensitivity may decrease.

An embodiment of the invention provides an input sensing device having improved touch sensing sensitivity even in an environment (for example, a high-speed driving, thinning, and large-sized display device) in which a performance of a touch sensor is degraded, and a display device including the same.

An input sensing device in an embodiment of the invention includes an input sensing panel including driving electrodes and sensing electrodes, a driving signal generator that provides driving signals to the driving electrodes, respectively, a sensing unit that receives sensing signals according to the driving signals from the sensing electrodes, and determines whether a touch is performed based on the sensing signals. Each of the driving signals includes a sinusoidal wave, and frequencies of at least some of the driving signals are different from each other.

In an embodiment, the input sensing panel may include a first area and a second area, and the first area may be farther from the driving signal generator or the sensing unit than the second area is from the driving signal generator or the sensing unit, and a first frequency of a first driving signal provided to the first area among the driving signals may be smaller than a second frequency of a second driving signal provided to the second area among the driving signals.

In an embodiment, the driving electrodes may include a first driving electrode farthest from the sensing unit in the first area, and a second driving electrode closest to the sensing unit in the second area, and the first driving signal may be applied to the first driving electrode, and the second driving signal may be applied to the second driving electrode.

In an embodiment, a level of the sensing signals when the second driving signal is applied to the first driving electrode may be smaller than or equal to half the level of the sensing signals when the second driving signal is applied to the second driving electrode.

In an embodiment, the driving electrodes may include first driving electrodes provided in the first area and second driving electrodes provided in the second area, and the driving signal generator may provide the first driving signal to each of the first driving electrodes, and may provide the second driving signal to each of the second driving electrodes.

In an embodiment, the driving signal generator may sequentially provide the driving signals to the driving electrodes.

In an embodiment, the driving signal generator may simultaneously provide the driving signals to the driving electrodes.

In an embodiment, the driving signal generator may include a waveform generator that generates a reference signal including a sinusoidal wave, and a frequency modulator that varies a frequency of the reference signal through frequency division and generates the driving signals.

In an embodiment, the sensing unit may sample a first sensing signal according to the first driving signal N times during a reference time, and may sample a second sensing signal according to the second driving signal N times during the reference time where N is an integer greater than four.

In an embodiment, a first sensing value generated by sampling the first sensing signal during the reference time is greater than a second sensing value generated by sampling the second sensing signal during the reference time, and attenuation of the first driving signal and the first sensing signal may be compensated by a difference between the first sensing value and the second sensing value.

In an embodiment, the reference time may be smaller than or equal to a first period of the first driving signal.

In an embodiment, the reference time may be smaller than half of the first period of the first driving signal, and each of the sensing signals according to the first driving signal may have a maximum value during the reference time.

In an embodiment, amplitudes of the driving signals may be different from each other.

In an embodiment, an amplitude of at least one of the driving signals is variable, and each of the driving signals may have a maximum amplitude during the reference time.

In an embodiment, the sensing unit may include analog front-ends that receives sensing signals according to the driving signals from the sensing electrodes, and a signal processing unit that determines whether a touch is performed based on differential output values of the analog front-ends.

In an embodiment, each of the analog front-ends may include a charge amplifier that differentially amplifies a first sensing signal and a second sensing signal respectively provided from two sensing electrodes adjacent to each other among the sensing electrodes and outputs a first differential signal and a second differential signal complementary to each other, a band pass filter that filters the first differential signal and the second differential signal and outputs a first filtered signal and a second filtered signal, respectively, a mixer that changes frequencies of the first filtered signal and the second filtered signal and outputs a first demodulated signal and a second demodulated signal, respectively, a low pass filter that filters noise from the first demodulated signal and the second demodulated signal and outputs a first output signal and a second output signal, respectively, and an analog-to-digital converter that outputs a differential output value corresponding to a difference between the first output signal and the second output signal.

In an embodiment, the input sensing device may further include a distribution circuit that is disposed between at least some of the sensing electrodes and the analog front-ends, and provides each of the sensing signals provided from at least some of the sensing electrodes to two adjacent analog front-ends of the analog front-ends.

In an embodiment, the input sensing device may further include a negative capacitor connected to a front-end of each of the analog front-ends.

In an embodiment, each of the analog front-ends may include a multiplexer that selects two sensing signals from sensing signals provided from three adjacent sensing electrodes among the sensing electrodes, a charge amplifier that differentially amplifies the two sensing signals selected from the sensing signals and outputs a first differential signal and a second differential signal complementary to each other, a band pass filter that filters the first differential signal and the second differential signal and outputs a first filtered signal and a second filtered signal, respectively, a mixer that changes frequencies of the first filtered signal and the second filtered signal and outputs a first demodulated signal and a second demodulated signal, respectively, a low pass filter that filters noise from the first demodulated signal and the second demodulated signal and outputs a first output signal and a second output signal, respectively, and an analog-to-digital converter that outputs a differential output value corresponding to a difference between the first output signal and the second output signal.

In an embodiment, the multiplexer may select a first sensing signal and a second sensing signal from the sensing signals in a first section, may select a second sensing signal and a third sensing signal from the sensing signals in a second section different from the first section, and the first to third sensing signals may be respectively provided from the three sensing electrodes.

A display device in an embodiment of the invention includes a display panel including pixels that emit light in unit of frame, an input sensing panel that includes driving electrodes and sensing electrodes, a driving signal generator that provides driving signals to the driving electrodes, respectively, and a sensing unit that receives sensing signals according to the driving signals from the sensing electrodes, and determines whether a touch is performed based on the sensing signals. Each of the driving signals includes a sinusoidal wave, and frequencies of at least some of the driving signals are different from each other.

In an embodiment, the driving signal generator provides the driving signals to the driving electrodes by avoiding a section in which a pulse of a vertical synchronization signal defining a start of the frame is generated.

In an embodiment, the driving signal generator may block a supply of the driving signals in the section in which the pulse of the vertical synchronization signal is generated.

In an embodiment, the driving signals may be asynchronous with a horizontal synchronization signal, and the horizontal synchronization signal may define a section in which a line image is output through pixels included in a same line among the pixels.

A sensing device in an embodiment of the invention includes a sensing panel including first electrodes and second electrodes, a driver that provides driving signals to the first electrodes, respectively, and a sensing unit that receives sensing signals according to the driving signals from the second electrodes. Each of the driving signals may include a sinusoidal wave, at least one of the driving signals may have a first frequency, at least another one of the driving signals may have a second frequency, and the first frequency and the second frequency may be different from each other.

An input sensing device and a display device in embodiments of the invention may generate touch driving signals including a sinusoidal wave, so that a frequency of the touch driving signal may be freely set regardless of a frequency of a horizontal synchronization signal, and a decrease in a bandwidth of the touch driving signal may be prevented. Accordingly, a decrease in sensing sensitivity due to the decrease in the bandwidth of the touch driving signal may be prevented.

In addition, the input sensing device and the display device in embodiments of the invention may generate touch driving signals having different frequencies, and may provide a touch driving signal having a relatively small frequency to a driving electrode with a relatively large resistance-capacitance ("RC") delay (or, response delay). Accordingly, a decrease in sensing sensitivity due to RC delay may be prevented.

Further, the input sensing device and the display device in embodiments of the invention may generate sensing values by sampling sensing signals corresponding to touch driving signals having different frequencies at a same number of sampling times, so that signal attenuation of a sensing signal (i.e., sensing signal having a relatively large RC delay) corresponding to a touch driving signal having a relatively small frequency may be compensated. Accordingly, the touch sensing sensitivity may be uniform throughout the sensing area.

Effects of embodiments of the invention is not limited by what is illustrated in the above, and more various effects are included in the specification.

BRIEF DESCRIPTION OF THE DRAWINGS

The above and other embodiments, advantages and features of this disclosure will become more apparent by describing in further detail embodiments thereof with reference to the accompanying drawings, in which:

FIG. 3B is a drawing illustrating an embodiment of a touch driving signal generated by a driving signal generator included in the input sensing device of FIG. 1.

FIGS. 4A to 4C are drawings illustrating embodiments of touch driving signals generated by a driving signal generator included in the input sensing device of FIG. 1.

FIGS. 6A and 6B are block diagrams illustrating an embodiment of an analog front end included in the input sensing device of FIG. 1.

FIGS. 9A and 9B are drawings illustrating an embodiment of sensing values based on the number of sampling times of an analog-to-digital converter included in the analog front end of FIG. 6A.

FIG. 10 is a drawing illustrating another embodiment of an operation of an analog-to-digital converter included in the analog front end of FIG. 6A.

FIG. 16 is a drawing illustrating an operation of a multiplexer included in the analog front end of FIG. 15.

DETAILED DESCRIPTION

Figure 1:
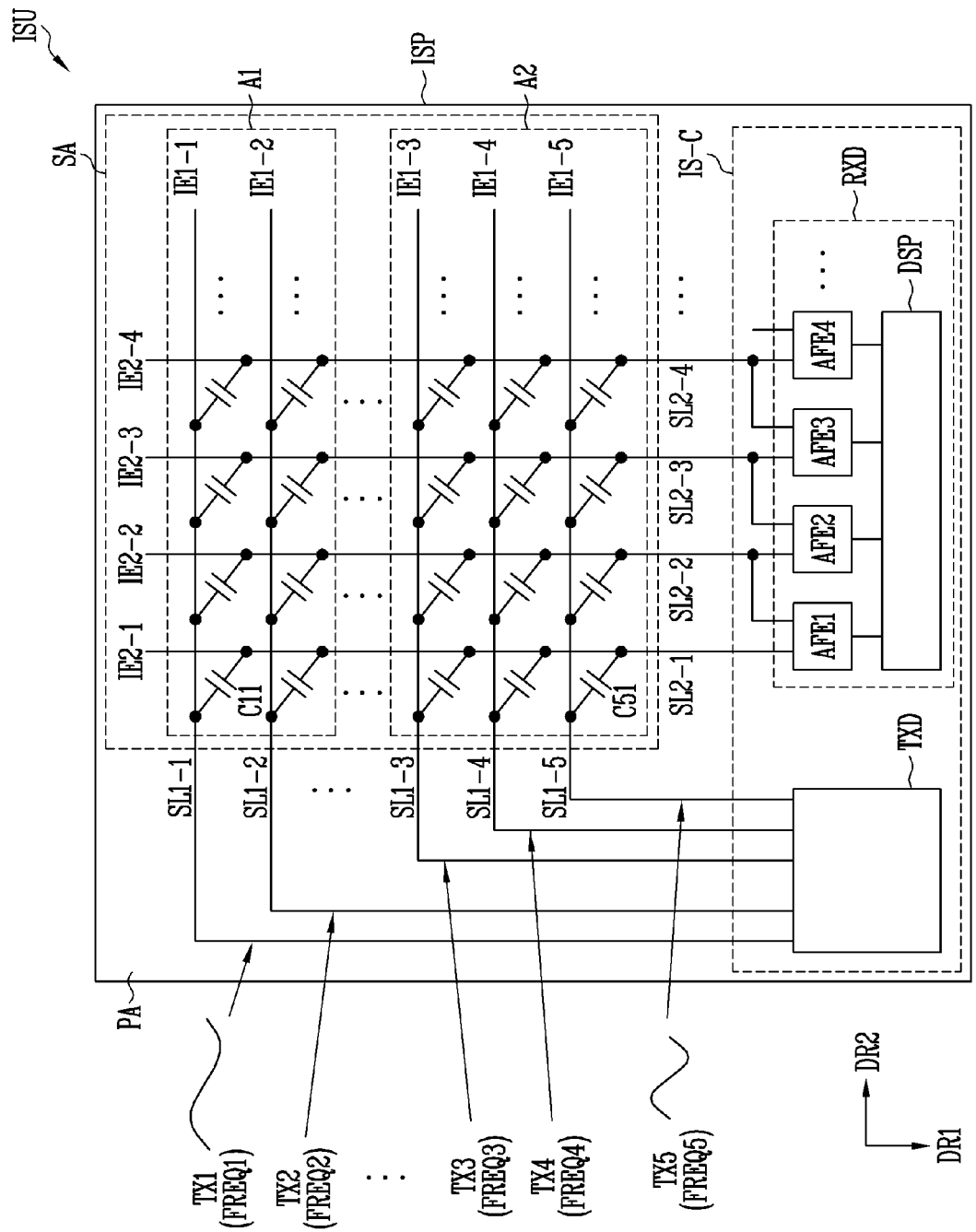
FIG. 1 is a drawing illustrating an embodiment of an input sensing device.

Hereinafter, with reference to accompanying drawings, various embodiments of the invention will be described in detail so that those skilled in the art may easily carry out the invention. Embodiments of the invention may be embodied in many different forms and is not limited to the embodiments described herein.

In order to clearly illustrate the invention, parts that are not related to the description are omitted, and the same or similar constituent elements are given the same reference numerals throughout the specification. Therefore, the above-mentioned reference numerals can be used in other drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. A term such as "unit" may mean a circuit or a processor.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, since the size of each configuration shown in the drawing are arbitrarily shown for better understanding and ease of description, the invention is not necessarily limited to the illustrated one.

FIG. 1 is a drawing illustrating an embodiment of an input sensing device.

Referring to FIG. 1, an input sensing device ISU may include an input sensing panel ISP and an input sensing circuit IS-C.

The input sensing panel ISP may include a sensing area SA that senses an input of a user, for example, a touch and/or a pressure when touching, and a peripheral area PA provided on at least one side of the sensing area SA.

The input sensing panel ISP may include driving electrodes IE1-1 to IE1-5 (or first sensing electrodes, transmission electrodes) and sensing electrodes IE2-1 to IE2-4 (or second sensing electrodes, receiving electrodes) provided in the sensing area SA, and driving signal lines SL1-1 to SL1-5 (or first signal lines, transmission signal lines) and sensing signal lines SL2-1 to SL2-4 (or second signal lines, receiving signal lines) provided to the peripheral area PA.

The driving electrodes IE1-1 to IE1-5 may extend in a second direction DR2, and may be spaced apart from one another in a first direction DR1. The sensing electrodes IE2-1 to IE2-4 may extend in the first direction DR1, and may be spaced apart from one another in the second direction DR2. A more specific configuration of the driving electrodes IE1-1 to IE1-5 and the sensing electrodes IE2-1 to IE2-4 will be described later with reference to FIG. 20.

In an embodiment, the sensing area SA may include a first area A1 and a second area A2 separated from each other. The first area A1 may be spaced apart from an input sensing circuit IS-C disposed at one side of the sensing area SA, and the second area A2 may be adjacent to the input sensing circuit IS-C. The second area A2 may be disposed between the input sensing circuit IS-C and the first area A1. That is, the first area A1 and the second area A2 may be divided based on a distance spaced apart from the input sensing circuit IS-C (or length of a signal movement path of the touch driving signal and the sensing signal, or resistance-capacitance ("RC") delay).

In an embodiment, the first area A1 may include a first driving electrode IE1-1 that is farthest from the input sensing circuit IS-C and a second driving electrode IE1-2 that is second farthest from the input sensing circuit IS-C, for example. In an embodiment, the second area A2 may include a third driving electrode IE1-3, a fourth driving electrode IE1-4, and a fifth driving electrode IE1-5 closest to the input sensing circuit IS-C, for example.

In FIG. 1, the sensing area SA is illustrated as including two areas A1 and A2, but is not limited thereto. In an embodiment, the sensing area SA may include three or more areas, and as an area of the input sensing panel ISP (and the sensing area SA) becomes larger, the sensing area SA may also be divided into a larger number of areas, for example.

The driving signal lines SL1-1 to SL1-5 may be connected to one end of the driving electrodes IE1-1 to IE1-5, respectively. In an embodiment, the first driving signal line SL1-1 may be connected to the first driving electrode IE1-1, and the fifth driving signal line SL1-5 may be connected to the fifth driving electrode IE1-5, for example. The first driving signal line SL1-1 may be longer than the fifth driving signal line SL1-5, and may be also longer than the second driving signal line SL1-2, the third driving signal line SL1-3, and the fourth driving signal line SL1-4. Also, a resistance value of the first driving signal line SL1-1 may be greater than a resistance value of the fifth driving signal line SL1-5.

The sensing signal lines SL2-1 to SL2-4 may be connected to one end of the sensing electrodes IE2-1 to IE2-4. In an embodiment, the first sensing signal line SL2-1 may be connected to the first sensing electrode IE2-1, and the fourth sensing signal line SL2-4 may be connected to the fourth sensing electrode IE2-4. Lengths of the sensing signal lines SL2-1 to SL2-4 may be the same, for example, but are not limited thereto.

In embodiments, the sensing signal lines SL2-1 to SL2-4 may be connected to both ends of the sensing electrodes IE2-1 to IE2-4, which will be described later with reference to FIG. 20.

In FIG. 1, the input sensing panel ISP is shown to include five driving electrodes IE1-1 to IE1-5 and four sensing electrodes IE2-1 to IE2-4, but the number of the driving electrodes IE1-1 to IE1-5 and the number of the sensing electrodes IE2-1 to IE2-4 are not limited thereto. In an embodiment, the input sensing device ISU may include six or more driving electrodes and/or five or more sensing electrodes, for example.

The input sensing circuit IS-C may include a driving signal generator TXD (or driver) and a sensing unit RXD.

The driving signal generator TXD may generate touch driving signals TX1 to TX5 (or driving signals), and may provide the touch driving signals TX1 to TX5 to the driving electrodes IE1-1 to IE1-5, respectively. In an embodiment, the driving signal generator TXD may provide the first touch driving signal TX1 to the first driving electrode IE1-1, may provide the second touch driving signal TX2 to the second driving electrode IE1-2, may provide the third touch driving signal TX3 to the third driving electrode IE1-3, may provide the fourth touch driving signal TX4 to the fourth driving electrode IE1-4, and may provide the fifth touch driving signal TX5 to the fifth driving electrode IE1-5, for example.

Each of the touch driving signals TX1 to TX5 may include a sinusoidal wave such as a sine wave or a cosine wave. A level change of the sinusoidal wave over time appears in the form of a sine curve or a cosine curve, and appears more gently than that of a square wave. When each of the touch driving signals TX1 to TX5 has a square wave, the level change is fast. Therefore, it may be easy to increase the frequency of the touch driving signals TX1 to TX5, but the sensing signals based on the touch driving signals TX1 to TX5 have a different waveform from the touch driving signals TX1 to TX5 due to an RC delay, so it may not be easy to remove noise from the sensing signal. In an embodiment, the sensing signal may be compared with the corresponding touch driving signal, and then a portion where the level change of the sensing signal differs from the level change of the touch driving signal may be extracted and removed as noise, for example. When the touch driving signal is a square wave, due to the RC delay (e.g., charging and discharging of the capacitance), a tangential slope of the level of the sensing signal may be gently changed or distorted below a predetermined value (i.e., the waveform of the sensing signal may be different from the waveform of the touch driving signal). Even due to noise, the level change of the sensing signal may appear different from the level change of the touch driving signal, and it may not be easy to distinguish whether the level change of the sensing signal is due to only the RC delay or both the RC delay and the noise. When each of the touch driving signals TX1 to TX5 includes a sinusoidal wave, the sensing signals based on the touch driving signals may have the same wave as or a similar sinusoidal wave to those of the touch driving signals, even when the RC delay occurs, so that the noise may be easily removed from the sensing signals. Even when the RC delay occurs, since the level change of the touch driving signal of the sinusoidal wave is gentle, only a phase of the sensing signal is different from a phase of the touch driving signal, and the waveform of the sensing signal may be the same as that of the touch driving signal. Accordingly, a portion where the level change of the sensing signal differs from the level change of the touch driving signal may be determined to be due to noise without considering the RC delay, and thus the noise may be easily removed.

In an embodiment, at least some of the touch driving signals TX1 to TX5 may have different frequencies FREQ1 to FREQ5 (or driving periods) from one another. In an embodiment, the first touch driving signal TX1 may have the first frequency FREQ1, and the fifth touch driving signal TX5 may have the fifth frequency FREQ5, for example. The fifth frequency FREQ5 may be greater than the first frequency FREQ1. The second frequency FREQ2 of the second touch driving signal TX2 and the third frequency FREQ3 of the third touch driving signal TX3 may be the same as the first frequency FREQ1 of the first touch driving signal TX1. The fourth frequency FREQ4 of the fourth touch driving signal TX4 may be the same as the fifth frequency FREQ5 of the fifth touch driving signal TX5. That is, the frequency of the touch driving signal applied to the second area A2 closer to the input sensing circuit IS-C may be greater than the frequency of the touch driving signal applied to the first area A1 farther from the input sensing circuit IS-C. As another example, the frequencies FREQ1 to FREQ5 of the touch driving signals TX1 to TX5 may be all different from one another.

As will be described later with reference to FIGS. 2A, 2B, and 3A, since the first driving electrode IE1-1 is farther from the input sensing circuit IS-C than the fifth driving electrode IE1-5 is from the input sensing circuit IS-C, the RC delay of the first touch driving signal TX1 (and sensing signal corresponding thereto) may be greater than the RC delay of the fifth touch driving signal TX5 (and sensing signal corresponding thereto). Accordingly, when a touch driving signal having a high-frequency is applied to the first driving electrode IE1-1, the sensing signal cannot follow the touch driving signal due to a relatively large RC delay, and thus the sensitivity of the sensing signal may decrease. Accordingly, the first touch driving signal TX1 may have a relatively low frequency. The fifth touch driving signal TX5 may also have a low frequency, but in this case, since the sensing time of the input sensing device ISU may increase, it may not be suitable for driving the large-area input sensing panel ISP. Accordingly, in order to shorten the sensing time of the input sensing device ISU, the fifth touch driving signal TX5 may have a relatively high frequency.

In an embodiment, the driving signal generator TXD may provide the touch driving signals TX1 to TX5 to the driving electrodes IE1-1 to IE1-5 sequentially (i.e., sequentially driving) or simultaneously (i.e., simultaneously driving or parallelly driving). A configuration in which the driving signal generator TXD provides the touch driving signals TX1 to TX5 to the driving electrodes IE1-1 to IE1-5 will be described later with reference to FIGS. 4A, 4B, and 4C.

According to the touch driving signals TX1 to TX5 provided to the driving electrodes IE1-1 to IE1-5, a sensing capacitance may be disposed between the driving electrodes IE1-1 to IE1-5 and the sensing electrodes IE2-1 to IE2-4. In an embodiment, the 1-1-th sensing capacitance C11 may be generated between the first driving electrode IE1-1 and the first sensing electrode IE2-1, for example. In an embodiment, the 5-1-th sensing capacitance C51 may be generated between the fifth driving electrode IE1-5 and the first sensing electrode IE2-1, for example.

The sensing unit RXD may receive sensing signals based on the touch driving signals TX1 to TX5 from the sensing electrodes IE2-1 to IE2-4, and may determine whether a touch has been performed based on the sensing signals.

The sensing unit RXD may include analog front-ends AFE1 to AFE4, and a signal processing unit DSP.

Each of the analog front-ends AFE1 to AFE4 may be connected to two adjacent sensing electrodes (or second signal lines) among the sensing electrodes IE2-1 to IE2-4, and may output a sensing value (or a differential output value) corresponding to a difference in sensing capacitances. In an embodiment, the first analog front-end AFE1 may be connected to the first sensing electrode IE2-1 and the second sensing electrode IE2-2, and may output a first sensing value corresponding to a difference between a sensing capacitance generated on the first sensing electrode IE2-1 and a sensing capacitance generated on the second sensing electrode IE2-2, for example. Similarly, the second analog front-end AFE2 may be connected to the second sensing electrode IE2-2 and the third sensing electrode IE2-3, and may output a second sensing value corresponding to a difference between a sensing capacitances generated on the second sensing electrode IE2-2 and a sensing capacitance generated on the third sensing electrode IE2-3.

When a touch event occurs in a predetermined region of the input sensing panel ISP, a sensing capacitance between a driving electrode and a sensing electrode disposed in the corresponding region may be changed. In an embodiment, when a touch event occurs in a region where the first driving electrode IE1-1 and the first sensing electrode IE2-1 intersect, a size of the 1-1-th sensing capacitance between the first driving electrode IE1-1 and the first sensing electrode IE2-1 may be changed, for example. A size of the 1-2-th sensing capacitance between the first driving electrode IE1-1 and the second sensing electrode IE2-2 adjacent to the first sensing electrode IE2-1 may not be changed. Accordingly, the first sensing value output through the first analog front-end AFE1 may be changed, and a location where a touch occurs may be detected based on the changed first sensing value.

Each of the analog front-ends AFE1 to AFE4 may include an amplifier, a filter, an analog-to-digital converter, and the like, and a predetermined configuration of each of the analog front-ends AFE1 to AFE4 will be described later with reference to FIG. 6A.

In an embodiment, each of the analog front-ends AFE1 to AFE4 may be implemented as a fully differential analog front-end. In an embodiment, when the first analog front-end AFE1 includes a charge amplifier, a chopping circuit, filters, and an analog-to-digital converter sequentially connected, the first analog front-end AFE1 may differentially amplify the first sensing signal corresponding to the sensing capacitance of the first sensing electrode IE2-1 and the second sensing signal corresponding to the sensing capacitance of the second sensing electrode IE2-2 by the charge amplifier to output two differential signals, may demodulate each of the two differential signals by the chopping circuit and the filters, may filter each of the two demodulated differential signals, and may provide the filtered two differential signals to the analog-to-digital converter, for example. In this case, the analog-to-digital converter may output the first sensing value based on the difference between the filtered two differential signals. That is, the fully differential analog front-end may be an analog front-end that converts analog sensing signals provided from the sensing electrodes into a plurality of differential signals, maintains, and outputs to a front end of the analog-to-digital converter (i.e., until converting an analog signal into a digital signal). For reference, the charge amplifier and the filters may include amplifiers, a voltage range of the charge amplifiers and the filters in a low voltage system is limited, and a general analog front-end may not utilize all the dynamic range of an analog-to-digital converter. Accordingly, the fully differential analog front-end may provide two differential signals to the analog-to-digital converter, thereby doubling the dynamic range of the analog-to-digital converter or a range of utilization of the dynamic range, and improving touch sensing sensitivity.

The sensing values output from the analog front-ends AFE1 to AFE4 may be provided to the signal processing unit DSP, and the signal processing unit DSP may determine whether a touch is performed or calculate a position where the touch is performed based on the sensing values.

As described with reference to FIG. 1, the input sensing device ISU may generate the touch driving signals TX1 to TX5 including sinusoidal waves having different frequencies respectively, may provide a touch driving signal having a relatively small frequency (e.g., first touch driving signal TX1 having a first frequency FREQ1) to driving electrodes (e.g., first driving electrode IE1-1 in the first area A1) having a relatively large RC delay. Accordingly, a decrease in sensing sensitivity due to the RC delay may be prevented.

In addition, the input sensing device ISU may differentially amplify adjacent sensing signals and remove noise by the fully differential analog front-end. Accordingly, the frequency of the touch driving signal may be set irrespective of a frequency of a signal (e.g., horizontal synchronization signal) for driving a display device coupled or unitary with the input sensing device ISU, and a decrease in a bandwidth of the touch driving signal and a decrease in touch sensing sensitivity due thereto may be prevented.

Figure 2A:
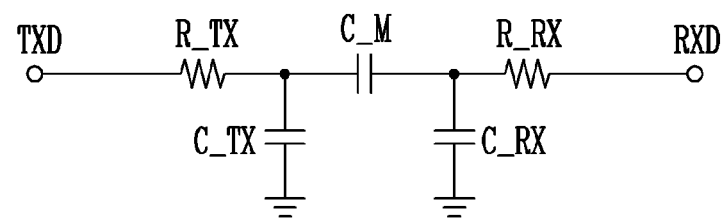
FIG. 2A is a drawing illustrating an equivalent circuit for a circuit configuration between a driving signal generator and a sensing unit included in the input sensing device of FIG. 1.

FIG. 2A is a drawing illustrating an equivalent circuit for a circuit configuration between a driving signal generator and a sensing unit included in the input sensing device of FIG. 1. FIG. 2B is a drawing illustrating an embodiment of a touch driving signal and a sensing signal. FIG. 2C is a drawing illustrating intensity of a sensing signal based on an input location of a touch driving signal. Hereinafter, for convenience, an expression such as "resistance X" may mean a resistance of a resistor X, and an expression such as "capacitance Y" may mean a capacitance of a capacitor Y.

First, referring to FIGS. 1 and 2A, an equivalent circuit shown in FIG. 2A may include a transmission resistor R_TX, a transmission capacitor C_TX, a sensing capacitor C_M, a receiving capacitor C_RX, and a receiving resistor R_RX. The transmission resistor R_TX may be connected between the driving signal generator TXD and one electrode of the sensing capacitor C_M, the transmission capacitor C_TX may be connected between the one electrode of the sensing capacitor C_M and the ground, the receiving capacitor C_RX may be connected between the other electrode of the sensing capacitor C_M and the ground, and the receiving resistor R_RX may be connected between the other electrode of the sensing capacitor C_M and the sensing unit RXD.

In an embodiment, it is assumed that the equivalent circuit of FIG. 2A represents an equivalent circuit for the fifth driving signal line SL1-5, the fifth driving electrode IE1-5, the 5-1-th sensing capacitance C51 (i.e., capacitance generated between the fifth driving electrode IE1-5 and the first sensing electrode IE2-1), the first sensing electrode IE2-1, and the first sensing signal line SL2-1, for example.

In this case, the transmission resistance R_TX may represent the total resistance of the fifth driving signal line SL1-5 and the fifth driving electrode IE1-5 based on the 5-1-th sensing capacitance C51. The transmission capacitor C_TX may represent the total parasitic capacitance of the fifth driving signal line SL1-5 and the fifth driving electrode IE1-5 based on the 5-1-th sensing capacitance C51. The sensing capacitor C_M may represent the 5-1-th sensing capacitance C51. The receiving capacitor C_RX may represent the total parasitic capacitance of the first sensing electrode IE2-1 and the first sensing signal line SL2-1 based on the 5-1-th sensing capacitance C51. The receiving resistance R_RX may represent the total resistance of the first sensing signal line SL2-1 and the first sensing electrode IE2-1 based on the 5-1-th sensing capacitance C51.

When the fifth touch driving signal TX5 is applied to the fifth driving signal line SL1-5, the fifth touch driving signal TX5 transmitted to the sensing capacitor C_M may have an RC delay due to the transmission resistor R_TX and the transmission capacitor C_TX. The second sensing signal provided to the sensing unit RXD in response to the fifth touch driving signal TX5 and the sensing capacitor C_M may have an RC delay due to the receiving resistor R_RX and the receiving capacitor C_RX.

Figure 2B:
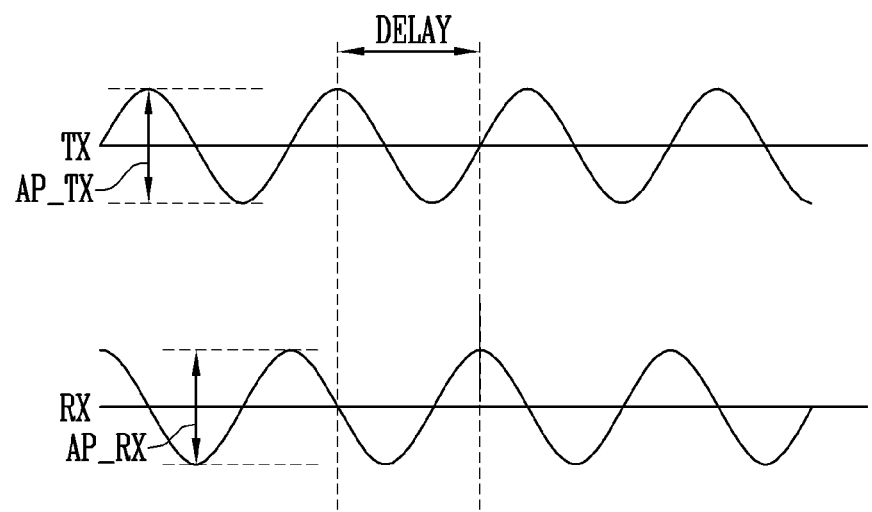
FIG. 2B is a drawing illustrating an embodiment of a touch driving signal and a sensing signal.
Figure 2C:
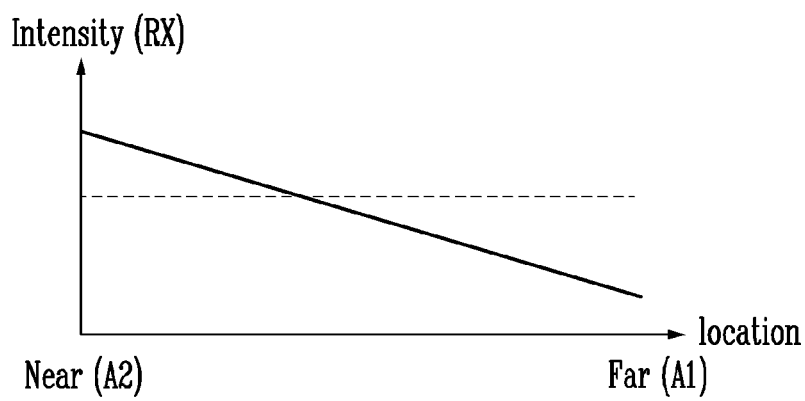
FIG. 2C is a drawing illustrating intensity of a sensing signal based on an input location of a touch driving signal.

Accordingly, as shown in FIG. 2B, the sensing signal RX (e.g., second sensing signal) in the sensing unit RXD may have an RC delay by a predetermined time DELAY or a predetermined phase based on the touch driving signal TX (e.g., fifth touch driving signal TX5) provided from the driving signal generator TXD. In addition, an amplitude AP_RX of the sensing signal RX may be smaller than an amplitude AP_TX of the touch driving signal TX due to the transmission resistor R_TX and the receiving resistor R_RX. That is, attenuation may occur in the sensing signal RX.

As another example, it is assumed that the equivalent circuit of FIG. 2A represents an equivalent circuit for the first driving signal line SL1-1, the first driving electrode IE1-1, and the 1-1-th sensing capacitance C11 (i.e., capacitance generated between the first driving electrode IE1-1 and the first sensing electrode IE2-1), the first sensing electrode IE2-1, and the first sensing signal line SL2-1.

In this case, compared with a case for the 5-1-th sensing capacitance C51, each of the transmission resistance R_TX, the transmission capacitor C_TX, the receiving capacitor C_RX, and the receiving resistance R_RX may increase. This is because a length (i.e., path through which the first sensing signal corresponding to the first touch driving signal TX1 moves) of the first driving signal line SL1-1 and the first sensing electrode IE2-1 increases, and an area overlapping with other configurations increases. Accordingly, as shown in FIG. 2B, compared with the case for the 5-1-th sensing capacitance C51, an RC delay of the sensing signal RX (e.g., first sensing signal) in the sensing unit RXD may be greater. In addition, when the RC delay increases, the sensing capacitor C_M is not sufficiently charged and discharged, so the amplitude AP_RX of the sensing signal RX may be smaller. Further, since the transmission resistance R_TX and the receiving resistance R_RX are relatively great, attenuation of the sensing signal RX is relatively great, and the amplitude AP_RX of the sensing signal RX may be smaller.

As shown in FIG. 2C, when the location of the touch driving electrode to which the touch driving signal TX is applied is closest to the input sensing circuit IS-C (Near), the intensity of the sensing signal RX may be the greatest. In an embodiment, when the touch driving signal TX is applied to the fifth driving electrode IE1-5 in the second area A2, a movement path of the touch driving signal TX and the sensing signal RX corresponding thereto may be the shortest, for example. Accordingly, in this case, the RC delay and signal attenuation may be the smallest, the sensing capacitor C_M may be sufficiently charged and discharged, and the intensity of the sensing signal RX may be the greatest.

As the location of the touch driving electrode to which the touch driving signal TX is applied is farther from the input sensing circuit IS-C, the intensity of the sensing signal RX may decrease.

When the location of the touch driving electrode to which the touch driving signal TX is applied is farthest from the input sensing circuit IS-C (Far), the intensity of the sensing signal RX may be the smallest. In an embodiment, when the same touch driving signal TX is applied to the first driving electrode IE1-1, the movement path of the touch driving signal TX and the sensing signal RX corresponding thereto may be the longest, for example. Accordingly, in this case, the RC delay and signal attenuation may be the greatest, the sensing capacitor C_M may not be sufficiently charged and discharged, and the intensity of the sensing signal RX may be the smallest.

Figure 3A:
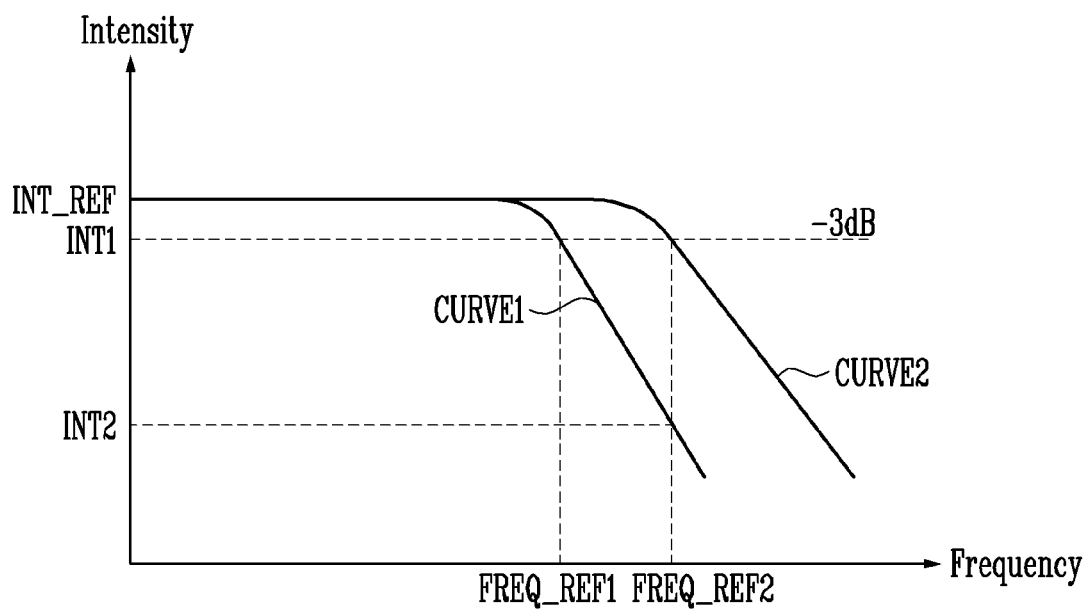
FIG. 3A is a drawing illustrating intensity of a sensing signal based on a frequency of a touch driving signal.

FIG. 3A is a drawing illustrating intensity of a sensing signal based on a frequency of a touch driving signal.

First, referring to FIGS. 1 and 3A, a first curve CURVE1 represents the intensity of a sensing signal (i.e., sensing signal received by the sensing unit RXD) based on the frequency of the first touch driving signal TX1. Here, the first touch driving signal TX1 may be provided to the first driving electrode IE1-1 through the first driving signal line SL1-1. A second curve CURVE2 represents the intensity of a sensing signal based on the frequency of the fifth touch driving signal TX5. Here, the fifth touch driving signal TX5 may be provided to the fifth driving electrode IE1-5 through the fifth driving signal line SL1-5. The amplitude of the first touch driving signal TX1 and the amplitude of the fifth touch driving signal TX5 may have constant or fixed values regardless of the frequency, and may be the same.

When the frequency increases to a point adjacent to the first reference frequency FREQ_REF1 along the first curve CURVE1, the intensity of the sensing signal may decrease.

In a section where the frequency is smaller than the first reference frequency FREQ_REF1, the intensity of the sensing signal is maintained at the reference strength INT_REF, and at a point where the frequency is the same as the first reference frequency FREQ_REF1, the intensity of the sensing signal may have the first strength INT1, and may be changed by about −3 decibels (dB) based on the reference strength INT_REF. That is, the first reference frequency FREQ_REF1 may be a frequency (e.g., cut-off frequency) at which the intensity of the sensing signal based on the first touch driving signal TX1 decreases to a half. In addition, as the frequency becomes greater than the first reference frequency FREQ_REF1, the sensing capacitance may not be sufficiently charged and discharged, and the intensity of the sensing signal may decrease. In an embodiment, at a point where the frequency is the same as the second reference frequency FREQ_REF2, the intensity of the sensing signal may have a second intensity INT2 smaller than the first intensity INT1, for example.

Accordingly, the frequency of the first touch driving signal TX1 may be set to be smaller than or equal to the first reference frequency FREQ_REF1. As an area of the input sensing device ISU increases, the sensing time allocated to the first driving electrode IE1-1 decreases, and the frequency of the first touch driving signal TX1 may decrease. In this case, the frequency of the first touch driving signal TX1 may have the same frequency as the first reference frequency FREQ_REF1 at maximum.

Similarly, when the frequency increases to a point adjacent to the second reference frequency FREQ_REF2 along the second curve CURVE2, the intensity of the sensing signal may decrease. Since the RC delay of the fifth touch driving signal TX5 is smaller than the RC delay of the first touch driving signal TX1, a cut-off frequency (i.e., second reference frequency FREQ_REF2) for the fifth touch driving signal TX5 may be greater than a cut-off frequency (i.e., first reference frequency FREQ_REF1) for the first touch driving signal TX1. Accordingly, the frequency of the fifth touch driving signal TX5 may be set to be smaller than or equal to the second reference frequency FREQ_REF2.

In this way, in consideration of a change in the intensity of the sensing signal due to the RC delay of each of the touch driving signals TX1 to TX5 provided to the driving electrodes IE1-1 to IE1-5, the frequency of each of the touch driving signals TX1 to TX5 may be set.

FIG. 3B is a drawing illustrating an embodiment of a touch driving signal generated by a driving signal generator included in the input sensing device of FIG. 1.

Referring to FIGS. 1, 3A, and 3B, the vertical synchronization signal Vsync may be provided to the input sensing device ISU (or input sensing circuit IS-C) from an external (e.g., host system such as an application processor), and may define a start of one frame. That is, a period T_Vsync of the vertical synchronization signal Vsync may be equal to one frame. In an embodiment, the period T_Vsync (or one frame) of the vertical synchronization signal Vsync may be about 16.6 milliseconds (ms), for example. During one frame, the input sensing device ISU may supply the touch driving signals TX1 to TX5 to the driving electrodes IE1-1 to IE1-5 to perform an operation of determining whether a touch is input to the entire input sensing panel ISP at least once (e.g., twice). For reference, as will be described later with reference to FIG. 18, when the input sensing device ISU is coupled with or unitary with the display device, or included in the display device, data signals are sequentially written to pixels in the display device during one frame, and one frame image may be displayed.

The horizontal synchronization signal Hsync may be provided from an external (e.g., host system such as an application processor) to the display device. The horizontal synchronization signal Hsync may define a section in which each of the horizontal line images included in one frame image is output. The period T_Hsync of the horizontal synchronization signal Hsync may be defined as one horizontal time 1H, and the horizontal line images may be sequentially output or displayed for each one horizontal time 1H. In an embodiment, the period T_Hsync (or 1H) of the horizontal synchronization signal Hsync may be about 5.63 microseconds (μs), for example.

The horizontal synchronization signal Hsync may be not provided to the input sensing device ISU, but may act as noise in the input sensing device ISU.

Since the touch driving signals TX1 to TX5 generated by the input sensing device ISU include a sinusoidal wave, noise due to the horizontal synchronization signal Hsync may be easily removed from the sensing signals. In addition, noise may be more easily removed through an analog front-end (i.e., fully differential analog front-end) described later. Accordingly, the frequencies of the touch driving signals TX1 to TX5 may be set asynchronously with the horizontal synchronization signal Hsync.

That is, the touch driving signals TX1 to TX5 change irrespective of the horizontal synchronization signal Hsync, and for example, the periods of the touch driving signals TX1 to TX5 may be about 5 μs, about 4 μs, and about 2.9 μs (or, the touch driving signals TX1 to TX5 have frequencies of about 200 kilohertz (KHz), about 250 KHz, and about 350 kHz), and may be different from the period T_Hsync of the horizontal synchronization signal Hsync or a multiple thereof.

As described with reference to FIG. 3A, since the touch driving signals TX1 to TX5 are set in consideration of only the change in the intensity of the sensing signal due to the RC delay, at least one of the touch driving signals TX1 to TX5 may have a period smaller than the period T_Hsync of the horizontal synchronization signal Hsync, or at least one of the touch driving signals TX1 to TX5 may have a period greater than the period T_Hsync of the horizontal synchronization signal Hsync.

In an embodiment, all of the touch driving signals TX1 to TX5 may have a period smaller than the period T_Hsync of the horizontal synchronization signal Hsync, similar to the period T_TX_REF1 of the first reference touch driving signal TX_REF1, for example. As another example, all of the touch driving signals TX1 to TX5 may have a period greater than the period T_Hsync of the horizontal synchronization signal Hsync, similar to the period T_TX_REF2 of the second reference touch driving signal TX_REF2. As another example, the period of the fifth touch driving signal TX5 may be set similar to the period T_TX_REF1 of the first reference touch driving signal TX_REF1, and the period of the first touch driving signal TX1 may be set similar to the period T_TX_REF2 of the second reference touch driving signal TX_REF2.

Figure 3C:
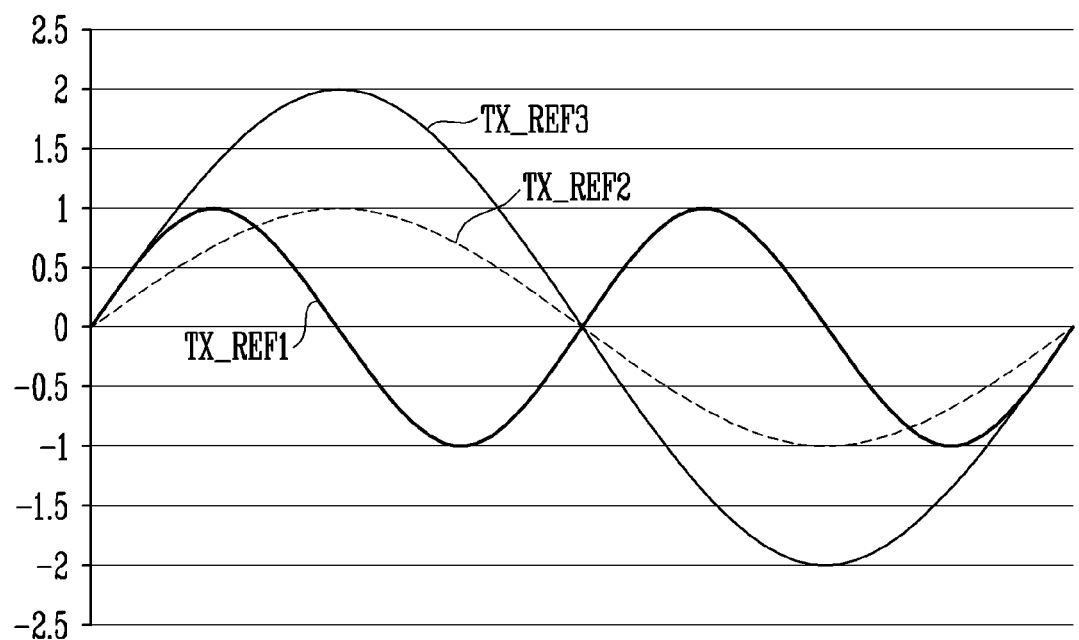
FIGS. 3C and 3D are drawings illustrating another embodiment of a touch driving signal generated by a driving signal generator included in the input sensing device of FIG. 1.
Figure 3D:
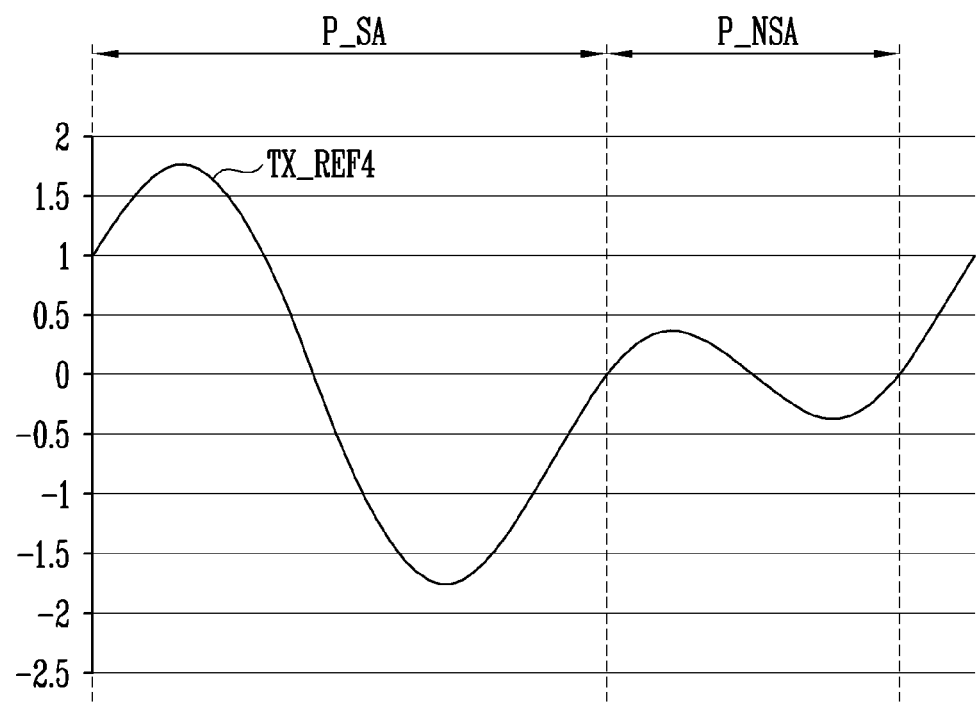

FIGS. 3C and 3D are drawings illustrating another embodiment of a touch driving signal generated by a driving signal generator included in the input sensing device of FIG. 1.

Referring to FIGS. 1, 3A, 3B, and 3C, the fifth touch driving signal TX5 may be the same as the first reference touch driving signal TX_REF1. A size (or amplitude) of the first reference touch driving signal TX_REF1 is defined as one. In an embodiment, the frequency of the first reference touch driving signal TX_REF1 may be greater than or equal to the first reference frequency FREQ_REF1, and may be smaller than the second reference frequency FREQ_REF2, for example. In this case, the intensity of the sensing signal corresponding to the fifth touch driving signal TX5 may not decrease.

The first touch driving signal TX1 may be the same as the second reference touch driving signal TX_REF2. The size of the second reference touch driving signal TX_REF2 may be the same as the size of the first reference touch driving signal TX_REF1.

In an embodiment, it is assumed that the frequency of the first touch driving signal TX_REF1 is the same as the first reference frequency FREQ_REF1, for example. In this case, the intensity of the sensing signal corresponding to the first touch driving signal TX1 may decrease to a half.

Accordingly, the first touch driving signal TX1 may be set to have a relatively large size (or amplitude), such as the third reference touch driving signal TX_REF3. The frequency of the third reference touch driving signal TX_REF3 may be the same as the frequency of the second reference touch driving signal TX_REF2, but the size (or amplitude) of the third reference touch driving signal TX_REF3 may be twice the size of the second reference touch driving signal TX_REF2. In this case, the intensity of the sensing signal corresponding to the first touch driving signal TX1 may be the same as or similar to the intensity of the sensing signal corresponding to the fifth touch driving signal TX5.

When the sensing time allocated to the first driving electrode IE1-1 to which the first touch driving signal TX1 is applied decreases due to an enlargement of the input sensing device ISU, the frequency of the first touch driving signal TX1 may be set to the first reference frequency FREQ_REF1 (or frequency at which the intensity decreases). In this case, the size of the first touch driving signal TX1 is set to be relatively high, so that a decrease in the intensity of the sensing signal may be compensated.

That is, the input sensing device ISU may set the touch driving signals TX1 to TX5 to have different sizes from one another as well as different frequencies from one another.

As will be described with reference to FIG. 10, in order to reduce power consumption, the input sensing circuit IS-C may perform a sampling operation on the touch driving signals TX1 to TX5 only in a portion of the sampling sections. Correspondingly, at least one of the touch driving signals TX1 to TX5, such as the fourth reference touch driving signal TX_REF4 shown in FIG. 3D, may have a relatively high frequency and a relatively large amplitude only in a section P_SA in which the sampling operation is performed, and may have a relatively small frequency and a relatively small amplitude in a section P_NSA in which the sampling operation is not performed.

That is, the input sensing device ISU may generate the touch driving signals TX1 to TX5 by combining different frequencies and different amplitudes from one another.

As described with reference to FIGS. 3C and 3D, the touch driving signals TX1 to TX5 may have different amplitudes as well as different frequencies, and may also have a waveform in which different frequencies and different amplitudes are combined.

Figure 4B:
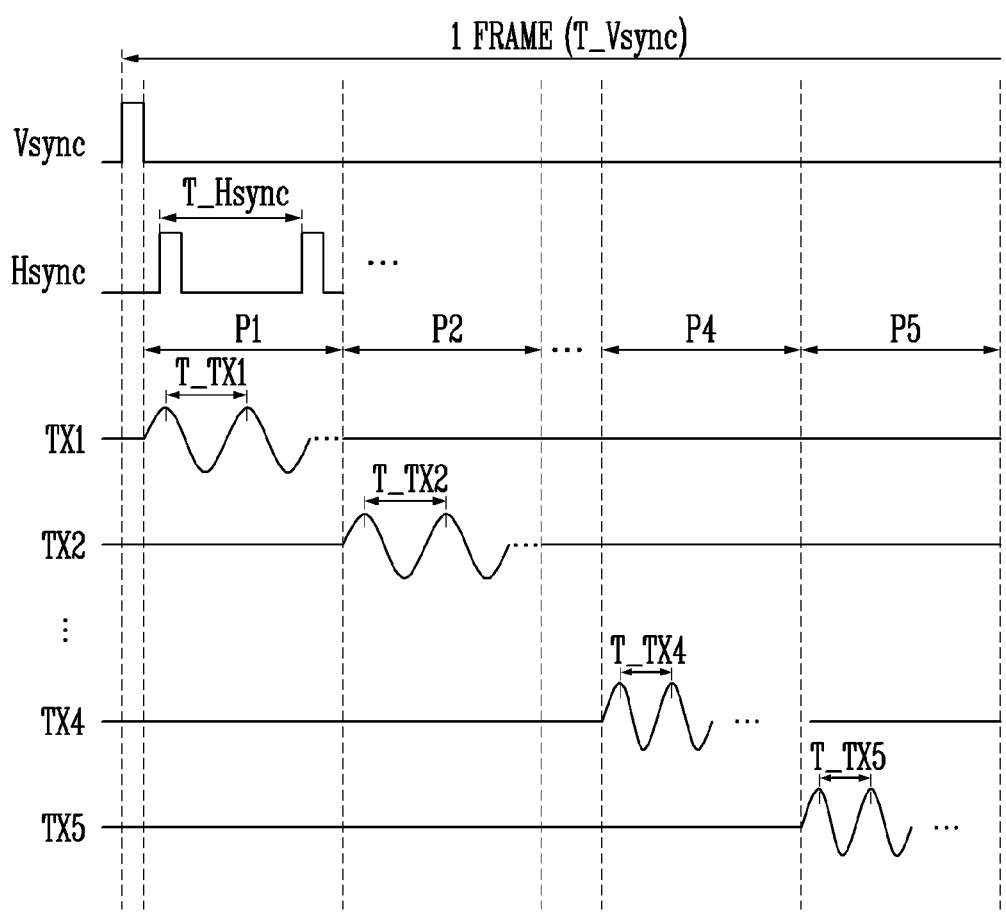
Figure 4C:
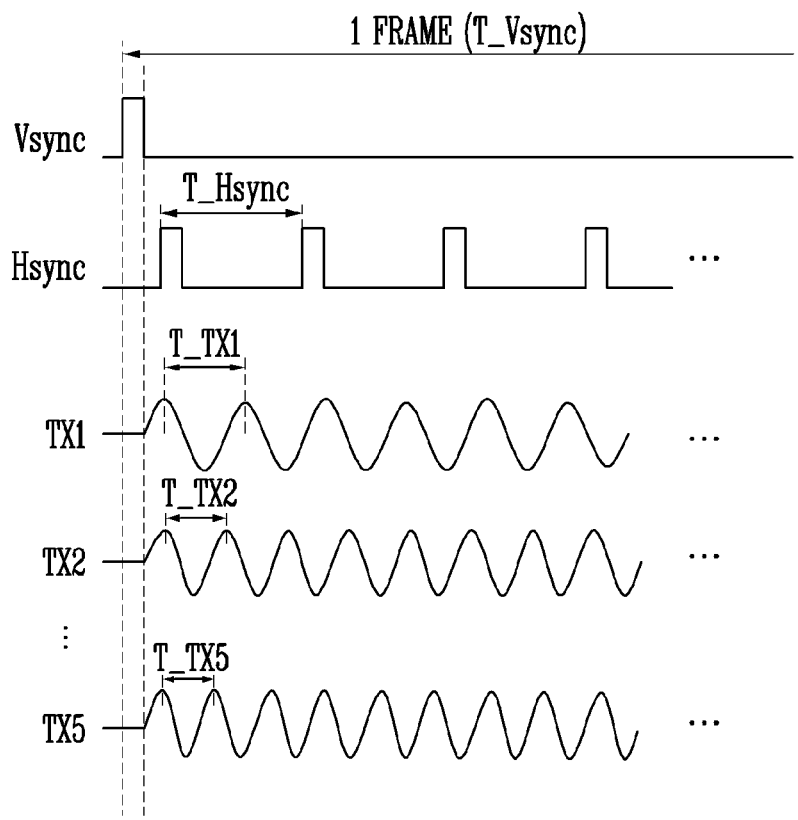

FIGS. 4A to 4C are drawings illustrating embodiments of touch driving signals generated by a driving signal generator included in the input sensing device of FIG. 1. In FIGS. 4A to 4C, for convenience of description, only some of the touch driving signals TX1 to TX5 are illustrated, but embodiments of FIGS. 4A to 4C may be applied to all of the touch driving signals TX1 to TX5.

Referring to FIGS. 1, 3B, and 4A, in a section in which a pulse of the vertical synchronization signal Vsync occurs, the touch driving signals TX1 to TX5 may have a reference value (or a direct current ("DC") voltage). In an embodiment, the driving signal generator TXD may not output the touch driving signals TX1 to TX5 in the section (i.e., before the first section P1) in which the pulse of the vertical synchronization signal Vsync occurs, or may output the touch driving signals TX1 to TX5 having a predetermined value, e.g., zero volt (V).

Immediately before a rising edge of the vertical synchronization signal Vsync occurs (or before a pulse of a logical high level occurs), the touch driving signals TX1 to TX5 have a reference value, and after a falling edge of the vertical synchronization signal Vsync occurs (or after the pulse ends), the touch driving signals TX1 to TX5 may include a sinusoidal wave.

For reference, since the period T_Hsync of the horizontal synchronization signal Hsync is relatively short, noise (e.g., noise having a relatively high frequency) caused by the horizontal synchronization signal Hsync may be effectively filtered through the analog front-ends AFE1 to AFE4. However, since the period of the vertical synchronization signal Vsync is relatively long, noise (i.e., noise having a relatively low frequency) caused by the vertical synchronization signal Vsync may not be filtered through the analog front-ends AFE1 to AFE4. Accordingly, the driving signal generator TXD may generate the touch driving signals TX1 to TX5 that are synchronized with the vertical synchronization signal Vsync, that is, avoids the pulse of the vertical synchronization signal Vsync.

In an embodiment, the touch driving signals TX1 to TX5 may sequentially have valid signals (i.e., sinusoidal wave) during one frame 1 FRAME. That is, the input sensing device ISU may provide the touch driving signals TX1 to TX5 to the driving electrodes IE1-1 to IE1-5 in a sequential driving method.

One frame 1 FRAME may sequentially include the first to fifth sections P1 to P5.

The first touch driving signal TX1 provided to the first driving electrode IE1-1 in the first section P1 may include a sinusoidal wave having a first period T_TX1.

The second touch driving signal TX2 provided to the second driving electrode IE1-2 in the second section P2 may include a sinusoidal wave having a second period T_TX2. The second period T_TX2 may be smaller than the first period T_TX1.

The fifth touch driving signal TX5 provided to the fifth driving electrode IE1-5 in the fifth section P5 may include a sinusoidal wave having a fifth period T_TX5. The fifth period T_TX5 may be smaller than the second period T_TX2.

That is, the input sensing device ISU may sequentially provide the touch driving signals TX1 to TX5 having different periods (or frequencies) to the driving electrodes IE1-1 to IE1-5 in different sections.

In an embodiment, the first to fifth sections P1 to P5 may have the same width. In another embodiment, the first to fifth sections P1 to P5 may have different widths. In an embodiment, the width of the first section P1 corresponding to the first period T_TX1 of the first touch driving signal TX1 may be the largest, and the width of the fifth section P5 corresponding to the fifth period T_TX5 of the fifth touch driving signal TX5 may be the smallest, for example. In this case, the total sensing time of the input sensing device ISU may decrease. In an alternative embodiment, when the total sensing time is fixed, the touch driving signals TX1 to TX5 may have a relatively low frequency (i.e., frequency corresponding to a relatively high sensing sensitivity).

In an embodiment, the touch driving signals TX1 to TX5 may have a valid signal (i.e., sinusoidal wave) sequentially two or more times during one frame 1 FRAME. In an embodiment, the touch driving signals TX1 to TX5 may include a valid signal (i.e., sinusoidal wave) in two or more sections that are sequentially discontinuous from each other (i.e., separated from each other) during one frame 1 FRAME, for example. That is, the input sensing device ISU may provide the touch driving signals TX1 to TX5 to the driving electrodes IE1-1 to IE1-5 two or more times in a sequential driving method.

One frame 1 FRAME may further include sixth to tenth sections P6 to P10 sequentially.

The first touch driving signal TX1 provided to the first driving electrode IE1-1 in the sixth section P6 may include a sinusoidal wave having a first period T_TX1.

The second touch driving signal TX2 provided to the second driving electrode IE1-2 in the seventh section P7 may include a sinusoidal wave having a second period T_TX2.

The fifth touch driving signal TX5 provided to the fifth driving electrode IE1-5 in the tenth section P10 may include a sinusoidal wave having a fifth period T_TX5.

In FIG. 4A, the touch driving signals TX1 to TX5 are described to have different periods (or frequencies), but the touch driving signals TX1 to TX5 are not limited thereto.

Referring to FIGS. 1 and 4B, the first touch driving signal TX1 provided to the first driving electrode IE1-1 in the first section P1 may include a sinusoidal wave having a first period T_TX1.

The second touch driving signal TX2 provided to the second driving electrode IE1-2 in the second section P2 may include a sinusoidal wave having a second period T_TX2. Here, the second period T_TX2 may be the same as the first period T_TX1.

That is, a touch driving signal having the same period may be provided to the first driving electrode IE1-1 and the second driving electrode IE1-2 included in the first area A1.

The fourth touch driving signal TX4 provided to the fourth driving electrode IE1-4 in the fourth section P4 may include a sinusoidal wave having a fourth period T_TX4. The fourth period T_TX4 may be smaller than the second period T_TX2.

The fifth touch driving signal TX5 provided to the fifth driving electrode IE1-5 in the fifth section P5 may include a sinusoidal wave having a fifth period T_TX5. Here, the fifth period T_TX5 may be the same as the fourth period T_TX4.

That is, a touch driving signal having the same period may be provided to the fourth driving electrode IE1-4 and the fifth driving electrode IE1-5 included in the second area A2.

In FIGS. 4A and 4B, the input sensing device ISU is described to provide the touch driving signals TX1 to TX5 to the driving electrodes IE1-1 to IE1-5 in a sequential driving method, but it is not limited thereto.

Referring to FIGS. 1 and 4C, the touch driving signals TX1 to TX5 may simultaneously have valid signals (i.e., sinusoidal waves) during one frame 1 FRAME. That is, the input sensing device ISU may provide the touch driving signals TX1 to TX5 to the driving electrodes IE1-1 to IE1-5 in a simultaneous driving method.

The second period T_TX2 of the second touch driving signal TX2 may be smaller than the first period T_TX1 of the first touch driving signal TX1, and the fifth period T_TX5 of the fifth touch driving signal TX5 may be smaller than the second period T_TX2 of the second touch driving signal TX2. That is, the touch driving signals TX1 to TX5 may have different periods (or frequencies).

In this case, the input sensing device ISU (or sensing unit RXD) may determine whether a touch has occurred or calculate a location where the touch has occurred through frequency analysis. In an embodiment, the sensing unit RXD may obtain a frequency size of the sensing signals by performing fast Fourier transform on the sensing signals, and may calculate a touch location based on a change in the frequency size, for example. In an embodiment, when a frequency size corresponding to the first period T_TX1 is smaller in the sensing signal received from the first sensing electrode IE2-1, the sensing unit RXD may determine that a touch has occurred in a region where the first sensing electrode IE2-1 and the first driving electrode IE1-1 intersect, for example.

As described with reference to FIGS. 4A to 4C, the input sensing device ISU may provide the touch driving signals TX1 to TX5 to the driving electrodes IE1-1 to IE1-5 in the sequential driving method or the simultaneous driving method. Also, the touch driving signals TX1 to TX5 may have different frequencies, or some of the touch driving signals TX1 to TX5 may have the same frequency.

Figure 5:
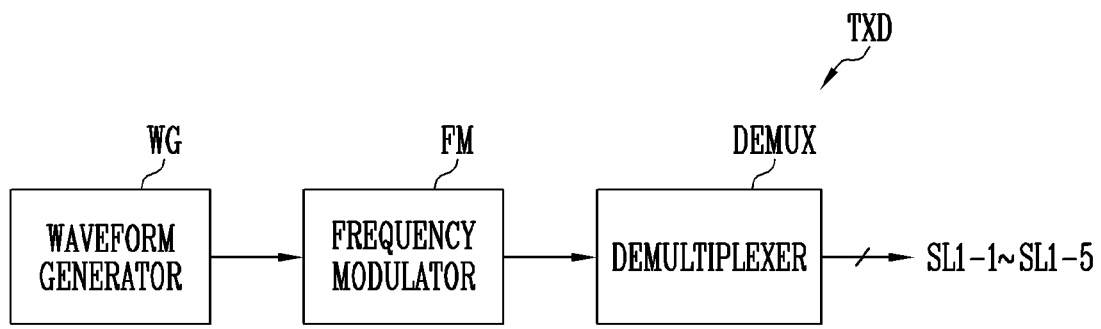
FIG. 5 is a block diagram illustrating an embodiment of a driving signal generator included in the input sensing device of FIG. 1.

FIG. 5 is a block diagram illustrating an embodiment of a driving signal generator included in the input sensing device of FIG. 1.

Referring to FIGS. 1 and 5, the driving signal generator TXD may include a waveform generator WG, a frequency modulator FM, and a demultiplexer DEMUX.

The waveform generator WG may generate a reference signal. In an embodiment, the waveform generator WG may be implemented as a general oscillation circuit or a function generator, for example. The reference signal may include a sinusoidal wave, and a frequency of the reference signal may be greater than or equal to the frequency of the touch driving signals TX1 to TX5.

The frequency modulator FM may generate touch driving signals TX1 to TX5 by frequency-modulating the reference signal.

In an embodiment, the frequency modulator FM may generate the touch driving signals TX1 to TX5 by frequency division of the reference signal. In an embodiment, the frequency modulator FM may generate the first touch driving signal TX1 by dividing the reference signal by six, and may generate the fifth touch driving signal TX5 by dividing the reference signal by three. Divided values for each of the touch driving signals TX1 to TX5 may be preset in the manufacturing process of the input sensing device ISU (and a display device including the same), and may be stored in a separate memory device, for example.

In another embodiment, the frequency modulator FM may generate the touch driving signals TX1 to TX5 by adding an offset frequency to the frequency of the reference signal. In an embodiment, the frequency modulator FM may generate the first touch driving signal TX1 by adding offset frequencies such as 0 KHz, 50 KHz, 100 KHz, and the like to the reference signal, and may generate the fifth touch driving signal TX5 by adding offset frequencies such as 100 KHz, 150 KHz, 200 KHz, and the like to the reference signal, for example. The offset frequency for each of the touch driving signals TX1 to TX5 may be preset during a manufacturing process of the input sensing device ISU (and a display device including the same), and may be stored in a separate memory device. The touch driving signals TX1 to TX5 generated based on the offset frequency may have a frequency more optimized for the input sensing device ISU than the touch driving signals TX1 to TX5 generated through frequency division.

In an embodiment, the frequency modulator FM may sequentially generate the touch driving signals TX1 to TX5. Referring to FIG. 4A, for example, the frequency modulator FM may generate the first touch driving signal TX1 in the first section P1, and may generate the fifth touch driving signal TX5 in the fifth section P5.

In this case, the demultiplexer DEMUX may transmit the first touch driving signal TX1 to the first driving signal line SL1-1 (and the first driving electrode IE1-1) in the first section P1, and may transmit the fifth touch driving signal TX5 to the fifth driving signal line SL1-5 (and the fifth driving electrode IE1-5) in the fifth period P5.

In another embodiment, the frequency modulator FM may simultaneously generate the touch driving signals TX1 to TX5. Referring to FIG. 4C, for example, the frequency modulator FM simultaneously generates the first touch driving signal TX1 to the fifth touch driving signal TX5, and may provide the first touch driving signal TX1 to the fifth touch driving signal TX5 to the first driving signal line SL1-1 to the fifth driving signal line SL1-5, respectively. In this case, the demultiplexer DEMUX may be omitted.

As described with reference to FIG. 5, the driving signal generator TXD may generate the touch driving signals TX1 to TX5 having different frequencies by frequency-modulating the reference signal.

Figure 7A:
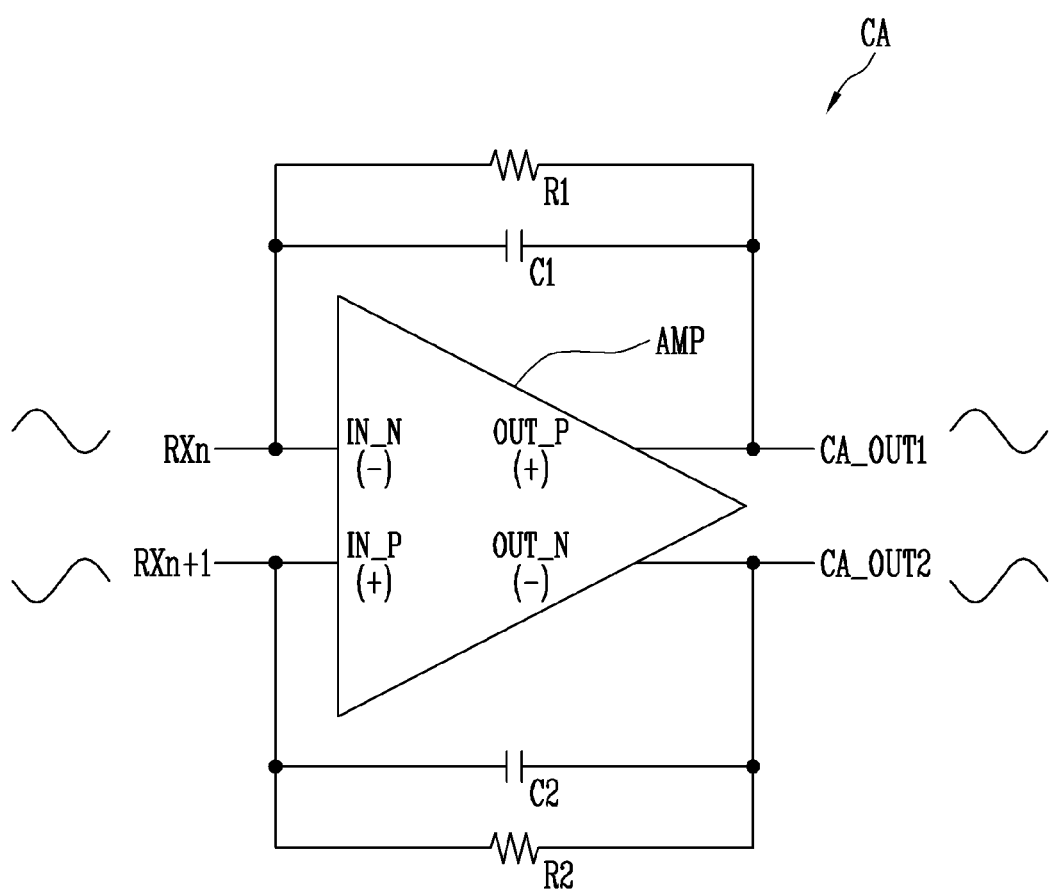
FIG. 7A is a circuit diagram illustrating an embodiment of a charge amplifier included in the analog front end of FIG. 6A.
Figure 7B:
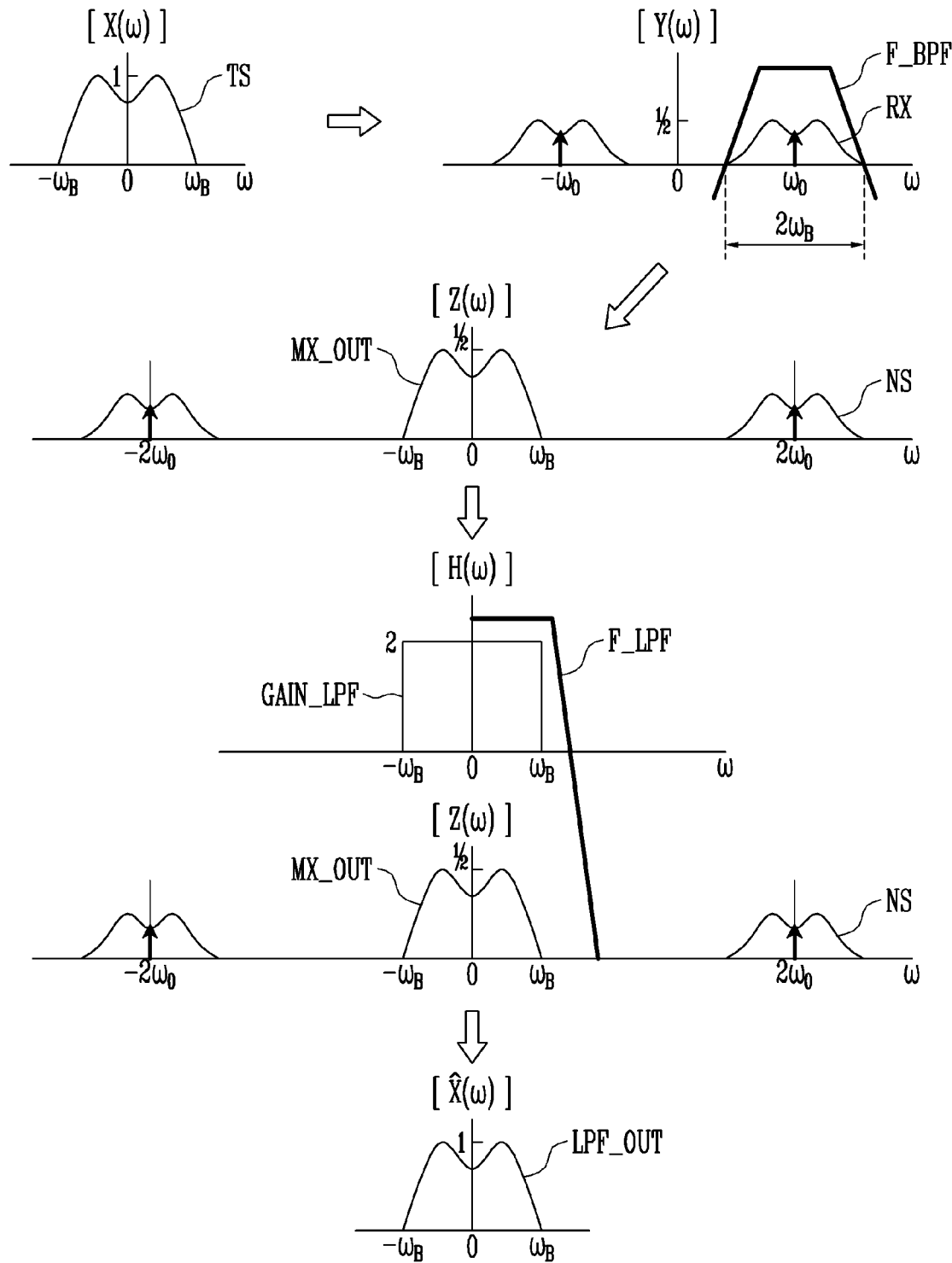
FIG. 7B is a drawing illustrating an embodiment of signals for explaining an operation of the analog front end of FIG. 6A.

FIGS. 6A and 6B are block diagrams illustrating an embodiment of an analog front end included in the input sensing device of FIG. 1. FIG. 7A is a circuit diagram illustrating an embodiment of a charge amplifier included in the analog front end of FIG. 6A. FIG. 7B is a drawing illustrating an embodiment of signals for explaining an operation of the analog front end of FIG. 6A. In FIG. 7B, signals applied to the analog front-end AFEn of FIG. 6A or generated in the analog front-end AFEn are shown in the frequency domain.

Referring to FIGS. 1 and 6A, since the analog front-ends AFE1 to AFE4 are equivalent to each other, the analog front-end AFEn (here n is a positive integer) will be described as representative of the analog front-ends AFE1 to AFE4.

The analog front-end AFEn may include a charge amplifier CA (or first charge amplifier), a band pass filter BPF, a mixer MX, a low pass filter LPF, and an analog-to-digital converter ADC.

The charge amplifier CA may receive an n-th sensing signal RXn provided through the n-th sensing signal line SL2-$n$ and an n+1-th sensing signal RXn+1 provided through the n+1-th sensing signal line SL2-($n$+1), and may differentially amplifying the n-th sensing signal RXn and the n+1-th sensing signal RXn+1 to output a first differential signal CA_OUT1 and second differential signal CA_OUT2 complementary to each other.

In an embodiment, the charge amplifier CA may be implemented as a fully differential amplifier. A typical differential amplifier may differentiate two input signals to output one signal, and a fully differential amplifier may be defined as a differential amplifier that differentials two input signals to output two differential signals (i.e., complementary signals). The charge amplifier CA implemented as the fully differential amplifier may maximize a size of sensing signals in relation to an analog-to-digital converter ADC (e.g., a differential analog-to-digital converter that differentials two analog signals to output a digital value).

Referring to FIG. 7A, the charge amplifier CA may include an amplifier AMP, a first capacitor C1, a first resistor R1, a second capacitor C2, and a second resistor R2.

The amplifier AMP may include a second input terminal IN_P (i.e., +input terminal), a first input terminal IN_N (i.e., −input terminal), a first output terminal OUT_P (i.e., +output terminal), and a second output terminal OUT_N (i.e., −output terminal). In some cases, the amplifier AMP may include a first sub-amplifier including input/output terminals corresponding to the second input terminal IN_P, the first input terminal IN_N, and the first output terminal OUT_P, and a second sub-amplifier including input/output terminals corresponding to the second input terminal IN_P, the first input terminal IN_N, and the second output terminal OUT_N.

The first input terminal IN_N of the amplifier AMP may be connected to the n-th sensing signal line SL2-$n$, and the n-th sensing signal RXn may be applied to the first input terminal IN_N of the amplifier AMP. The second input terminal IN_P of the amplifier AMP may be connected to the n+1-th sensing signal line SL2-($n$+1), and the n+1-th sensing signal RXn+1 may be applied to the second input terminal IN_P of the amplifier AMP.

The first capacitor C1 and the first resistor R1 may be connected in parallel between the first input terminal IN_N and the first output terminal OUT_P of the amplifier AMP. Therefore, a first differential signal CA_OUT1 corresponding to a difference between the n-th sensing signal RXn and the n+1-th sensing signal RXn+1 may be output through the first output terminal OUT_P of the amplifier AMP.

Similarly, the second capacitor C2 and the second resistor R2 may be connected in parallel between the second input terminal IN_P and the second output terminal OUT_N of the amplifier AMP. Accordingly, a second differential signal CA_OUT2 corresponding to a difference between the n+1-th sensing signal RXn+1 and the n-th sensing signal RXn may be output through the second output terminal OUT_N of the amplifier AMP. The second differential signal CA_OUT2 may have a waveform in which the first differential signal CA_OUT1 is inverted.

The charge amplifier CA may remove alternating current ("AC") offset and common noise by outputting the first differential signal CA_OUT1 and the second differential signal CA_OUT2 in a differential method.

Referring back to FIG. 6A, the band pass filter BPF may select only signals in a predetermined frequency band of each of the first differential signal CA_OUT1 and the second differential signal CA_OUT2, and may output the first filtered signal BPF_OUT1 and the second filtered signal BPF_OUT2.

Referring to FIG. 7B, the touch signal TS has a frequency within a reference bandwidth (e.g., −ωB to ωB) based on the driving frequency (or sensing period) of the input sensing circuit IS-C (refer to FIG. 1). The sensing signal RX provided to the analog front-end AFEn from the sensing electrodes IE2-1 to IE2-4 (refer to FIG. 1) may be modulated by the touch driving signal TX, and may have a frequency within a reference bandwidth (2ω0) based on a frequency (ω0) of the touch driving signal TX. The sensing signal RX may include a negative frequency component (e.g. −ω0), but the negative frequency component may have the same size as a positive frequency component and may have a phase difference of 180 degrees from a positive frequency component, and the negative frequency component has no physically meaning. Therefore, it is not considered. The band pass filter BPF may have a first transfer function F_BPF corresponding to the frequency band of the sensing signal RX, and may amplify only a signal in the corresponding frequency band. In an embodiment, the band pass filter BPF may be implemented including a differential amplifier (or fully differential amplifier), a capacitor, and a resistor, and may amplify only a signal corresponding to the frequency band (e.g., 200 KHz to 350 KHz) of the touch driving signal TX (or touch driving signals TX1 to TX5), for example.

Referring back to FIG. 6A, the band pass filter BPF may selectively amplify the first differential signal CA_OUT1 to output a first filtered signal BPF_OUT1, and may selectively amplify the second differential signal CA_OUT2 to output a second filtered signal BPF_OUT2. In an embodiment, the band pass filter BPF may selectively amplify the first differential signal CA_OUT1 applied to a negative input terminal of the fully differential amplifier to output the first filtered signal BPF_OUT1 through a positive output terminal of the fully differential amplifier, and may selectively amplify the second differential signal CA_OUT2 applied to the positive input terminal of the fully differential amplifier to output the second filtered signal BPF_OUT2 through the negative output terminal of the fully differential amplifier, for example.

The second filtered signal BPF_OUT2 may have a waveform in which the first filtered signal BPF_OUT1 is inverted.

The mixer MX may change a frequency of each of the first filtered signal BPF_OUT1 and the second filtered signal BPF_OUT2 to output a first demodulated signal MX_OUT1 and a second demodulated signal MX_OUT2. In an embodiment, the mixer MX may demodulate the first filtered signal BPF_OUT1 to output a first demodulated signal MX_OUT1, and may demodulate the second filtered signal BPF_OUT2 to output a second demodulated signal MX_OUT2, for example.

In an embodiment, the mixer MX may be implemented as a chopping circuit (or chopper) including two input terminals and two output terminals, and may generate the first demodulated signal MX_OUT1 and the second demodulated signal MX_OUT2 by alternately connecting the first filtered signal BPF_OUT1 and second filtered signal BPF_OUT2 provided to the two input terminals to the two output terminals, for example. That is, the mixer MX may extract the touch signal TS (refer to FIG. 7B) from the first filtered signal BPF_OUT1 and the second filtered signal BPF_OUT2.

Referring to FIG. 7B, the mixer MX may convert a signal in a relatively high frequency band (i.e., signal in a frequency band corresponding to the band pass filter BPF) into a demodulated signal MX_OUT in a low frequency band (i.e., signal in a frequency band corresponding to the touch signal TS). In addition, the mixer MX may convert noise in a relatively low frequency band into high frequency noise NS in a high frequency band. For reference, a low frequency noise (e.g., noise referred to as "1/f noise") may be basically generated in semiconductor devices (e.g., transistors) constituting the analog front-end AFEn, and the mixer MX may move the low frequency noise to the high frequency band through a chopping operation.

Referring back to FIG. 6A, a low pass filter LPF may filter noise distributed in the high frequency band of each of the first demodulated signal MX_OUT1 and the second demodulated signal MX_OUT2 to output a first output signal LPF_OUT1 (or third filtered signal) and a second output signal LPF_OUT2 (or fourth filtered signal).

In an embodiment, the low pass filter LPF may be implemented including a differential amplifier (or fully differential amplifier), a resistor, and a capacitor, and may amplify only a signal in a relatively low frequency band, for example. The low pass filter LPF may filter noise of the first demodulated signal MX_OUT1 to output the first output signal LPF_OUT1, and may filter noise of the second demodulated signal MX_OUT2 to output the second output signal LPF_OUT2. In an embodiment, the low pass filter LPF may filter the noise of the first demodulated signal MX_OUT1 applied to the negative input terminal of the fully differential amplifier to output the first output signal LPF_OUT1 through the positive output terminal of the fully differential amplifier, and may filter the noise of the second demodulated signal MX_OUT2 applied to the positive input terminal of the fully differential amplifier to output the second output signal LPF_OUT2 through the positive output terminal of the fully differential amplifier. The second output signal LPF_OUT2 may have a polarity different from the first output signal LPF_OUT1, for example.

Referring to FIG. 7B, the low pass filter LPF has a second transfer function F_LPF corresponding to the frequency band of the touch signal TS, and for example, a gain GAIN_LPF of the second transfer function F_LPF may be about 2 in a frequency band (DB or less. In this case, the low pass filter LPF may amplify only the demodulated signal MX_OUT in the low frequency band and output it as an output signal LPF_OUT.

As described above, the band pass filter BPF, the mixer MX, and the low pass filter LPF may implement the function of the demodulator, and may restore or extract only a signal (i.e., first output signal LPF_OUT1 and second output signal LPF_OUT2) corresponding to the touch driving signal TX from the n-th sensing signal RXn and the n+1-th sensing signal RXn+1.

The analog-to-digital converter ADC may receive the first output signal LPF_OUT1 and the second output signal LPF_OUT2, and may provide a sensing value (or differential output value) corresponding to a difference (e.g., |LPF_OUT1−LPF_OUT2|) between the first output signal LPF_OUT1 and the second output signal LPF_OUT2 to the signal processing unit DSP. In an embodiment, the analog-to-digital converter ADC may convert the first output signal LPF_OUT1 into a first output value, may convert the second output signal LPF_OUT2 into a second output value, and may differentially compare the first output value and the second output value to output a sensing value, for example.

The analog-to-digital converter ADC may sample each of the first output signal LPF_OUT1 and the second output signal LPF_OUT2 four or more times during a preset reference time (e.g., one horizontal time 1H), and may sum the sampled value to output a sensing value.

In an embodiment, the analog-to-digital converter ADC may perform sampling for each of the sensing signals corresponding to the touch driving signals TX1 to TX5 (refer to FIG. 1) at the same number of sampling times. The sampling operation of the analog-to-digital converter ADC will be described later with reference to FIGS. 8, 9A, 9B, and 10.

The analog front-end AFEn may further include a second charge amplifier CA2.

As shown in FIG. 6B, the second charge amplifier CA2 may be connected to an output terminal (or rear terminal) of the analog-to-digital converter ADC, may amplify the sensing value output from the analog-to-digital converter ADC, and may provide the amplified sensing value to the signal processing unit DSP. In this case, the signal processing unit DSP may more easily determine whether a touch has been performed using the amplified sensing value.

As described with reference to FIGS. 6A, 6B, 7A, and 7B, the analog front-end AFEn may remove noise (e.g., noise due to the horizontal synchronization signal Hsync described with reference to FIG. 3B) from the n-th sensing signal RXn and the n+1-th sensing signal RXn+1 by the charge amplifier CA, the band pass filter BPF, the mixer MX, and the low pass filter LPF. In addition, the analog front-end AFEn may be implemented as a fully differential circuit (or fully differential analog front-end) that maintains and outputs two differential signals from the charge amplifier CA to a front terminal (i.e., low pass filter LPF) of the analog-to-digital converter ADC. The analog front-end AFEn may provide two differential signals to the analog-to-digital converter ADC, thereby doubling a dynamic range of the analog-to-digital converter or a range of use of the dynamic range, and improving touch sensing sensitivity.

Figure 8:
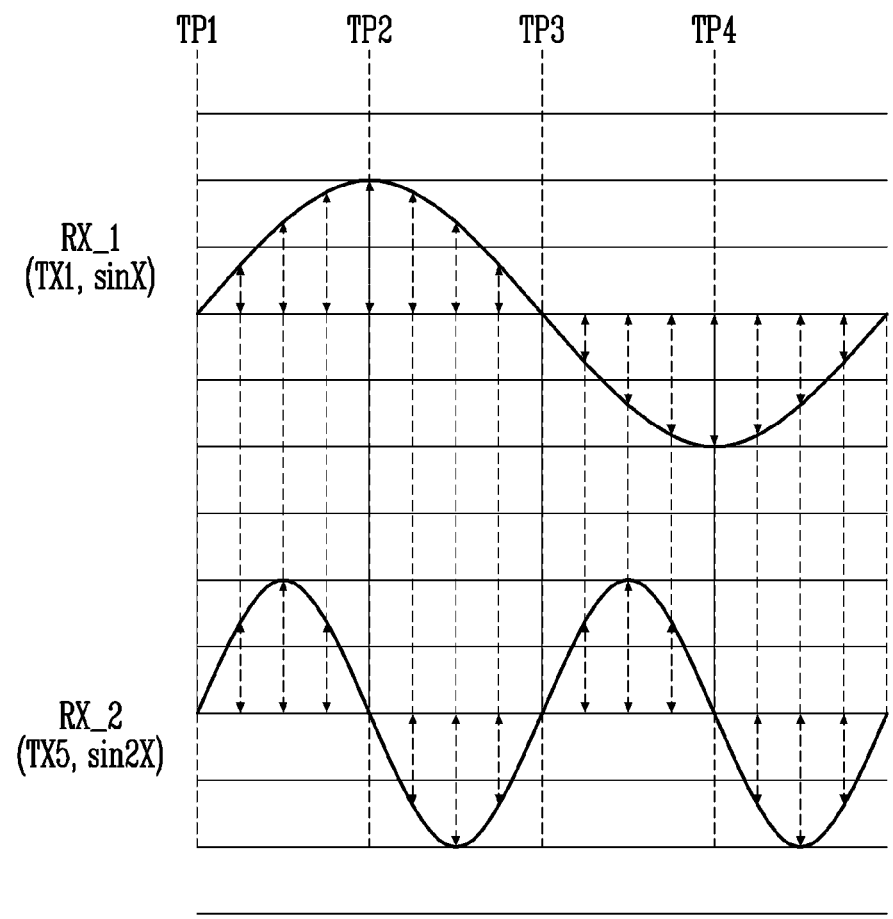
FIG. 8 is a drawing illustrating a sampling operation of an analog-to-digital converter included in the analog front end of FIG. 6A.
Figure 9B:
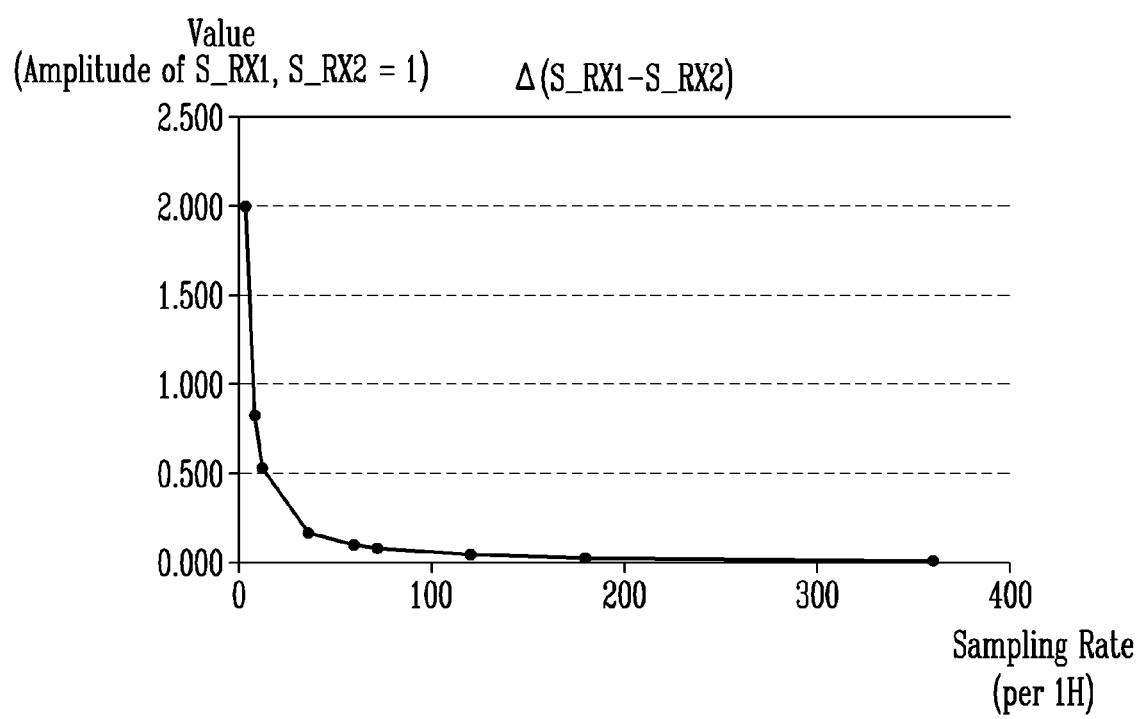

FIG. 8 is a drawing illustrating a sampling operation of an analog-to-digital converter included in the analog front end of FIG. 6A. FIGS. 9A and 9B are drawings illustrating an embodiment of sensing values based on the number of sampling times of an analog-to-digital converter included in the analog front end of FIG. 6A. FIG. 10 is a drawing illustrating another embodiment of an operation of an analog-to-digital converter included in the analog front end of FIG. 6A.

The first and second output signals LPF_OUT1 and LPF_OUT2 (e.g., waveforms and periods thereof) described with reference to FIG. 6A may be substantially the same as or similar to the sensing signals RXn and RXn+1 from which noise is removed. In addition, a signal (or name thereof) provided to the analog-to-digital converter ADC may change according to a configuration (e.g., configuration for removing noise) inside the analog front-end AFEn. Therefore, for convenience of description, the sampling operation of the analog-to-digital converter ADC will be described based on the sensing signal applied to the analog front-end AFEn.

First, referring to FIGS. 1, 6A, and 8, the first sensing signal RX_1 may correspond to the first touch driving signal TX1 provided to the first driving electrode IE1-1. In an embodiment, the first sensing signal RX_1 may be a sensing signal provided to the analog front-end AFEn through the first sensing electrode IE2-1 in response to the first touch driving signal TX1, for example. Since the first sensing signal RX_1 has a relatively small frequency corresponding to a first frequency FREQ1 of the first touch driving signal TX1, for convenience of description, the first sensing signal RX_1 may be represented as sin X.

The second sensing signal RX_2 may correspond to the fifth touch driving signal TX5 provided to the fifth driving electrode IE1-5. In an embodiment, the second sensing signal RX_2 may be a sensing signal provided to the analog front-end AFEn through the first sensing electrode IE2-1 in response to the fifth touch driving signal TX5, for example. Since the second sensing signal RX_2 has a relatively high frequency corresponding to a fifth frequency FREQ5 of the fifth touch driving signal TX5, for convenience of description, the second sensing signal RX_2 may be represented as sin 2X.

In an embodiment, the analog-to-digital converter ADC (or analog front-end AFEn) may sample the first sensing signal RX_1 and the second sensing signal RX_2 at the same number of sampling times.

In an embodiment, the analog-to-digital converter ADC may sample the first sensing signal RX_1 and the second sensing signal RX_2 at N times (here N is an integer greater than 4) during a reference time (e.g., 1H, or one period of the first touch driving signal TX1). As shown in FIG. 9A, when the number of sampling times is 4 or less, the sampled value may be zero, and in this case, a touch input may not be sensed.

As shown in FIG. 8, the analog-to-digital converter ADC may sample the first sensing signal RX_1 at 16 times and the second sensing signal RX_2 at 16 times during one period of the first touch driving signal TX1.

In an embodiment, the analog-to-digital converter ADC may output a sensing value by summing sampled values during the reference time. In this case, the first sensing value S_RX1 (refer to FIG. 9A) for the first sensing signal RX_1 may be different from the second sensing value S_RX2 (refer to FIG. 9A) for the second sensing signal RX_2. In an embodiment, the first sensing value S_RX1 may be greater than the second sensing value S_RX2, for example.

Referring to FIG. 9A, when the number of sampling times is 4, a difference Δ between the first sensing value S_RX1 and the second sensing value S_RX2 may be 2. In an embodiment, the analog-to-digital converter ADC may sample values of 0, 1, 0, and 1 at points TP1, TP2, TP3, TP4 (refer to FIG. 8) where phases of the first sensing signal RX_1 are 0, 90, 180, 270, respectively, and may output a first sensing value S_RX1 having a value of 2 by summing the sampled values, for example. Similarly, the analog-to-digital converter ADC may sample values of 0, 0, 0, and 0 at points TP1, TP2, TP3, TP4 (refer to FIG. 8) where phases of the second sensing signal RX_2 are 0, 180, 360 (or 0), 540 (or 180), respectively, and may output a second sensing value S_RX2 having a value of 0 by summing the sampled values. Accordingly, when the number of sampling times is 4, the difference Δ between the first sensing value S_RX1 and the second sensing value S_RX2 may be 2.

Similarly, when the number of sampling times is 8, the difference Δ between the first sensing value S_RX1 and the second sensing value S_RX2 may be 0.828 (i.e., 4.828-4), and may be smaller than the difference Δ when the number of sampling times is 4. When the number of sampling times is 12, 36, 60, 72, 120, 180, and 360, the difference Δ between the first sensing value S_RX1 and the second sensing value S_RX2 is as shown in FIG. 9A. Therefore, description thereof will be omitted.

As shown in FIGS. 9A and 9B, as the number of sampling times increases, the difference Δ between the first sensing value S_RX1 and the second sensing value S_RX2 decreases, but the first sensing value S_RX1 may be always greater than the second sensing value S_RX2.

As described above with reference to FIGS. 2A and 2B, attenuation of the first touch driving signal TX1 (and the first sensing signal RX_1 corresponding thereto) may be greater than attenuation of the fifth touch driving signal TX5 (and the second sensing signal RX_2 corresponding thereto). In order to compensate for an attenuation difference between the attenuation of the first touch driving signal TX1 and the attenuation of the fifth touch driving signal TX5, the difference Δ between the first sensing value S_RX1 and the second sensing value S_RX2 may be used. In other words, in order to compensate for the relatively great attenuation of the first touch driving signal TX1, it may be considered to use the first sensing value S_RX1 that is greater than the second sensing value S_RX2 by an attenuation value (or attenuation ratio) that the first touch driving signal TX1 is attenuated instead of adding a separate configuration, and the first sensing value S_RX1 may be set to be greater than the second sensing value S_RX2 by the attenuation value by adjusting the number of sampling times. That is, even when the first touch driving signal TX1 is relatively further attenuated, the first sensing value S_RX1 is relatively great at a predetermined number of sampling times corresponding thereto. Accordingly, the attenuation difference between the attenuation of the first touch driving signal TX1 and the attenuation of the fifth touch driving signal TX5 may be automatically compensated by the difference Δ between the first sensing value S_RX1 and the second sensing value S_RX2.

To this end, the number of sampling times of the analog-to-digital converter ADC may be determined based on the attenuation difference between the attenuation of the first touch driving signal TX1 and the attenuation of the fifth touch driving signal TX5. Since the attenuation difference is substantially proportional to the location (i.e., distance spaced apart from the input sensing circuit IS-C, or resistance value corresponding thereto) of the first driving electrode IE1-1 to which the first touch driving signal TX1 is applied, the number of sampling times of the analog-to-digital converter ADC may be determined based on the location of the first driving electrode IE1-1. In an embodiment, as an area of the input sensing panel ISP (refer to FIG. 1) becomes larger, the location of the first driving electrode IE1-1 may be farther from the input sensing circuit IS-C, and the number of sampling times of the analog-to-digital converter ADC may be set to be relatively small, for example. That is, the number of sampling times of the analog-to-digital converter ADC may be set in inverse proportion to an area of the input sensing panel ISP.

In an embodiment, the attenuation difference between the attenuation of the first touch driving signal TX1 and the attenuation of the fifth touch driving signal TX5 may be assumed to be 0.2, for example. In order to set the number of sampling times of the analog-to-digital converter ADC, the analog-to-digital converter ADC may perform sampling operation with 60 sampling times at first. The difference Δ between the first sensing value S_RX1 and the second sensing value S_RX2 corresponding to the 60 sampling times may be smaller than the attenuation difference. In this case, the analog-to-digital converter ADC may reduce the number of sampling times, and may again perform the sampling operation with, for example, 36 sampling times. The difference Δ between the first sensing value S_RX1 and the second sensing value S_RX2 corresponding to the 36 sampling times may be similar to the attenuation difference. In this case, the number of sampling times of the analog-to-digital converter ADC may be set to 36 times. In this way, depending on the size (e.g., large, medium, small) of the input sensing panel ISP, the number of sampling times of the analog-to-digital converter ADC may be set to 36, 60, and 72 times, respectively.

In an embodiment, the analog-to-digital converter ADC may perform the sampling operation only in a section in which the first sensing signal RX_1 has a predetermined phase.

Referring to FIG. 10, the analog-to-digital converter ADC may perform the sampling operation only in sub-sections P_S1, P_S2, P_S3, and P_S4. In an embodiment, each of the first sub-section P_S1 and the third sub-section P_S3 may be a section in which a phase of the first sensing signal RX_1 is 60 degrees to 120 degrees, for example. In the first sub-section P_S1 and the third sub-section P_S3, the first sensing signal RX_1 may have a positive maximum value (or maximum level). The second sub-section P_S2 and the fourth sub-section P_S4 may be a section in which a phase of the first sensing signal RX_1 is 240 degrees to 300 degrees. In the second sub-section P_S2 and the fourth sub-section P_S4, the first sensing signal RX_1 may have a negative maximum value.

In this case, the number of sampling times for the first sensing signal RX_1 may decrease from 16 times to 6 times based on one period of the first sensing signal RX_1.

In the first sub-section P_S1, the second sub-section P_S2, the third sub-section P_S3, and the fourth sub-section P_S4, the phase of the second sensing signal RX_2 may be 120 degrees to 240 degrees. In the first sub-section P_S1, the second sub-section P_S2, the third sub-section P_S3, and the fourth sub-section P_S4, the second sensing signal RX_2 may not have a positive or negative maximum value, and may have a value of zero.

In this case, at the same sampling frequency, the difference Δ between the first sensing value S_RX1 and the second sensing value S_RX2 may be greater.

That is, the analog-to-digital converter ADC may reduce the number of sampling times by performing the sampling operation only in some section among the entire sampling section while maintaining the sampling frequency.

For reference, it may be a power loss for the analog-to-digital converter ADC to perform the sampling operation in the entire sampling section (e.g., to sample a value of zero). Therefore, by performing the sampling operation only in some section among the entire sampling section, the analog-to-digital converter ADC may reduce power consumption while maintaining the difference Δ between the first sensing value S_RX1 and the second sensing value S_RX2.

As described with reference to FIGS. 8, 9A, 9B, and 10, an analog-to-digital converter ADC (or analog front-end AFEn) may sample the first sensing signal RX_1 and the second sensing signal RX_2 at the same number of sampling times, respectively, and may sum the sampled values to output the first sensing value S_RX1 and the second sensing value S_RX2. The difference between the attenuation of the first touch driving signal TX1 (and the first sensing signal RX_1 corresponding thereto) and the attenuation of the fifth touch driving signal TX5 (and the second sensing signal RX_2 corresponding thereto) may be compensated by the difference Δ between the first sensing value S_RX1 and the second sensing value S_RX2. Accordingly, the touch sensing sensitivity may be uniform over the entire sensing area SA of the input sensing panel ISP.

In addition, by performing the sampling operation only in some section among the entire sampling section, the analog-to-digital converter ADC may reduce power consumption while maintaining the difference Δ between the first sensing value S_RX1 and the second sensing value S_RX2.

Figure 11:
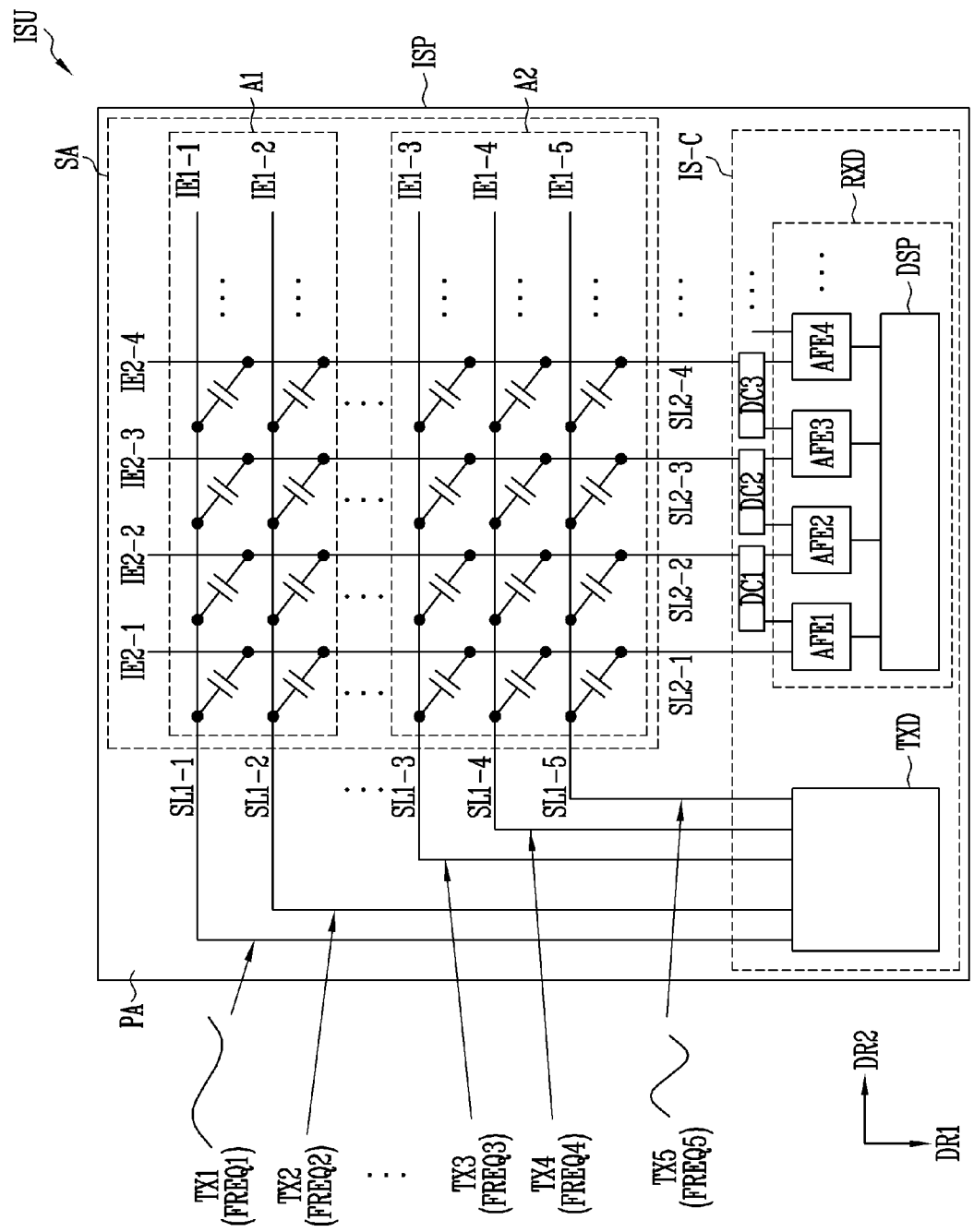
FIG. 11 is a drawing illustrating another embodiment of an input sensing device.

FIG. 11 is a drawing illustrating another embodiment of an input sensing device.

Referring to FIGS. 1 and 11, the input sensing device ISU may further include distribution circuits DC1, DC2, and DC3.

The distribution circuits DC1, DC2, and DC3 may be disposed between at least some of the sensing electrodes IE2-1 to IE2-4 and the analog front-ends AFE1 to AFE4, may generate a plurality of signals having the same size (e.g., the same voltage level, or the same current amount) based on each of sensing signals provided from at least some of the sensing electrodes IE2-1 to IE2-4, and may distribute the generated signals to the analog front-ends AFE1 to AFE4. In an embodiment, the distribution circuits DC1, DC2, and DC3 may include an amplifier, a buffer, and the like, and may amplify or mirror each of the sensing signals and output them, for example.

In an embodiment, the first distribution circuit DC1 may receive a second sensing signal provided from the second sensing electrode IE2-2, and may provide signals that is the same or has the same size as the second sensing signal to each of the first analog front-end AFE1 and the second analog front-end AFE2, for example. For reference, when the second sensing signal does not pass through the first distribution circuit DC1, the second sensing signal may be simultaneously supplied to the first analog front-end AFE1 and the second analog front-end AFE2, and a size (or maximum size, e.g., voltage level, or current amount) of the second sensing signal may be different from a size of the first sensing signal (i.e., sensing signal provided from the first sensing electrode IE2-1) due to a relative increase in a load for the second sensing signal. Accordingly, the input sensing device ISU may provide signals being the same or having the same size as the second sensing signal to the first analog front-end AFE1 and the second analog front-end AFE2, respectively by the first distribution circuit DC1.

Similarly, the second distribution circuit DC2 may receive the third sensing signal provided from the third sensing electrode IE2-3, and may provide signals being the same or having the same size as the third sensing signal to the second analog front-end AFE2 and the third analog front-end AFE3, respectively. The third distribution circuit DC3 may receive the fourth sensing signal provided from the fourth sensing electrode IE2-4, and may provide signals being the same or having the same size as the fourth sensing signal to the third analog front-end AFE3 and the fourth analog front-end AFE4, respectively.

Figure 12:
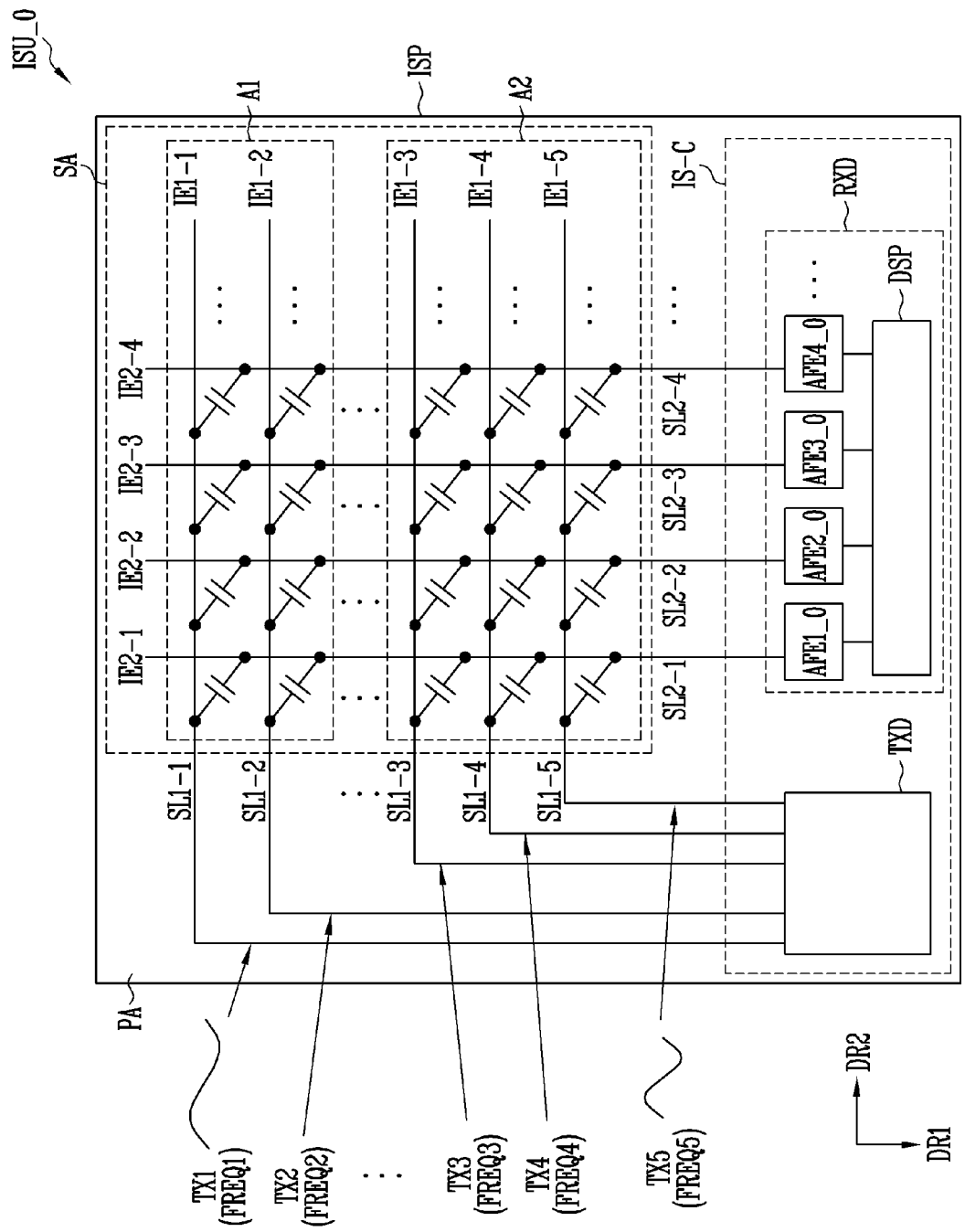
FIG. 12 is a diagram illustrating another embodiment of an input sensing device.
Figure 13:
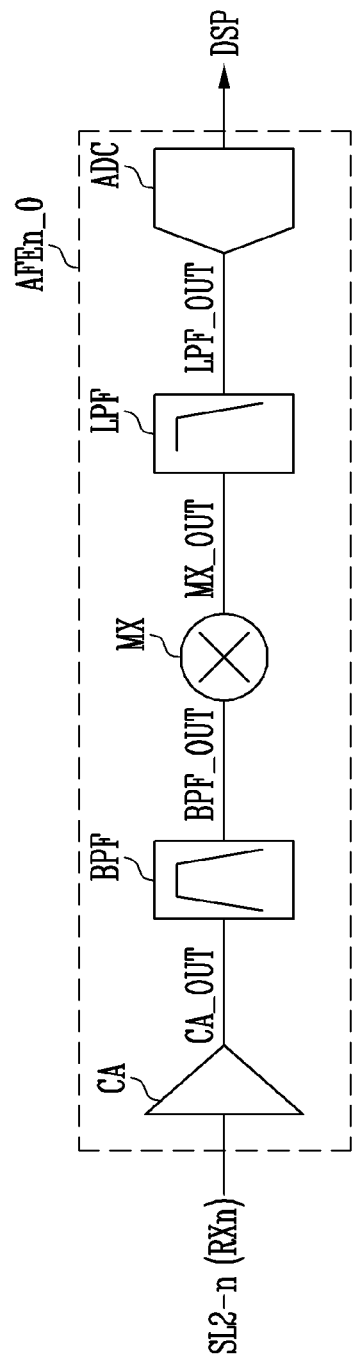
FIG. 13 is a block diagram illustrating an embodiment of an analog front end included in the input sensing device of FIG. 12.

FIG. 12 is a drawing illustrating an input sensing device. FIG. 13 is a block diagram illustrating an embodiment of an analog front end included in the input sensing device of FIG. 12.

Referring to FIGS. 1 and 12, except for the analog front-ends AFE1_0 to AFE4_0, the input sensing device ISU_0 may be substantially the same as or similar to the input sensing device ISU of FIG. 1. Therefore, duplicate descriptions will be omitted.

The analog front-ends AFE1_0 to AFE4_0 may be connected to the sensing electrodes IE2-1 to IE2-4 through the sensing lines SL2-1 to SL2-4, respectively, and may output sensing values corresponding to the sensing signals provided from the sensing electrodes IE2-1 to IE2-4. In an embodiment, the first analog front-end AFE1_0 may be connected to the first sensing electrode IE2-1, and may output a first sensing value corresponding to sensing capacitance generated on the first sensing electrode IE2-1, for example. Similarly, the second analog front-end AFE2_0 may be connected to the second sensing electrode IE2-2, and may output a second sensing value corresponding to sensing capacitance generated on the second sensing electrode IE2-2.

Since the analog front-ends AFE1_0 to AFE4_0 are the same as each other, the analog front-ends AFEn_0 will be described as representative of the analog front-ends AFE1_0 to AFE4_0.

In an embodiment, the analog front-end AFEn_0 may be implemented as a single analog front-end, and may include at least one of a charge amplifier CA (or first charge amplifier), a band pass filter BPF, a mixer MX, a low pass filter LPF, and an analog-to-digital converter ADC. Since basic functions of the charge amplifier CA, the band pass filter BPF, the mixer MX, the low pass filter LPF, and the analog-to-digital converter ADC are similar to functions of the charge amplifier CA, the band pass filter BPF, the mixer MX, the low pass filter LPF, and the analog-to-digital converter ADC described with reference to FIG. 6A, respectively, except for a differential function, duplicate descriptions will be omitted.

The charge amplifier CA may receive the first sensing signal corresponding to the sensing capacitance of the n-th sensing electrode IE2-*n* through the n-th sensing line SL2-*n*, and may amplify the first sensing signal to output amplified sensing signal CA_OUT.

The band pass filter BPF may select only a signal of a predetermined frequency band of the amplified sensing signal CA_OUT, and may output the filtered signal BPF_OUT.

The mixer MX may change the frequency of the filtered signal BPF_OUT to output the demodulated signal MX_OUT.

The low pass filter LPF may filter noise distributed in a high frequency band of the demodulated signal MX_OUT, and may output an output signal LPF_OUT.

The analog-to-digital converter ADC may convert the analog-type output signal LPF_OUT into a digital-type sensing value and provide the sensing value to the signal processing unit DSP.

As described with reference to FIGS. 12 and 13, the analog-to-digital converter ADC may be configured with a single analog front-end instead of the fully differential analog front-end.

Figure 14:
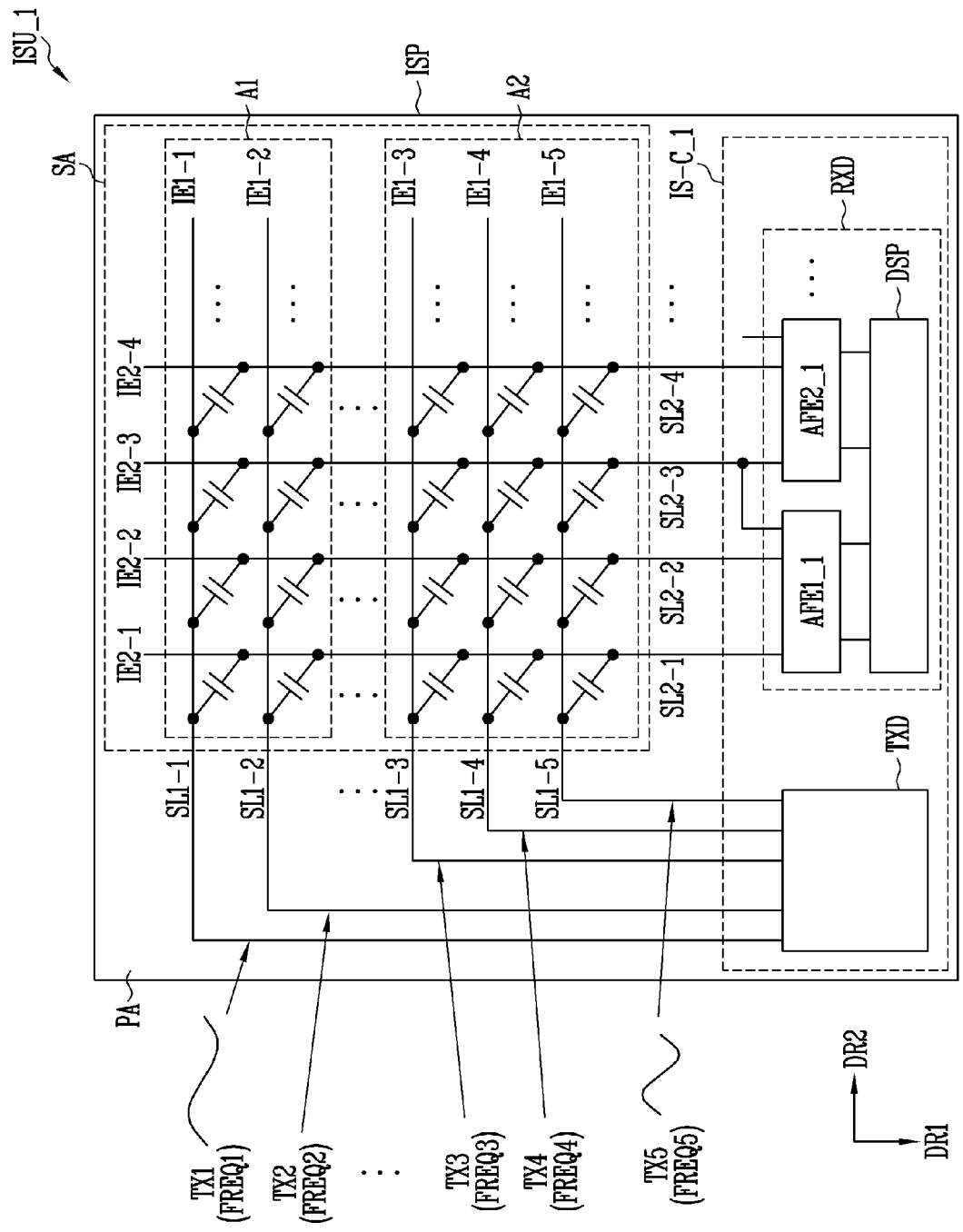
FIG. 14 is a drawing illustrating an input sensing device.

FIG. 14 is a drawing illustrating an input sensing device.

Referring to FIGS. 1 and 14, the input sensing circuit IS-C_1 is different from the input sensing circuit IS-C of FIG. 1 in that the input sensing circuit IS-C_1 includes the analog front-ends AFE1_1 and AFE2_1. Since the input sensing device ISU_1 is substantially the same as or similar to the input sensing device ISU of FIG. 1 except for the analog front-ends AFE1_1 and AFE2_1, duplicate descriptions will be omitted.

Each of the analog front-ends AFE1_1 and AFE2_1 may be connected to three sensing electrodes (or second signal lines) adjacent to each other among the sensing electrodes IE2-1 to IE2-4, may select two sensing electrodes of the three sensing electrodes, and may output a sensing value corresponding to a difference between sensing capacitances corresponding to the selected two sensing electrodes. In an embodiment, the first analog front-end AFE1_1 may be connected to the first sensing electrode IE2-1, the second sensing electrode IE2-2, and the third sensing electrode IE2-3, may output a first sensing value corresponding to a difference between the sensing capacitance generated on the first sensing electrode IE2-1 and the sensing capacitance generated on the second sensing electrode IE2-2 in the first section, and may output a second sensing value corresponding to a difference between the sensing capacitance generated on the second sensing electrode IE2-2 and the sensing capacitance generated on the third sensing electrode IE2-3 in the second section (i.e., second section different from the first section), for example.

Similarly, the second analog front-end AFE2_1 may be connected to the third sensing electrode IE2-3, the fourth sensing electrode IE2-4, and the fifth sensing electrode (not shown), may output a third sensing value corresponding to a difference between the sensing capacitance generated on the third sensing electrode IE2-3 and the sensing capacitance generated on the fourth sensing electrode IE2-4 in the first section, and may output a fourth sensing value corresponding to a difference between the sensing capacitance generated on the fourth sensing electrode IE2-4 and the sensing capacitance generated on the fifth sensing electrode (not shown).

That is, the analog front-ends AFE1_1 and AFE2_1 may be connected to the three sensing electrodes, and may sequentially output the sensing values through time division driving. Compared with the input sensing device ISU of FIG. 1, the number of analog front-ends AFE1_1 and AFE2_1 may decrease.

Figure 15:
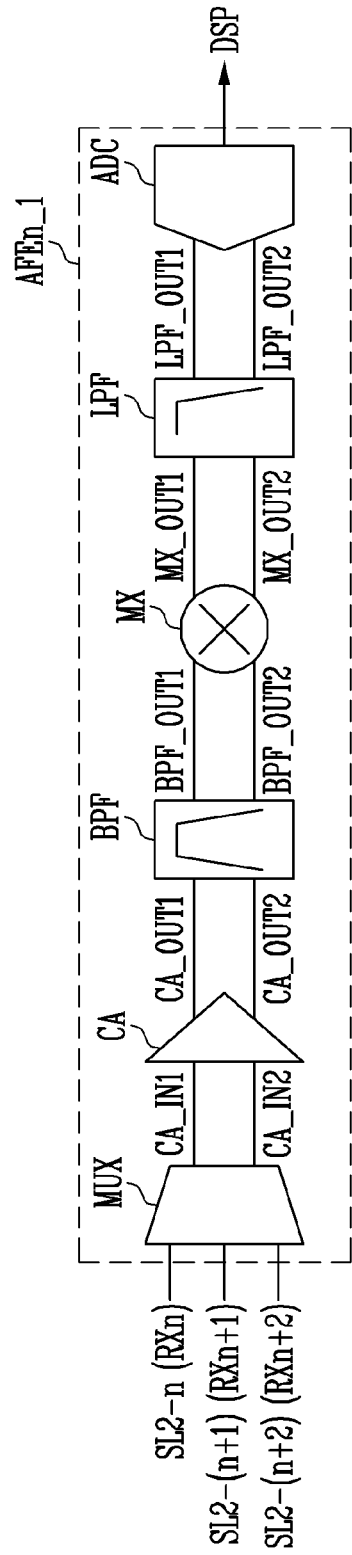
FIG. 15 is a block diagram illustrating an embodiment of an analog front end included in the input sensing device of FIG. 14.

FIG. 15 is a block diagram illustrating an embodiment of an analog front end included in the input sensing device of FIG. 14.

Referring to FIGS. 14 and 15, since the analog front-ends AFE1_1 and AFE2_1 are the same as each other, the analog front-end AFEn_1 will be described as representative of the analog front-ends AFE1_1 and AFE2_1.

The analog front-end AFEn_1 is different from the analog front-end AFEn of FIG. 6A in that the analog front-end AFEn_1 further includes a multiplexer MUX. Since the analog front-end AFEn_1 is substantially the same as or similar to the analog front-end AFEn of FIG. 6A except for the multiplexer MUX, duplicate descriptions will be omitted.

The multiplexer MUX may receive the n-th sensing signal RXn provided through the n-th sensing signal line SL2-*n*, the n+1-th sensing signal RXn+1 provided through the n+1-th sensing signal line SL2-(*n*+1), and the n+2-th sensing signal RXn+2 provided through the n+2-th sensing signal line SL2-(*n*+2), and may select and output two sensing signals among the n-th sensing signal RXn, the n+1-th sensing signal RXn+1, and the n+2-th sensing signal RXn+2. Two sensing signals among the nth sensing signal RXn, the n+1-th sensing signal RXn+1, and the n+2-th sensing signal RXn+2 may be provided to the charge amplifier CA as input signals CA_IN1 and CA_IN2. In an embodiment, the multiplexer MUX may be implemented as a multiplexer having an input/output ratio of 3:2, for example.

FIG. 16 illustrates the operation of the multiplexer MUX.

FIG. 16 is a drawing illustrating an operation of a multiplexer included in the analog front end of FIG. 15. FIG. 16 illustrates a first multiplexer MUX1 and a second multiplexer MUX2 respectively included in the analog front-ends AFE1_1 and AFE2_1 shown in FIG. 14.

In the first case CASE1 (or in the first section), a first selection signal SEL1 may be provided to the first multiplexer MUX1 and the second multiplexer MUX2. The first selection signal SEL1 may be provided from the external (e.g., signal processing unit DSP and driving signal generator TXD).

The first multiplexer MUX1 may connect the first sensing signal line SL2-1 and the second sensing signal line SL2-2 to the first channel CH1 and the second channel CH2, respectively, in response to the first selection signal SELL Here, the first channel CH1 and the second channel CH2 may respectively correspond to or be connected to the input terminals of the charge amplifier CA (refer to FIG. 15). Accordingly, the first sensing signal RX1 may be provided to the first channel CH1 through the first sensing signal line SL2-1, and the second sensing signal RX2 may be provided to the second channel CH2 through the second sensing signal line SL2-2. In this case, the first analog front-end AFE1_1 (refer to FIG. 14) including the first multiplexer MUX1 may output a first sensing value corresponding to the difference between the first sensing signal RX1 and the second sensing signal RX2.

Similarly, the second multiplexer MUX2 may connect the third sensing signal line SL2-3 and the fourth sensing signal line SL2-4 to the third channel CH3 and the four channel CH4 in response to the first selection signal SEL1, respectively. Here, the third channel CH3 and the fourth channel CH4 may respectively correspond to or be connected to the input terminals of the charge amplifier CA (refer to FIG. 15). Accordingly, the third sensing signal RX3 may be provided to the third channel CH3 through the third sensing signal line SL2-3, and the fourth sensing signal RX4 may be provided to the fourth channel CH4 through the fourth sensing signal line SL2-4. In this case, the second analog front-end AFE2_1 (refer to FIG. 14) including the second multiplexer MUX2 may output a third sensing value corresponding to the difference between the third sensing signal RX3 and the fourth sensing signal RX4.

That is, in the first case CASE1 (or in the first section), the analog front-ends AFE1_1 and AFE2_1 may output odd-numbered sensing values.

In the second case CASE2 (or in the second section), the second selection signal SEL2 may be provided to the first multiplexer MUX1 and the second multiplexer MUX2.

The first multiplexer MUX1 may connect the second sensing signal line SL2-2 and the third sensing signal line SL2-3 to the first channel CH1 and the second channel CH2, respectively, in response to the second selection signal SEL2. Accordingly, the second sensing signal RX2 may be provided to the first channel CH1 through the second sensing signal line SL2-2, and the third sensing signal RX3 may be provided to the second channel CH2 through the third sensing signal line SL2-3. In this case, the first analog front-end AFE1_1 including the first multiplexer MUX1 may output a second sensing value corresponding to the difference between the second sensing signal RX2 and the third sensing signal RX3.

Similarly, the second multiplexer MUX2 may connect the fourth sensing signal line SL2-4 and the fifth sensing signal line SL2-5 to the third channel CH3 and the third channel CH4, respectively, in response to the second selection signal SEL2. Accordingly, the fourth sensing signal RX4 may be provided to the third channel CH3 through the fourth sensing signal line SL2-4, and the fifth sensing signal RX5 may be provided to the fourth channel CH4 through the fifth sensing signal line SL2-5. In this case, the second analog front-end AFE2_1 including the second multiplexer MUX2 may output a fourth sensing value corresponding to a difference between the fourth sensing signal RX4 and the fifth sensing signal RX5.

That is, in the second case CASE2 (or in the second section), the analog front-ends AFE1_1 and AFE2_1 may output even-numbered sensing values.

As described with reference to FIGS. 15 and 16, the analog front-end AFEn_1 may include a multiplexer MUX having an input/output ratio of 3:2, and may output sensing values through time division driving. Accordingly, the number of the analog front-ends AFE1_1 and AFE2_1 in the input sensing circuit IS-C_1 (refer to FIG. 14) may decrease, and the input sensing circuit IS-C_1 may be more easily integrated.

Figure 17A:
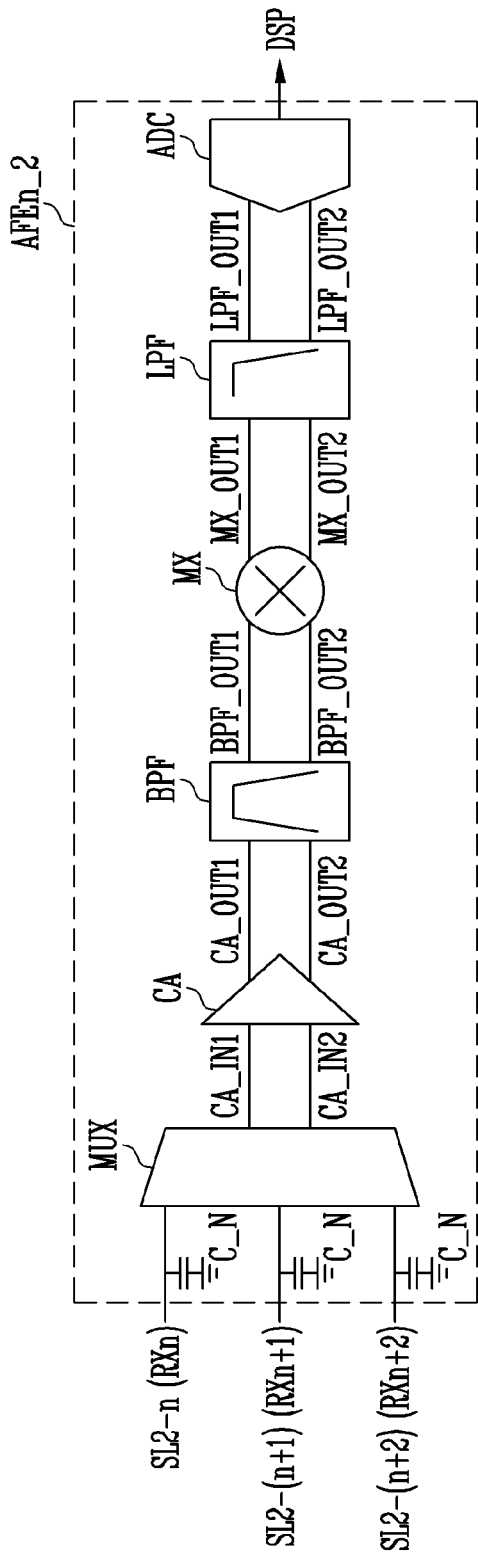
FIG. 17A is a block diagram illustrating another embodiment of an analog front end included in the input sensing circuit of FIG. 14.

FIG. 17A is a block diagram illustrating another embodiment of an analog front end included in the input sensing circuit of FIG. 14.

Referring to FIGS. 14, 15, and 17A, the analog front-end AFEn_2 is different from the analog front-end AFEn_1 of FIG. 15 in that it further includes a negative capacitor C_N. Since the analog front-end AFEn_2 is substantially the same as or similar to the analog front-end AFEn_1 of FIG. 15 except for the negative capacitor C_N, duplicate descriptions will be omitted.

The negative capacitor C_N (or negative capacitor circuit, or parasitic capacitance compensation circuit) may be connected to each of the input terminals of the multiplexer MUX, or may be provided on each of the sensing signal lines.

In an embodiment, the negative capacitor C_N may be connected to the first input terminal of the multiplexer MUX or the n-th sensing signal line SL2-$n$, for example. In addition, the negative capacitor C_N may be connected to each of the second input terminal (or n+1-th sensing signal line SL2-$(n+1)$) of the multiplexer MUX and the third input terminal (or n+2-th sensing signal lines SL2-$(n+2)$) of the multiplexer MUX.

For reference, as will be described later with reference to FIG. 22, as a thickness of a thin film encapsulation layer in the display panel decreases, a distance between the driving electrode and sensing electrode in the input sensing device ISU and a light emitting element and a common electrode in the display panel may be narrowed, and the parasitic capacitance generated therebetween may increase. In addition, as an area of the display device becomes larger, an overlapping area between the driving and sensing electrodes in the input sensing device ISU and the common electrode of the light emitting device may increase, and the parasitic capacitance may increase. The parasitic capacitance may cause a delay in response to the touch driving signal and the sensing signal, and may reduce touch sensing sensitivity.

The negative capacitor C_N may be implemented as a negative capacitor field effect transistor ("FET"), and may be discharged when a voltage of a line corresponding thereto increases and be charged when a voltage of a line corresponding thereto decreases. Therefore, the negative capacitor C_N may offset the parasitic capacitance.

As described with reference to FIG. 17A, the analog front-end AFEn_2 may reduce parasitic capacitance for sensing electrodes in the input sensing device ISU by the negative capacitor C_N. Accordingly, touch sensing sensitivity may be improved.

Figure 17B:
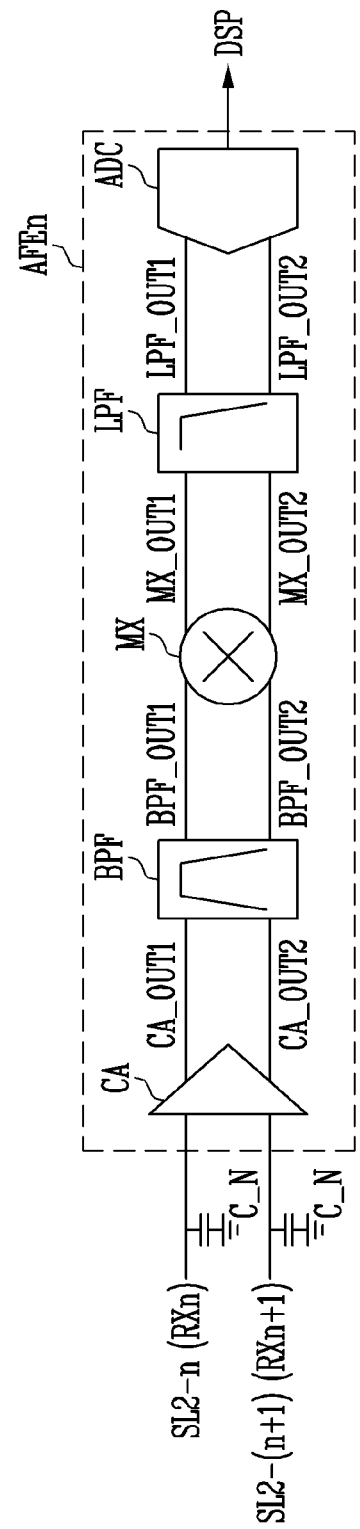
FIG. 17B is a block diagram illustrating another embodiment of an analog front end included in the input sensing circuit of FIG. 1.

In FIG. 17A, the analog front-end AFEn_2 is illustrated as including the multiplexer MUX, but is not limited thereto. FIG. 17B is a block diagram illustrating another embodiment of an analog front end included in the input sensing circuit IS-C of FIG. 1. As shown in FIG. 17B, the negative capacitor C_N may be applied to the analog front-end AFEn described with reference to FIG. 6A. In addition, the negative capacitor C_N may be applied to the analog front-end AFEn described with reference to FIG. 6B and the analog front-end AFEn_0 described with reference to FIG. 13.

Figure 18:
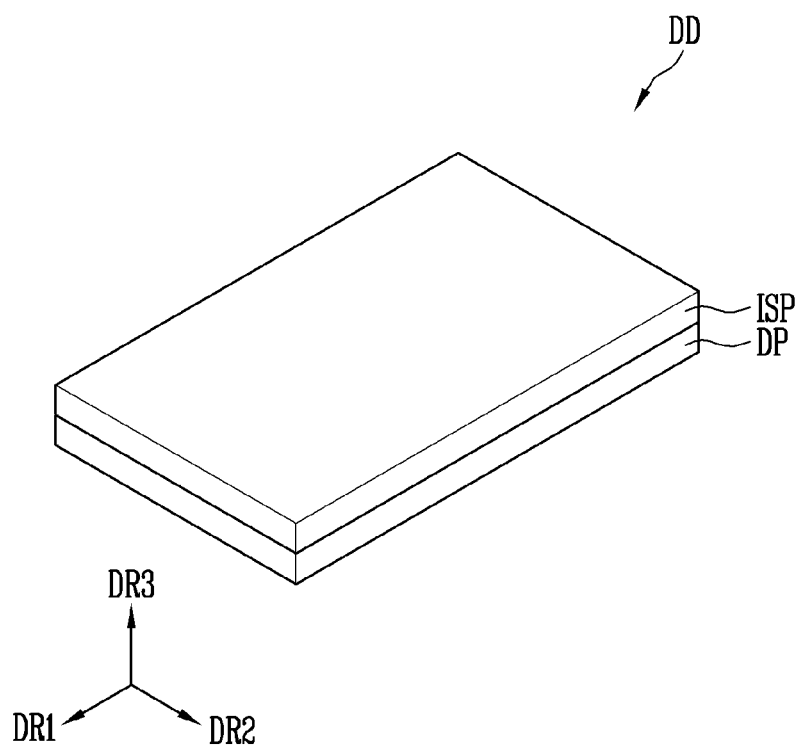
FIG. 18 is a perspective view illustrating an embodiment of a display device.

FIG. 18 is a perspective view illustrating an embodiment of a display device.

Referring to FIG. 18, the display device DD may be provided in various shapes, and for example, may be provided in a quadrangular (e.g., rectangular) plate shape having two pairs of sides parallel to each other. When the display device DD is provided in a plate of a quadrangular (e.g., rectangular) shape, one pair of sides of the two pairs of sides may be provided longer than the other pair of sides.

The display device DD may display an image through a display surface. The display surface may be parallel to a surface defined by a first direction axis corresponding to the first direction DR1 and a second direction axis corresponding to the second direction DR2. A normal direction of the display surface, that is, a thickness direction of the display device DD, is defined as the third direction DR3.

A front surface (or upper surface) and a rear surface (or lower surface) of each member, layer, or unit described below may be divided along the third direction DR3. However, the first, second, and third directions DR1, DR2, and DR3 may be only examples, may be relative concepts, and may be changed to different directions.

The display device DD may have a flat display surface. However, the display surface is not limited thereto, and for example, the display device DD may include various types of display surfaces capable of displaying an image, such as a curved display surface or a three-dimensional ("3D") display surface. When the display device DD has the 3D display surface, the 3D display surface may, for example, include a plurality of display areas facing different directions. The 3D display surface may be implemented as a polygonal columnar display surface.

The display device DD may be a flexible display device. In an embodiment, the display device DD may be applied to a foldable display device, a bendable display device, a rollerable display device, and the like, for example. The invention is not limited thereto, but may be a rigid display device.

The display device DD may be not only applied to a large electronic device such as a television, a monitor, and an electric signboard, but also a small electronic device such as a mobile phone, a tablet, a navigation device, a game device, and a smart watch. In addition, the display device DD may be applied to a wearable electronic device such as a head-mount display.

The display device DD may include a display panel DP and an input sensing panel ISP (or input sensing device ISU (refer to FIG. 1), input sensing layer).

The display panel DP and the input sensing panel ISP may be provided by a continuous process. However, the display panel DP and the input sensing panel ISP are not limited thereto, and for example, the display panel DP and the input sensing panel ISP may be coupled to each other through an adhesive member. The adhesive member may include a conventional adhesive or pressure-sensitive adhesive. In an embodiment, the adhesive member may be an optically transparent adhesive member, for example.

Configurations formed through a continuous process with other configurations are represented as "layers", and configurations coupled with other configurations through an adhesive member are represented as "panel". The panel may include a base layer providing a base surface, for example a synthetic resin film, a composite material film, a glass substrate, etc., but "layer" may not include the base layer. In other words, the input sensing panel ISP represented as a "layer" may be disposed on a base surface provided by the display panel DP.

The input sensing panel ISP may sense a contact on or input to the display surface of the display device DD by an external medium such as a hand or a pen.

The display panel DP may be a display panel of an emission type. In an embodiment, the display panel DP may be an organic light emitting display panel or a quantum dot light emitting display panel, for example.

In an embodiment, the display device DD may further include an anti-reflective panel and a window panel.

The anti-reflective panel may be disposed on the input sensing panel ISP, and may reduce reflectance of external light incident on the display surface of the display device DD from the outside. In an embodiment, the anti-reflective panel may include color filters, for example. The color filters may have a predetermined arrangement. The arrangement of color filters may be determined considering the light emitting colors of the pixels included in the display panel DP.

The window panel may be disposed on the input sensing panel ISP, and may protect the display panel DP and the input sensing panel ISP from the external (e.g., external impact). The window panel may include a synthetic resin film and/or a glass substrate. The window panel may include two or more films coupled by an adhesive member.

Figure 19:
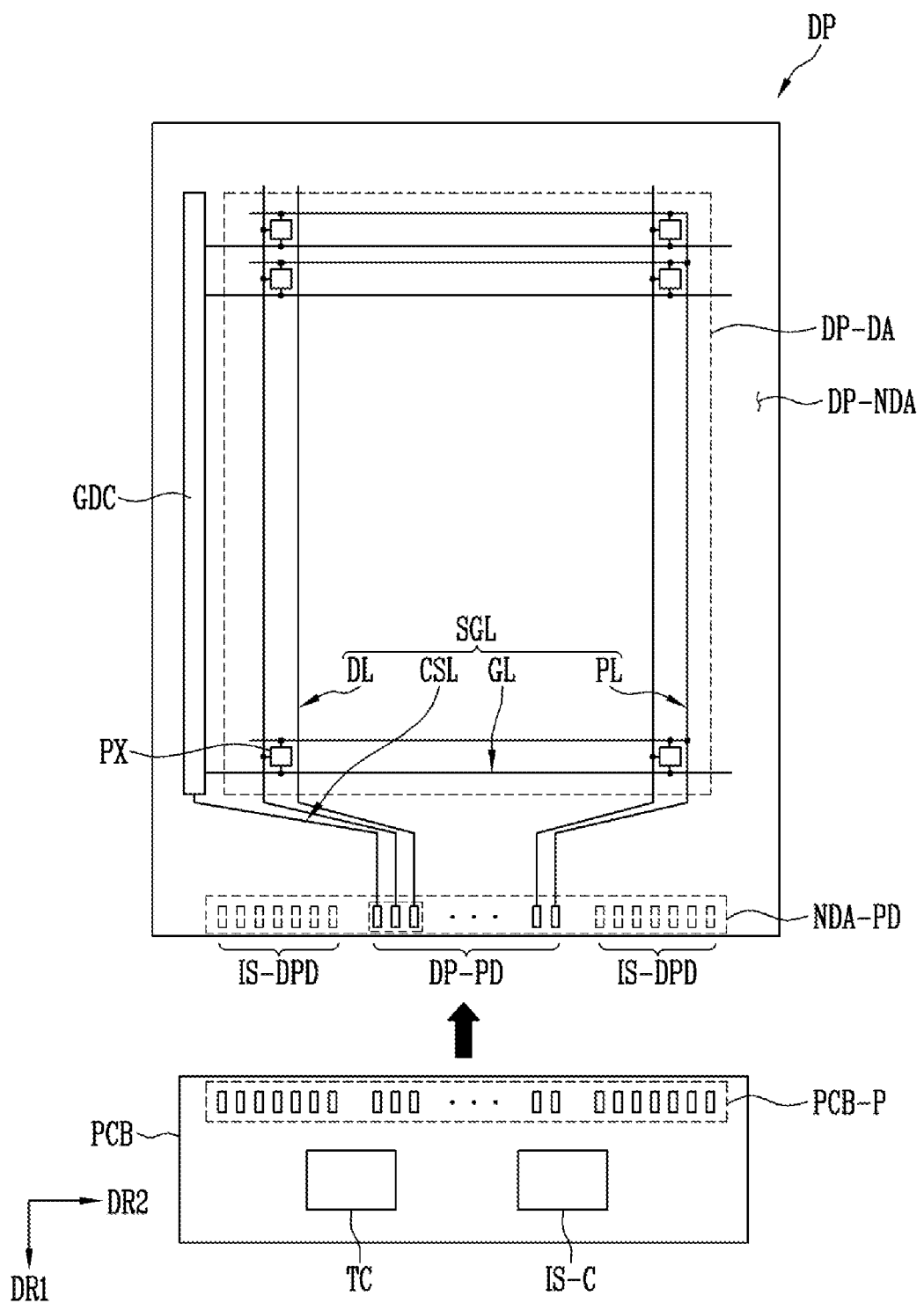
FIG. 19 is a plan view illustrating an embodiment of a display panel included in the display device of FIG. 18.

FIG. 19 is a plan view illustrating an embodiment of a display panel included in the display device of FIG. 18.

Referring to FIGS. 18 and 19, the display panel DP may include a display area DP-DA in which an image is displayed and a non-display area DP-NDA adjacent to the display area DP-DA. The non-display area DP-NDA is an area in which an image is not displayed. The non-display area DP-NDA may be disposed outside the display area DP-DA.

The display area DP-DA may include pixel areas in which pixels PX are provided. A pad area NDA-PD in which pads of lines are provided may be provided in the non-display area DP-NDA. A data driver (not shown) for providing data signals to the pixels PX may be provided in the non-display area DP-NDA. The data driver may provide a data signal to each of the pixels PX through data lines. The data driver may be included in a timing control circuit TC, which will be described later.

The display panel DP may include a driving circuit GDC, signal lines SGL, signal pads DP-PD, and pixels PX.

The pixels PX may be disposed in the display area DP-DA. Each of the pixels PX may include a light emitting element and a pixel driving circuit connected to the light emitting element. In an embodiment, the light emitting element may include an organic light emitting diode, or an inorganic light emitting diode such as a micro light emitting diode ("LED"), or a quantum dot light emitting diode. In addition, the light emitting element may be a light emitting element including an organic material and an inorganic material in combination, for example. Further, each of the pixels PX may include a single light emitting element, or in another embodiment, each of the pixels PX may include a plurality of light emitting elements, and the plurality of light emitting elements may be connected to each other in series, parallel, or in series and parallel.

The driving circuit GDC may include a scan driving circuit. The scan driving circuit may generate scan signals, and may sequentially provide or output the scan signals to the scan lines GL. The scan driving circuit may further provide another control signal to the driving circuit of the pixels PX.

In an embodiment, the scan driving circuit may include thin film transistors provided through the same process as the driving circuit of the pixels PX, for example, a low temperature polycrystalline silicon ("LTPS") process or a low temperature polycrystalline oxide ("LTPO") process.

The signal lines SGL may include scan lines GL, data lines DL, power lines PL, and control signal lines CSL. Each of the scan lines GL may be connected to a corresponding one of the pixels PX, and each of the data lines DL may be connected to a corresponding one of the pixels PX. The power line PL may be connected to the pixels PX. The control signal line CSL may provide control signals to the scan driving circuit.

The signal lines SGL may overlap the display area DP-DA and the non-display area DP-NDA. The signal lines SGL may include a pad unit (or pad portion) and a line unit (or line portion). The line unit may overlap the display area DP-DA and the non-display area DP-NDA. The pad unit may be connected to an end of the line unit. The pad unit may be disposed in the non-display area DP-NDA, and may overlap a corresponding signal pad among the signal pads DP-PD. An area in which the signal pads DP-PD are disposed among the non-display area DP-NDA may be defined as the pad area NDA-PD.

The line unit connected to the pixels PX may constitute most of the signal lines SGL. The line unit may be connected to transistors of the pixels PX. The line unit may have a single layer/multilayer structure, and the line unit may be a single body or include two or more portions. The two or more portions may be disposed on different layers, and may be connected to each other through a contact hole passing through the insulating layer disposed between the two or more portions.

The display panel DP may further include dummy pads IS-DPD disposed in the pad area NDA-PD. Since the dummy pads IS-DPD are provided through the same process as the signal lines SGL, they may be disposed in the same layer as the signal lines SGL. The dummy pads IS-DPD may be selectively provided in the display device DD including an input sensing layer, and may be omitted in the display device DD including an input sensing panel.

FIG. 19 further illustrates a circuit board PCB electrically connected to the display panel DP. The circuit board PCB may be a flexible circuit board or a rigid circuit board. The circuit board PCB may be directly coupled to the display panel DP or may be connected to the display panel DP through another circuit board.

A timing control circuit TC for controlling an operation of the display panel DP may be disposed on the circuit board PCB. The timing control circuit TC may receive input image data and timing signals (e.g., vertical synchronization signal, horizontal synchronization signal, clock signals) from the external (e.g., host system such as an application processor), may generate a gate driving control signal for controlling the driving circuit GDC based on the timing signals, and may provide a gate driving control signal to the driving circuit GDC. Here, the vertical synchronization signal among the timing signals may define a start of one display section (or one frame) in which an image (or frame image) of one frame is displayed, or a start (or transmission start) of image data corresponding to one frame, and the horizontal synchronization signal among the timing signals may define a section in which each of horizontal line images included in an image of one frame is output (e.g., an image is output through pixels included in the same row). In addition, the timing control circuit TC may generate a data driving control signal for controlling the data driver, may provide the data driving control signal to the data driver, and may rearrange input image data to provide the data driver.

In addition, an input sensing circuit IS-C (refer to FIG. 1) may be disposed on the circuit board PCB.

Each of the timing control circuit TC and the input sensing circuit IS-C may be disposed (e.g., mounted) on the circuit board PCB in the form of an integrated chip. In another embodiment, the timing control circuit TC and the input sensing circuit IS-C may be disposed (e.g., mounted) on the circuit board PCB in the form of one integrated chip, for example. The circuit board PCB may include circuit board pads PCB-P electrically connected to the display panel DP. Although not shown, the circuit board PCB may further include signal lines connecting the circuit board pads PCB-P to the timing control circuit TC and/or the input sensing circuit IS-C.

Figure 20:
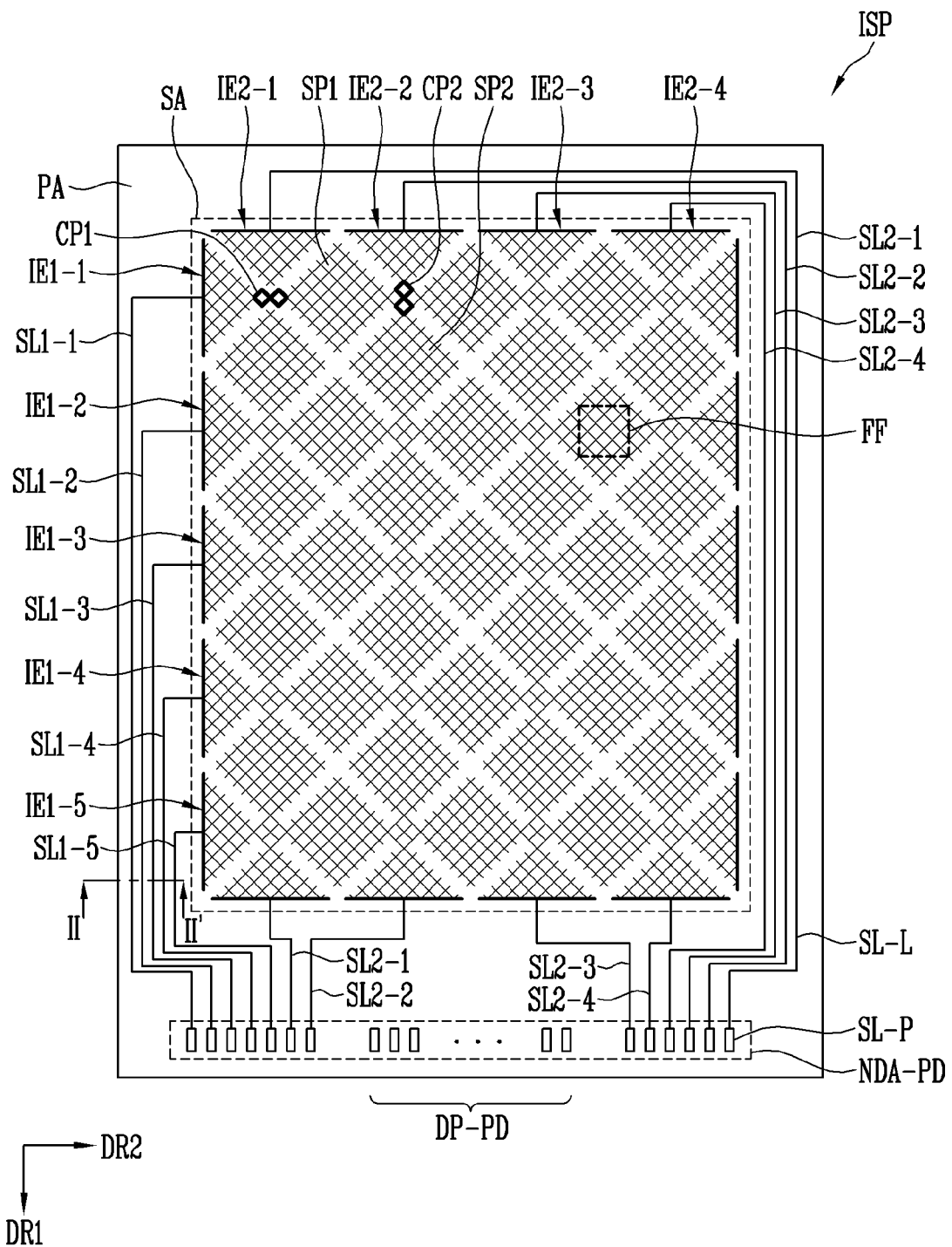
FIG. 20 is a plan view illustrating an embodiment of an input sensing panel included in the display device of FIG. 18.
Figure 21:
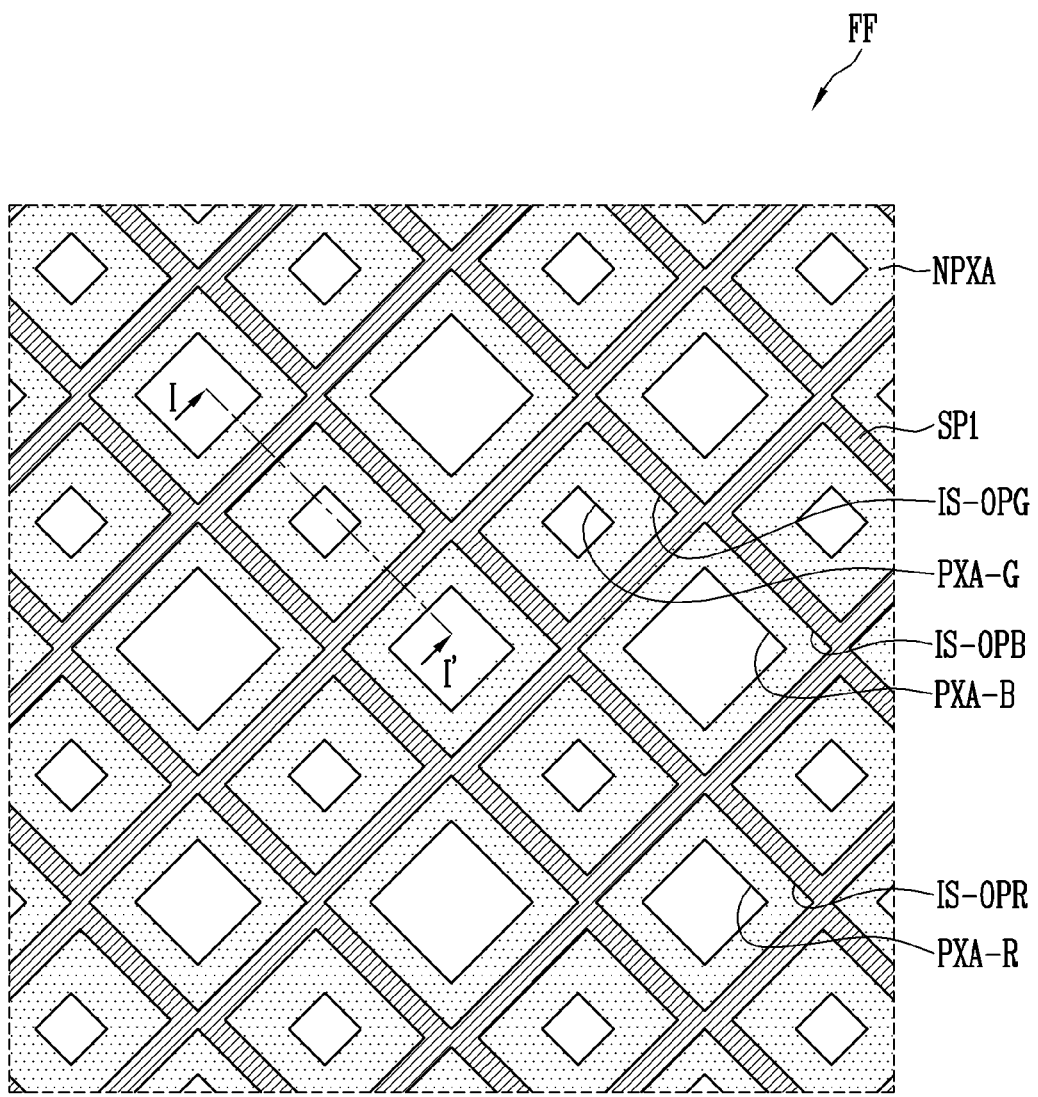
FIG. 21 is an enlarged plan view of a partial area FF of the input sensing panel of FIG. 20.

FIG. 20 is a plan view illustrating an embodiment of an input sensing panel included in the display device of FIG. 18. FIG. 21 is an enlarged plan view of a partial area FF of the input sensing panel of FIG. 20.

Referring to FIGS. 19 and 20, the input sensing panel ISP may include a sensing area SA that senses a user's input, for example, a touch and/or a pressure when touching, and a peripheral area PA provided in at least one side of the sensing area SA.

The sensing area SA may correspond to the display area DP-DA of the display panel DP, and may have substantially the same area as or a larger area than the display area DP-DA. The peripheral area PA may be disposed adjacent to the sensing area SA. In addition, the peripheral area PA may correspond to the non-display area DP-NDA of the display panel DP.

As described with reference to FIG. 1, the input sensing panel ISP may include driving electrodes IE1-1 to IE1-5 and sensing electrodes IE2-1 to IE2-4 provided in the sensing area SA, and driving signal lines SL1-1 to SL1-5 and sensing signal lines SL2-1 to SL2-4 provided in the peripheral area PA.

The first sensor units SP1 may be arranged along the second direction DR2 in one driving electrode, and the second sensor units SP2 may be arranged along the first direction DR1 in one sensing electrode. Each of the first connection units CP1 may connect first sensor units SP1 adjacent to each other, and each of the second connection units CP2 may connect second sensor units SP2 adjacent to each other.

The driving electrodes IE1-1 to IE1-5 and the sensing electrodes IE2-1 to IE2-4 may have a mesh pattern or a mesh structure. As shown in FIG. 21, the mesh pattern may include mesh lines, which are metal lines forming at least one mesh hole IS-OPR, IS-OPG, and IS-OPB (or opening). The mesh holes IS-OPR, IS-OPG, and IS-OPB defined by the mesh lines may have a rhombus planar shape, but are not limited thereto.

Since the driving electrodes IE1-1 to IE1-5 and the sensing electrodes IE2-1 to IE2-4 have a mesh pattern, parasitic capacitance with the electrodes of the display panel DP may decrease.

In addition, as shown in FIG. 21, in a partial area FF, the driving electrodes IE1-1 to IE1-5 and the sensing electrodes IE2-1 to IE2-4 may not overlap emission area PXA-R, PXA-G, and PXA-B. Here, each of the emission areas PXA-R, PXA-G, and PXA-B may be included in the pixels PX (or pixel areas in which the pixels PX are provided) described with reference to FIG. 19. Accordingly, the driving electrodes IE1-1 to IE1-5 and the sensing electrodes IE2-1 to IE2-4 may not be visually recognized by the user of the display device DD.

In an embodiment, the driving electrodes IE1-1 to IE1-5 and the sensing electrodes IE2-1 to IE2-4 may include aluminum, copper, chromium, nickel, titanium, or the like, for example. However, the invention is not limited thereto, and the driving and sensing electrodes may include various metals.

When the driving electrodes IE1-1 to IE1-5 and the sensing electrodes IE2-1 to IE2-4 are, for example, including a metal capable of performing a low-temperature process, damage to the light emitting element may be prevented even when the input sensing panel ISP is provided by continuous process after manufacturing process of the display panel DP.

When the driving electrodes IE1-1 to IE1-5 and the sensing electrodes IE2-1 to IE2-4 are directly disposed on the display panel DP in a mesh pattern, flexibility of the display device DD may be improved.

In FIG. 20, the driving electrodes IE1-1 to IE1-5 and the sensing electrodes IE2-1 to IE2-4 are shown to include the first sensor units SP1 and the second sensor units SP2 having a rhombus shape, but the invention is not limited thereto, and the first sensor units SP1 and the second sensor units SP2 may have a polygonal shape. The driving electrodes IE1-1 to IE1-5 and the sensing electrodes IE2-1 to IE2-4 may have a shape (e.g., bar shape) in which there is no distinction between the sensor unit and the connection unit.

As described with reference to FIG. 1, the driving signal lines SL1-1 to SL1-5 may be connected to one end of the driving electrodes IE1-1 to IE1-5, respectively. The sensing signal lines SL2-1 to SL2-4 may be connected to both ends of the sensing electrodes IE2-1 to IE2-4.

Since the sensing electrodes IE2-1 to IE2-4 are longer than the driving electrodes IE1-1 to IE1-5, a voltage drop of a detection signal (or transmission signal) may be greater, and thus sensing sensitivity may decrease. Since the detection signal (or transmission signal) is transmitted through the sensing signal lines SL2-1 to SL2-4 connected to both ends of the sensing electrodes IE2-1 to IE2-4, the voltage drop of the detection signal (or transmission signal) and a decrease in sensing sensitivity may be prevented.

The driving signal lines SL1-1 to SL1-5 and the sensing signal lines SL2-1 to SL2-4 may include a line unit SL-L and a pad unit SL-P. The pad portions SL-P may be arranged to the pad area NDA-PD. The pad unit SL-P may overlap dummy pads IS-DPD illustrated in FIG. 19.

The input sensing panel ISP may include signal pads DP-PD. The signal pads DP-PD may be arranged in the pad area NDA-PD.

Referring to FIG. 21, the first sensor units SP1 may not overlap the emission areas PXA-R, PXA-G, and PXA-B, and may overlap the non-emission area NPXA.

The mesh lines (e.g., metal lines) of the first sensor units SP1 may define the mesh holes IS-OPR, IS-OPG, and IS-OPB. The mesh holes IS-OPR, IS-OPG, and IS-OPB may correspond one-to-one to the emission areas PXA-R, PXA-G, and PXA-B. The emission areas PXA-R, PXA-G, and PXA-B may be exposed by mesh holes IS-OPR, IS-OPG, and IS-OPB.

A line width of the mesh lines may be smaller than a width of a pixel definition layer corresponding to the non-emission area NPXA (i.e., pixel definition layer defining the emission areas PXA-R, PXA-G, and PXA-B).

Accordingly, it is possible to minimize blocking of light emitted from the emission areas PXA-R, PXA-G, and PXA-B by the mesh lines, and to prevent the mesh lines from being visually recognized by the user.

The mesh lines may have a three-layer structure of titanium/aluminum/titanium.

The emission areas PXA-R, PXA-G, and PXA-B may be divided into a plurality of groups based on the color of light generated by the light emitting element. In FIG. 21, the emission areas PXA-R, PXA-G, and PXA-B divided into three groups based on emission color are illustrated.

The emission areas PXA-R, PXA-G, and PXA-B may have different areas depending on the color emitted from the light emitting element. The areas of the emission areas PXA-R, PXA-G, and PXA-B may be determined depending on a type of the light emitting element.

The mesh holes IS-OPR, IS-OPG, and IS-OPB may be divided into a plurality of groups having different areas. The mesh holes IS-OPR, IS-OPG, and IS-OPB may be divided into three groups depending on the emission areas PXA-R, PXA-G, and PXA-B corresponding thereto.

In FIG. 21, the mesh holes IS-OPR, IS-OPG, and IS-OPB are shown to correspond one-to-one to the emission areas PXA-R, PXA-G, and PXA-B, but are not limited thereto. In an embodiment, each of the mesh holes IS-OPR, IS-OPG, and IS-OPB may correspond to two or more emission areas PXA-R, PXA-G, and PXA-B, for example.

In FIG. 21, the areas of the emission areas PXA-R, PXA-G, and PXA-B are shown to be various, but are not limited thereto. In an embodiment, the size of the emission areas PXA-R, PXA-G, and PXA-B may be the same as each other, and also the size of the mesh holes IS-OPR, IS-OPG, and IS-OPB may be the same as each other, for example. The planar shape of the mesh holes IS-OPR, IS-OPG, and IS-OPB is not limited thereto, and may have a polygonal shape different from a rhombus. The planar shape of the mesh holes IS-OPR, IS-OPG, and IS-OPB may have a polygonal shape with rounded corners.

Figure 22:
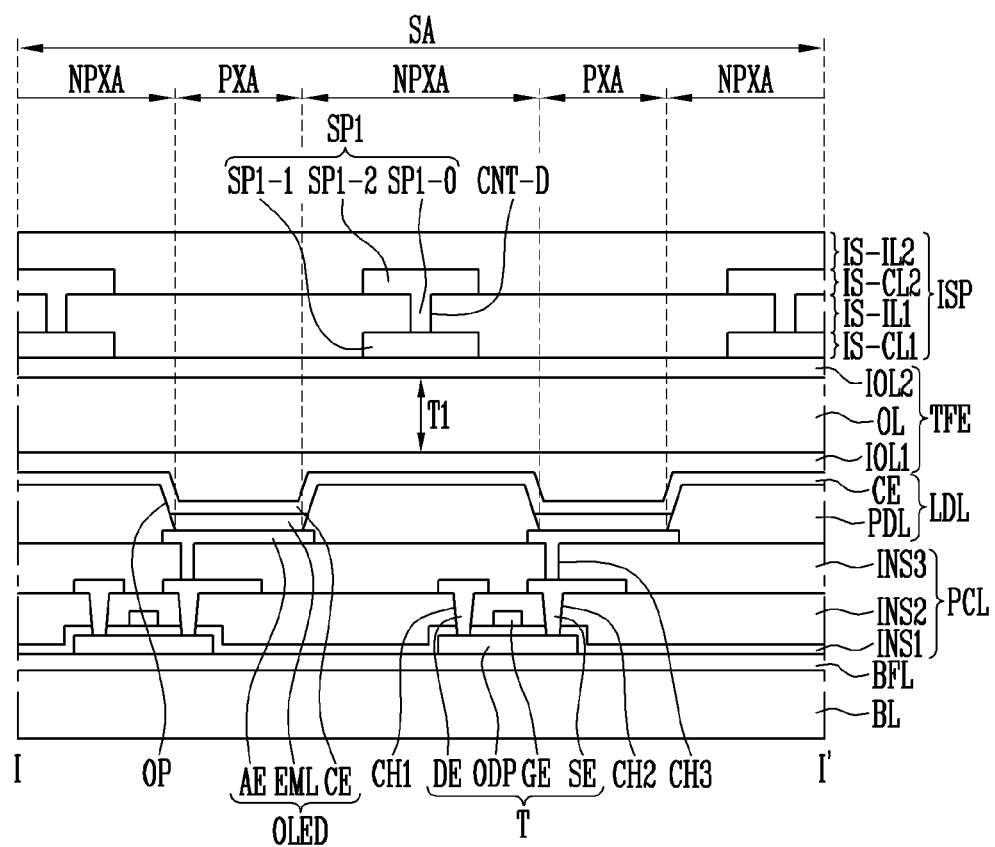
FIG. 22 is a cross-sectional view illustrating an embodiment of a display device taken along line I-I' of FIG. 21.

FIG. 22 is a cross-sectional view illustrating an embodiment of a display device taken along line I-I' of FIG. 21.

Referring to FIG. 22, the display device may include a base layer BL (or substrate), a buffer layer BFL, a pixel circuit layer PCL, a light emitting element layer LDL, a thin film encapsulation layer TFE, and an input sensing panel ISP.

The base layer BL may include a synthetic resin film. The synthetic resin layer may be a polyimide-based resin layer, and the material thereof is not particularly limited. In addition, the base layer BL may include a glass substrate, a metal substrate, an organic/inorganic composite material substrate, or the like.

The buffer layer BFL may be provided on the base layer BL. The buffer layer BFL may prevent diffusion of impurities into the transistor T provided on the base layer BL, and may improve flatness of the base layer BL. The buffer layer BFL may be provided as a single layer, but may also be provided as multiple layers of at least two or more layers. The buffer layer BFL may be an inorganic insulating film including an inorganic material. In an embodiment, the buffer layer BFL may include silicon nitride, silicon oxide, silicon oxynitride, or the like, for example. When the buffer layer BFL is provided as multiple layers, each layer may include the same material or may include different materials. The buffer layer BFL may be omitted in some cases.

The pixel circuit layer PCL may include at least one insulating layer and a circuit element. The insulating layer may include at least one inorganic layer and at least one organic layer. The circuit element may include signal lines, pixel driving circuits, and the like.

The semiconductor pattern ODP of the transistor T may be disposed on the buffer layer BFL. In an embodiment, the semiconductor pattern ODP may include at least one of amorphous silicon, polysilicon, and metal oxide semiconductor.

The first insulating layer INS1 may be disposed on the semiconductor pattern ODP. The first insulating layer INS1 may be an inorganic insulating layer including an inorganic material. In an embodiment, the first insulating layer INS1 may include at least one of silicon nitride, silicon oxide, silicon oxynitride, and the like, for example.

A control electrode GE of the transistor T may be disposed on the first insulating layer INS1. The control electrode GE may be manufactured according to the same photolithography process as the scan lines GL (refer to FIG. 19).

A second insulating layer INS2 covering the control electrode GE may be disposed on the first insulating layer INS1. The second insulating layer INS2 may be an inorganic insulating layer including an inorganic material. In an embodiment, the second insulating layer INS2 may include at least one of silicon nitride, silicon oxide, silicon oxynitride, and the like, for example.

A first transistor electrode DE (or drain electrode) and a second transistor electrode SE (or source electrode) of the transistor T may be disposed on the second insulating layer INS2.

The first transistor electrode DE and the second transistor electrode SE may be respectively connected to the semiconductor pattern ODP through a first through hole CH1 and a second through hole CH2 passing through the first insulating layer INS1 and the second insulating layer INS2. In another embodiment of the invention, the transistor T may be implemented as a bottom gate structure.

A third insulating layer INS3 covering the first transistor electrode DE and the second transistor electrode SE may be disposed on the second insulating layer INS2. The third insulating layer INS3 may provide a flat surface. In an embodiment, the third insulating layer INS3 may include an organic layer such as acrylic resin, epoxy resin, phenolic resin, polyamide resin, polyimide resin, etc.

The light emitting element layer LDL may be disposed on the third insulating layer INS3. The light emitting element layer LDL may include a pixel definition layer PDL and a light emitting element OLED.

The pixel definition layer PDL may include an organic material. The first electrode AE may be disposed on the third insulating layer INS3. The first electrode AE may be connected to the second transistor electrode SE through a third through hole CH3 passing through the third insulating layer INS3. An opening OP may be defined in the pixel definition layer PDL, and the opening OP may define emission areas PXA-R, PXA-G, and PXA-B. The opening OP of the pixel definition layer PDL may expose at least a portion of the first electrode AE. In a modified embodiment, the pixel definition layer PDL may be omitted.

The pixel PX (refer to FIG. 19) may be disposed in the display area DP-DA. The display area DP-DA may include an emission area PXA and a non-emission area NPXA adjacent to the emission area PXA. The non-emission area NPXA may surround the emission area PXA. The emission area PXA may be defined to correspond to a portion area of the first electrode AE exposed by the opening OP. The non-emission area NPXA may be defined to correspond to the pixel definition layer PDL.

The light emitting element OLED may include a first electrode AE connected to the second transistor electrode SE, an emission layer EML disposed on the first electrode AE, and a second electrode CE disposed on the light emitting layer EML. In an embodiment, the light emitting element OLED may be an organic light emitting diode, for example.

One of the first electrode AE and the second electrode CE may be an anode electrode, and the other thereof may be a cathode electrode. In an embodiment, the first electrode AE may be an anode electrode, and the second electrode CE may be a cathode electrode, for example.

At least one of the first electrode AE and the second electrode CE may be a transmissive electrode. In an embodiment, when the light emitting element OLED is an organic light-emitting element of a bottom-emission type, the first electrode AE may be a transmissive electrode, and the second electrode CE may be a reflective electrode, for example. When the light emitting element OLED is an organic light emitting element of a top emission type, the first electrode AE may be a reflective electrode, and the second electrode CE may be a transmissive electrode. When the light emitting element OLED is an organic light-emitting element of a double-sided emission type, both the first electrode AE and the second electrode CE may be transmissive electrodes. In the embodiment, a case where the light emitting element OLED is an organic light emitting element of a top emission type and the first electrode AE is an anode electrode will be described as an example.

In each pixel area, the first electrode AE may be disposed on the third insulating layer INS3. The first electrode AE may include a reflective layer capable of reflecting light and a transparent conductive layer disposed on or under the reflective layer. At least one of the transparent conductive layer and the reflective layer may be connected to the second transistor electrode SE.

The reflective layer may include a material capable of reflecting light. In an embodiment, the reflective layer may include at least one of aluminum (Al), silver (Ag), chromium (Cr), molybdenum (Mo), platinum (Pt), nickel (Ni), and any alloys thereof, for example.

The transparent conductive layer may include a transparent conductive oxide. In an embodiment, the transparent conductive layer may include at least one transparent conductive oxide including at least one of indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO"), for example.

The emission layer EML may be disposed on the exposed surface of the first electrode AE. The emission layer EML may have a multilayered thin film structure at least including a light generation layer ("LGL"). In an embodiment, the emission layer EML may include a hole injection layer for injecting holes, a hole transport layer having excellent hole transportability and for increasing a chance of recombination of holes and electrons by blocking a movement of electrons which are not coupled in a light generating layer, the light generating layer which emits light by recombination of injected electrons and holes, a hole blocking layer for blocking a movement of holes which are not coupled in the light generating layer, an electron transport layer for smoothly transporting electrons to the light generating layer, and an electron injection layer for injecting electrons, for example.

In an embodiment, the color of light generated in the light generating layer may be one of red, green, blue, and white, for example, but is not limited thereto. In an embodiment, the color of light generated in the light generating layer of the emission layer EML may be one of magenta, cyan, and yellow, for example.

The hole injection layer, the hole transport layer, the hole blocking layer, the electron transport layer, and the electron injection layer may be common layers connected to each other in adjacent pixel areas.

The second electrode CE may be disposed on the emission layer EML. The second electrode CE may be a transflective layer. In an embodiment, the second electrode CE may be a thin metal layer having a thickness sufficient to transmit light, for example. The second electrode CE may transmit some of the light generated in the light generating layer, and may reflect the rest of the light generated in the light generating layer.

The second electrode CE may include a material having a lower work function than the transparent conductive layer. In an embodiment, the second electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof, for example.

Some of the light emitted from the emission layer EML may not transmit the second electrode CE, and the light reflected from the second electrode CE may be reflected again by the reflective layer (not shown). That is, between the reflective layer and the second electrode CE, light emitted from the emission layer EML may resonate. Light extraction efficiency of the light emitting element OLED may be improved by the resonance of light.

A distance between the reflective layer and the second electrode CE may be different depending on the color of light generated by the light generating layer. That is, the distance between the reflective layer and the second electrode CE may be adjusted to match a resonance distance depending on the color of light generated in the light generating layer.

The thin film encapsulation layer TFE may be disposed on the second electrode CE. The thin film encapsulation layer TFE may be commonly disposed on the pixels PX. The thin film encapsulation layer TFE may directly cover the second electrode CE. In an embodiment, a capping layer covering the second electrode CE may be further disposed between the thin film encapsulation layer TFE and the second electrode CE. In this case, the thin film encapsulation layer TFE may directly cover the capping layer.

The thin film encapsulation layer TFE may include a first encapsulation inorganic layer IOL1, an encapsulation organic layer OL, and a second encapsulation inorganic layer IOL2 sequentially stacked on the second electrode CE. In an embodiment, the first and second encapsulation inorganic layers IOL1 and IOL2 may include an inorganic insulating material such as polysiloxane, silicon nitride, silicon oxide, silicon oxynitride, and the like. In an embodiment, the encapsulation organic layer OL may include an organic insulating material such as a polyacrylic compound, a polyimide compound, a fluorine-based carbon compound such as Teflon, a benzocyclobutene compound, and the like.

A thickness T1 of the thin film encapsulation layer TFE (or encapsulation organic layer OL) may be adjusted so that noise generated by components of the light emitting element layer LDL does not affect the input sensing panel ISP. However, as the display device becomes thinner, the thickness T1 of the thin film encapsulation layer TFE decreases (e.g., thickness T1 is 10 µm or less), and the noise generated by the components of the light emitting element layer LDL may affect the input sensing panel ISP.

The input sensing panel ISP may be provided on the thin film encapsulation layer TFE. The input sensing panel ISP may include a first conductive layer IS-CL1, a fourth insulating layer IS-IL1, a second conductive layer IS-CL2, and a fifth insulating layer IS-IL2. Each of the first conductive layer IS-CL1 and the second conductive layer IS-CL2 may have a single layer structure or a multilayer structure.

A conductive layer having the single layer structure may include a metal layer or a transparent conductive layer. In an embodiment, the metal layer may include at least one of molybdenum, silver, titanium, copper, aluminum, and alloys thereof. In an embodiment, the transparent conductive layer may include a transparent conductive oxide such as ITO, IZO, zinc oxide (ZnO), indium tin zinc oxide ("ITZO"), and the like. In an embodiment, the transparent conductive layer may include conductive polymers such as poly(3,4-ethyl-enedioxythiophene) ("PEDOT"), metal nano wire, grapheme, or the like.

The conductive layer having multilayer structure may include multilayered metal layers. In an embodiment, the multilayered metal layers may have a three-layer structure, for example titanium/aluminum/titanium. The conductive layer having multilayer structure may include at least one metal layer and at least one transparent conductive layer.

Each of the first conductive layer IS-CL1 and the second conductive layer IS-CL2 may include a plurality of patterns. Hereinafter, the first conductive layer IS-CL1 may include first conductive patterns, and the second conductive layer IS-CL2 may include second conductive patterns. Each of the first and second conductive patterns may include driving and sensing electrodes and driving and sensing signal lines described with reference to FIG. 20.

Each of the fourth insulating layer IS-IL1 and the fifth insulating layer IS-IL2 may have a single layer or multilayer structure. Each of the fourth insulating layer IS-IL1 and the fifth insulating layer IS-IL2 may include an inorganic material, an organic material, or a composite material.

At least one of the fourth insulating layer IS-IL1 and the fifth insulating layer IS-IL2 may include an inorganic layer. In an embodiment, the inorganic layer may include at least one of aluminum oxide, titanium oxide, silicon oxide silicon oxynitride, zirconium oxide, and hafnium oxide, for example.

At least one of the fourth insulating layer IS-IL1 and the fifth insulating layer IS-IL2 may include an organic layer. In an embodiment, the organic layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin, for example.

Referring to FIGS. 20 to 22, a first sensor unit SP1 of the driving electrodes IE1-1 to IE1-5 may include a two-layered mesh-shaped metal layer including a first mesh pattern SP1-1 and a second mesh pattern SP1-2. That is, the second mesh pattern SP1-2 may be disposed on the first mesh pattern SP1-1, and the fourth insulating layer IS-IL1 may be provided between the second mesh pattern SP1-2 and the first mesh pattern SP1-1. A connection contact hole CNT-D may be defined in the fourth insulating layer IS-IL1, and a contact unit SP1-0 may be disposed in the connection contact hole CNT-D to electrically connect the first mesh pattern SP1-1 and the second mesh pattern SP1-2. The contact unit SP1-0 may include a conductive material. In an embodiment, the contact unit SP1-D may include the same material as that of the first mesh pattern SP1-1 or the second mesh pattern SP1-2 for convenience of processing, for example. In another embodiment, the contact unit SP1-D may include a material having higher electrical conductivity than the first mesh pattern SP1-1 or the second mesh pattern SP1-2, for example.

A fifth insulating layer IS-IL2 may be disposed on the second mesh pattern SP1-2. The fifth insulating layer IS-IL2 may cover all of the second mesh pattern SP1-2, and may function as a planarization layer.

The second sensor unit SP2 of the sensing electrodes IE2-1 to IE2-4 may also include a two-layered mesh pattern similar to the first sensor unit SP1 of the driving electrodes IE1-1 to IE1-4. The two-layered mesh pattern may be disposed with the fourth insulating layer IS-IL1 interposed therebetween, and may be electrically connected by the contact unit through the connection contact hole CNT-D defined in the fourth insulating layer IS-IL1.

The invention is not limited thereto, and the driving and sensing electrodes may include a single layer of mesh pattern as another example.

While the invention has been shown and described with reference to predetermined embodiments thereof, it will be understood by those skilled in the art that various changes in forms and details may be made therein without departing from the spirit and scope of the invention as defined by the appended claims and their equivalents. Accordingly, the technical scope of the invention may be determined by on the technical scope of the accompanying claims.

What is claimed is:

1. An input sensing device comprising:
   an input sensing panel which includes electrodes;
   a driving signal generator which provides driving signals to the electrodes; and
   a sensing unit which receives sensing signals according to the driving signals from the electrodes,
   wherein the driving signals include a first driving signal and a second driving signal which have different frequencies,
   wherein the sensing unit samples a first sensing signal according to the first driving signal and a second sensing signal according to the second driving signal at a same frequency,
   wherein a first sensing value generated by sampling the first sensing signal during a reference time duration is different from a second sensing value generated by sampling the second sensing signal during the reference time duration, and
   wherein attenuation of the first driving signal and the first sensing signal is compensated by a difference between the first sensing value and the second sensing value.

2. The input sensing device of claim 1, wherein each of the driving signals includes a sinusoidal wave.

3. The input sensing device of claim 1, wherein the input sensing panel includes a first area and a second area,
   wherein the first area is farther from the driving signal generator or the sensing unit than the second area is from the driving signal generator or the sensing unit, and
   wherein a first frequency of the first driving signal provided to the first area among the driving signals is smaller than a second frequency of the second driving signal provided to the second area among the driving signals.

4. The input sensing device of claim 1, wherein the driving signal generator sequentially provides the driving signals to the electrodes.

5. The input sensing device of claim 1, wherein the driving signal generator simultaneously provides the driving signals to the electrodes.

6. The input sensing device of claim 1, wherein the driving signal generator includes:
   a waveform generator which generates a reference signal, and
   a frequency modulator which varies a frequency of the reference signal through frequency division and generates the driving signals.

7. The input sensing device of claim 1, wherein the sensing unit samples the first sensing signal N times during the reference time, and samples the second sensing signal N times during the reference time, and
   wherein N is an integer greater than four.

8. The input sensing device of claim 7, wherein the reference time duration is smaller than or equal to a first period of the first driving signal.

9. The input sensing device of claim 8, wherein the reference time duration is smaller than half of the first period of the first driving signal, and
   wherein each of the sensing signals according to the first driving signal has a maximum value during the reference time duration.

10. The input sensing device of claim 7, wherein amplitudes of the driving signals are different from each other.

11. The input sensing device of claim 10, wherein an amplitude of at least one of the driving signals is variable, and wherein each of the driving signals has a maximum amplitude during the reference time duration.

12. The input sensing device of claim 1, wherein the sensing unit includes:
   analog front-ends which receive sensing signals according to the driving signals from the electrodes; and
   a signal processing unit which determines whether a touch is performed based on differential output values of the analog front-ends.

13. The input sensing device of claim 12, wherein each of the analog front-ends includes:
   a charge amplifier which differentially amplifies a first sensing signal and a second sensing signal respectively provided from two electrodes adjacent to each other among the electrodes and outputs a first differential signal and a second differential signal complementary to each other;
   a band pass filter which filters the first differential signal and the second differential signal and outputs a first filtered signal and a second filtered signal, respectively;
   a mixer which changes frequencies of the first filtered signal and the second filtered signal and outputs a first demodulated signal and a second demodulated signal, respectively;
   a low pass filter which filters noise from the first demodulated signal and the second demodulated signal and outputs a first output signal and a second output signal, respectively; and
   an analog-to-digital converter which outputs a differential output value corresponding to a difference between the first output signal and the second output signal.

14. The input sensing device of claim 13, further comprising:
   a distribution circuit which is disposed between at least some of the electrodes and the analog front-ends, and provides each of the sensing signals provided from at least some of the electrodes to two adjacent analog front-ends of the analog front-ends.

15. The input sensing device of claim 12, further comprising:
   a negative capacitor connected to each of the analog front-ends.

16. The input sensing device of claim 12, wherein each of the analog front-ends includes:
   a multiplexer which selects two sensing signals from sensing signals provided from three adjacent electrodes among the electrodes;
   a charge amplifier which differentially amplifies the two sensing signals selected from the sensing signals and outputs a first differential signal and a second differential signal complementary to each other;
   a band pass filter which filters the first differential signal and the second differential signal and outputs a first filtered signal and a second filtered signal, respectively;
   a mixer which changes frequencies of the first filtered signal and the second filtered signal and outputs a first demodulated signal and a second demodulated signal, respectively;
   a low pass filter which filters noise from the first demodulated signal and the second demodulated signal and outputs a first output signal and a second output signal, respectively; and
   an analog-to-digital converter which outputs a differential output value corresponding to a difference between the first output signal and the second output signal.

17. The input sensing device of claim 16, wherein the multiplexer selects a first sensing signal and a second sensing signal from the sensing signals in a first section, and selects a second sensing signal and a third sensing signal from the sensing signals in a second section different from the first section, and wherein the first to third sensing signals are respectively provided from the three adjacent electrodes.

18. A display device comprising:
a display panel including pixels which emit light in unit of a frame;
an input sensing panel which includes electrodes;
a driving signal generator which provides driving signals to the electrodes, respectively; and
a sensing unit which receives sensing signals according to the driving signals from the electrodes,
wherein the driving signals include a first driving signal and a second driving signal which have different frequencies,
wherein the sensing unit samples a first sensing signal according to the first driving signal and a second sensing signal according to the second driving signal at a same frequency,
wherein a first sensing value generated by sampling the first sensing signal during a reference time duration is different from a second sensing value generated by sampling the second sensing signal during the reference time duration, and
wherein attenuation of the first driving signal and the first sensing signal is compensated by a difference between the first sensing value and the second sensing value.

19. The display device of claim 18, wherein the driving signal generator provides the driving signals to the electrodes by avoiding a section in which a pulse of a vertical synchronization signal defining a start of the frame is generated.

20. The display device of claim 19, wherein the driving signal generator blocks a supply of the driving signals in the section in which the pulse of the vertical synchronization signal is generated.

21. The display device of claim 19, wherein the driving signals are asynchronous with a horizontal synchronization signal, and
wherein the horizontal synchronization signal defines a section in which a line image is output through pixels included in a same line among the pixels.

* * * * *